United States Patent [19]
Okabe et al.

[11] Patent Number: 5,248,628
[45] Date of Patent: Sep. 28, 1993

[54] METHOD OF FABRICATING A SEMICONDUCTOR MEMORY DEVICE

[75] Inventors: Naoko Okabe, Yokohama; Satoshi Inoue, Kawasaki; Kazumasa Sunouchi, Yokohama; Takashi Yamada, Kawasaki; Akihiro Nitayama, Kawasaki; Hiroshi Takato, Kawasaki, all of Japan

[73] Assignee: Kabushiki Kaisha Toshiba, Kawasaki, Japan

[21] Appl. No.: 896,537

[22] Filed: Jun. 9, 1992

Related U.S. Application Data

[62] Division of Ser. No. 578,608, Sep. 7, 1990, Pat. No. 5,144,579.

[30] Foreign Application Priority Data

Sep. 8, 1989 [JP] Japan .................. 1-233815
Mar. 30, 1990 [JP] Japan .................. 2-84372

[51] Int. Cl.$^5$ .................. H01L 21/70; H01L 21/265
[52] U.S. Cl. .................. 437/47; 437/52; 437/60; 437/919
[58] Field of Search .................. 437/47, 52; 357/23.6; 365/149; 257/301-316

[56] References Cited

U.S. PATENT DOCUMENTS

| | | | |
|---|---|---|---|
| 4,979,013 | 12/1990 | Furutani et al. | 365/149 |
| 5,091,761 | 2/1992 | Haraiwa et al. | 357/23.6 |
| 5,101,251 | 3/1992 | Wakamiya et al. | 357/23.6 |
| 5,120,674 | 6/1992 | Chris et al. | 437/919 |
| 5,140,389 | 8/1992 | Kimura et al. | 357/23.6 |

FOREIGN PATENT DOCUMENTS

| | | | |
|---|---|---|---|
| 62-86853 | 4/1987 | Japan . | |
| 63-110666 | 5/1988 | Japan . | |
| 63-197368 | 8/1988 | Japan | 437/919 |
| 63-281457 | 11/1988 | Japan . | |
| 1-122149 | 5/1989 | Japan | 437/919 |
| 1-41262 | 2/1992 | Japan | 365/149 |

OTHER PUBLICATIONS

"Dynamic Semiconductor RAM Structures," p. 12, which refers to IBM Technical Bulletin, vol. 15, No. 12, pp. 3585-3586, May 1, 1973.

Primary Examiner—Robert Kunemund
Assistant Examiner—Loc Q. Trinh
Attorney, Agent, or Firm—Finnegan, Henderson, Farabow, Garrett & Dunner

[57] ABSTRACT

A semiconductor memory device wherein at least one of a storage node contact hole and a bit line contact hole includes a first contact hole made in a first inter-layer insulating film formed over a gate electrode and a second contact hole made in a second inter-layer insulating film formed over an electrically conductive material embedded up to a level higher than the gate electrode in the first contact hole which is contacted with the electrically conductive material, the conductive material being exposed by etching a part of the second inter-layer insulating film, whereby the size of the memory device can be made small and the reliability can be improved. Further, a capacitor is formed in a layer higher than a bit line thereby to facilitate the processing of a storage node electrode to increase the capacitor area and to improve the reliability since it is unnecessary to carry out patterning a plate electrode within a cell array. With the above construction, a short-circuiting between the embedded layers is removed and a good quality of the second inter-layer insulating film is formed.

12 Claims, 56 Drawing Sheets

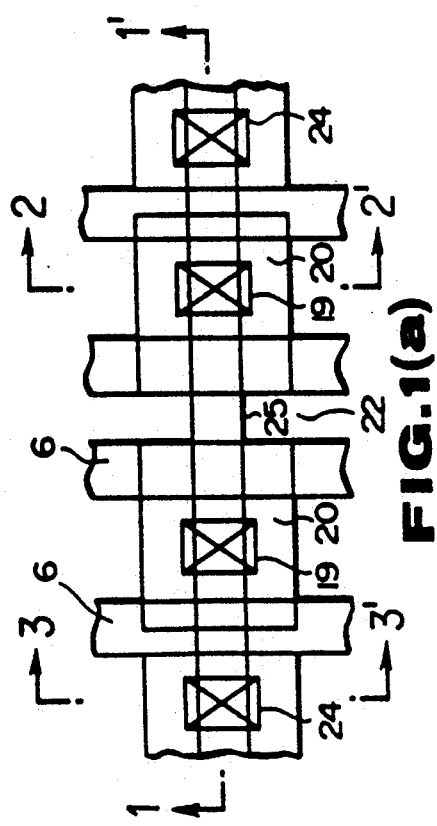
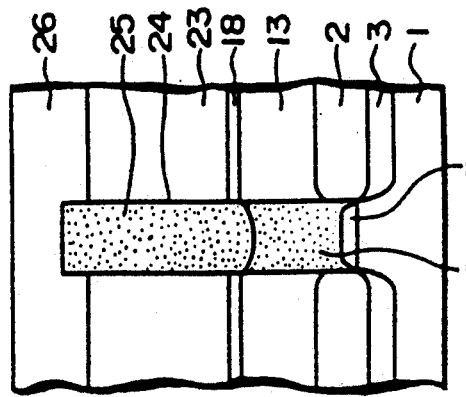
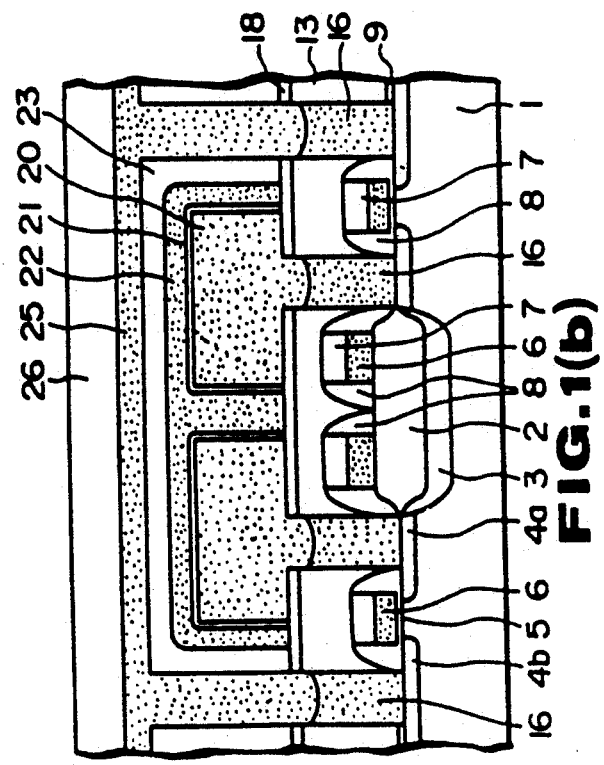
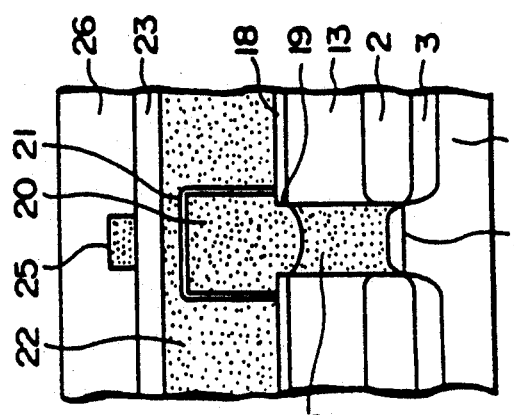

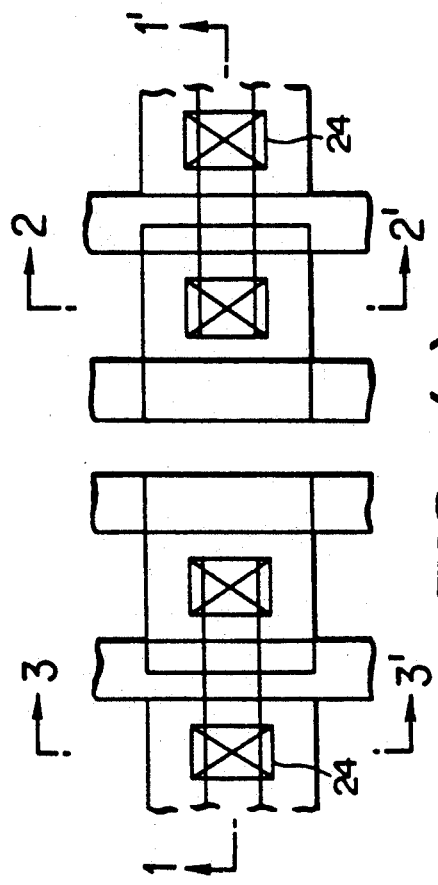
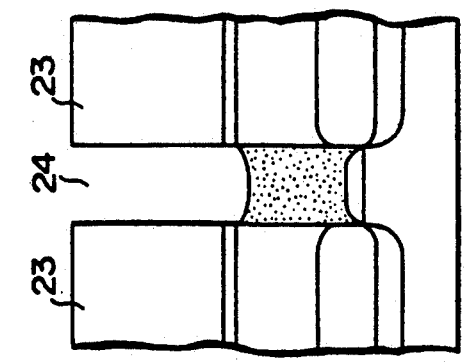
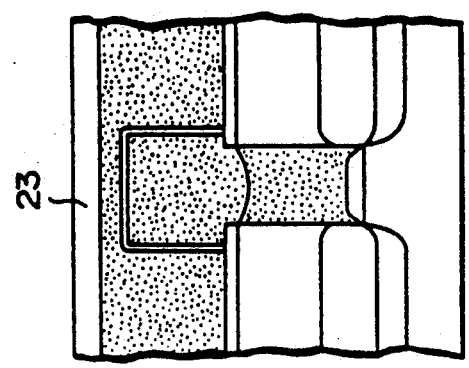
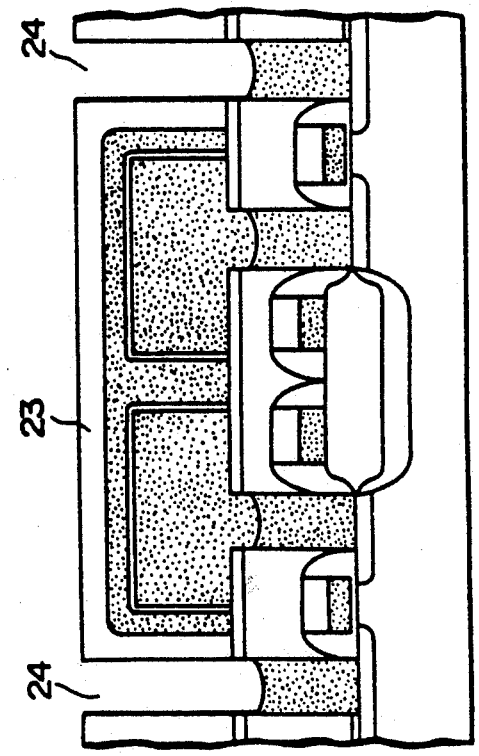

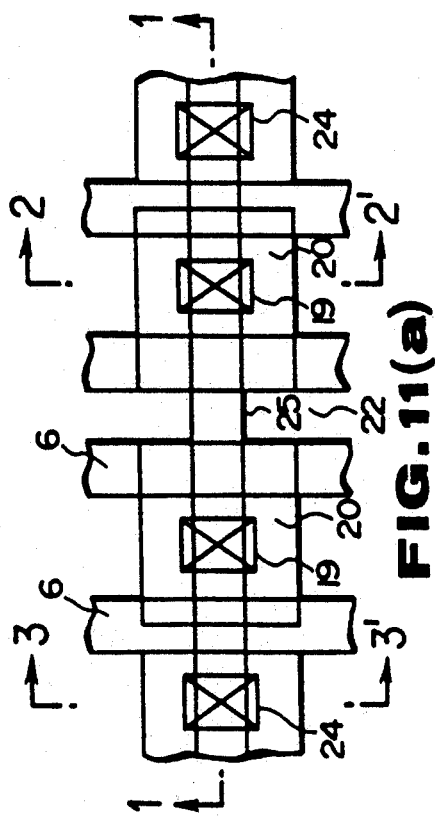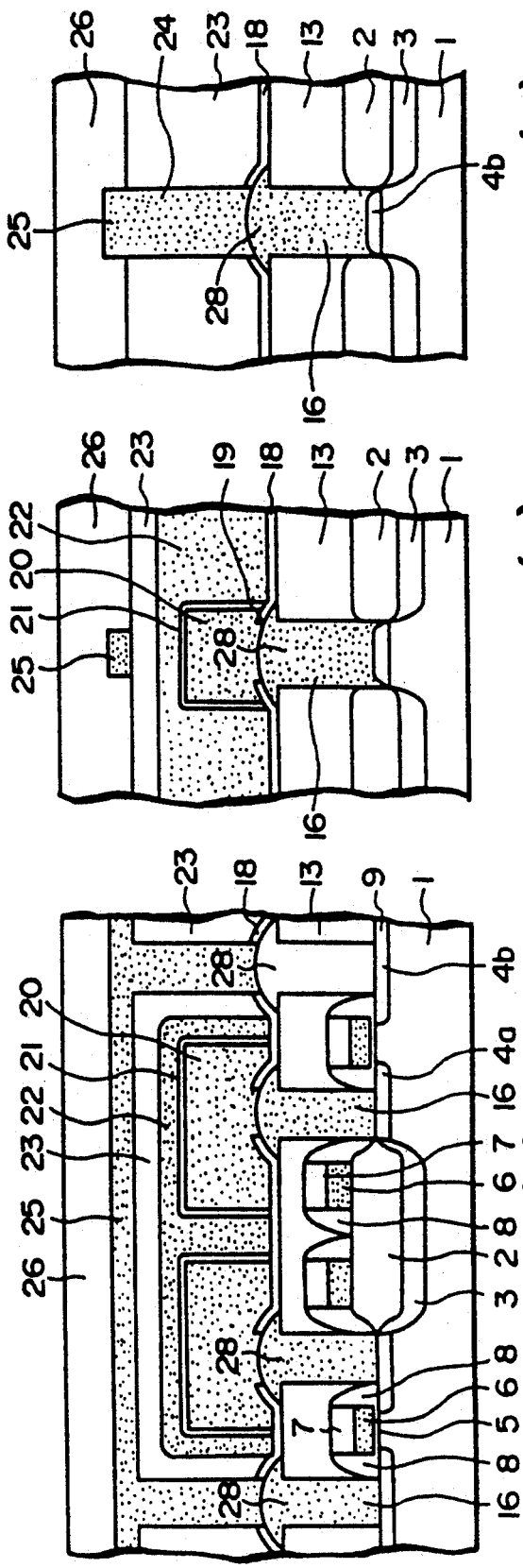

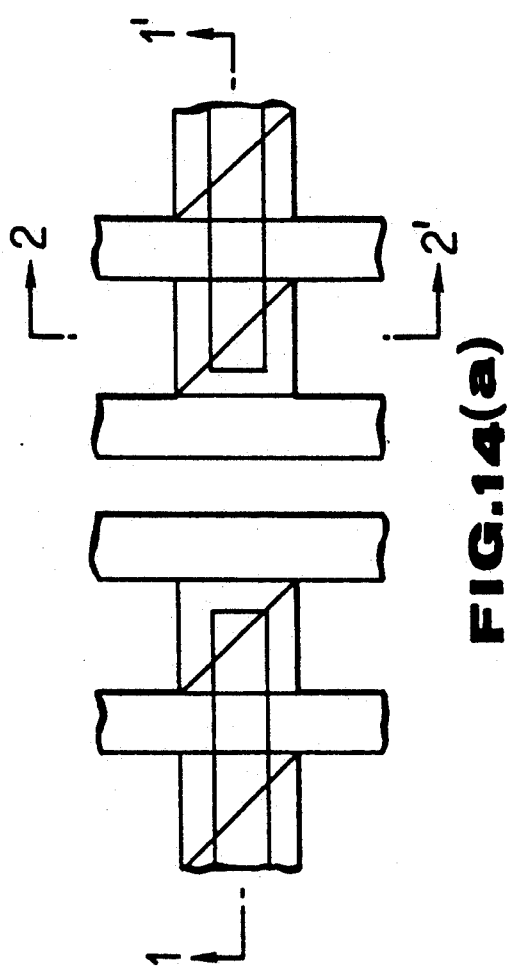
FIG.14(a)
FIG.14(b)
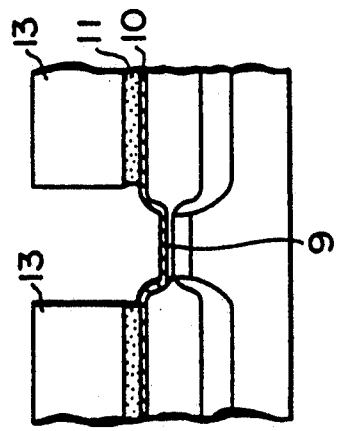
FIG.14(c)

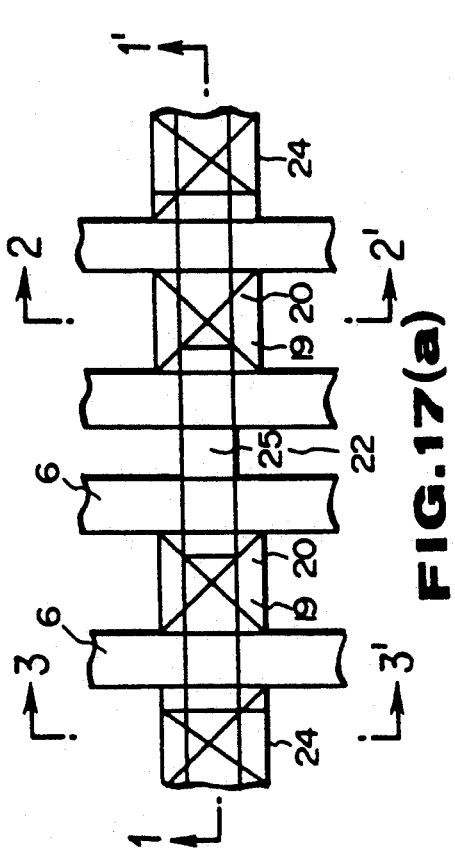
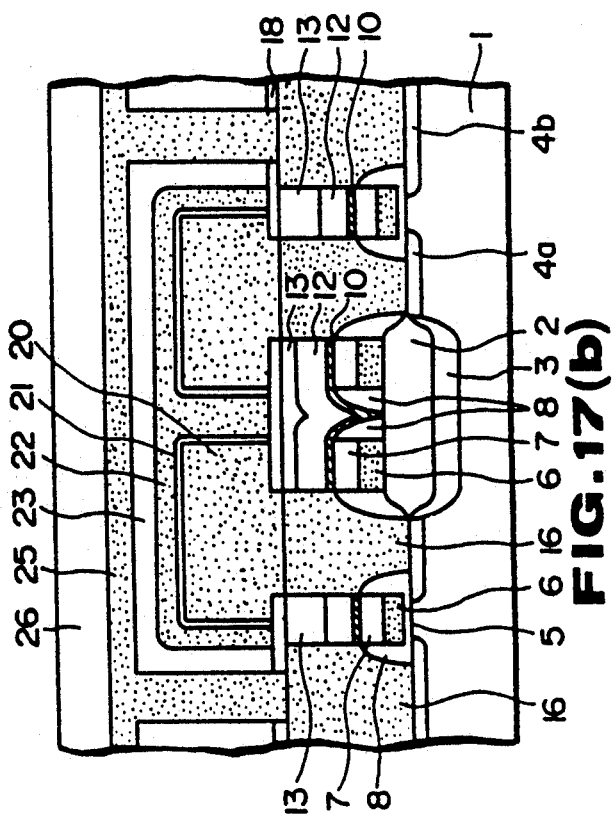
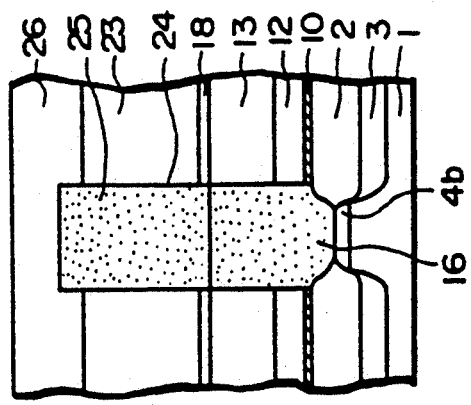
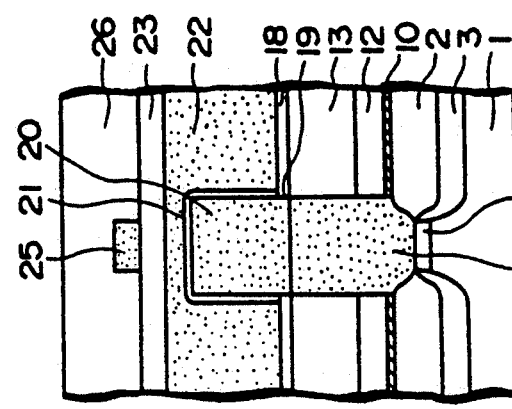
FIG.17(a)
FIG.17(b)
FIG.17(c)
FIG.17(d)

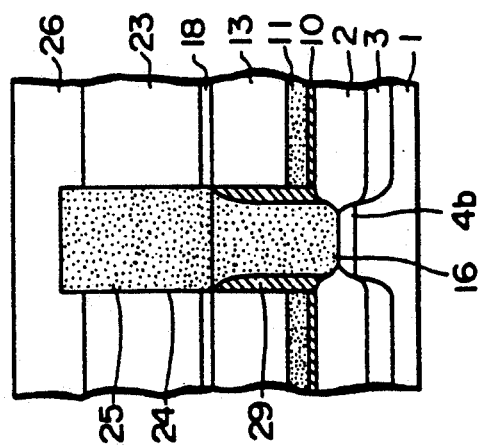
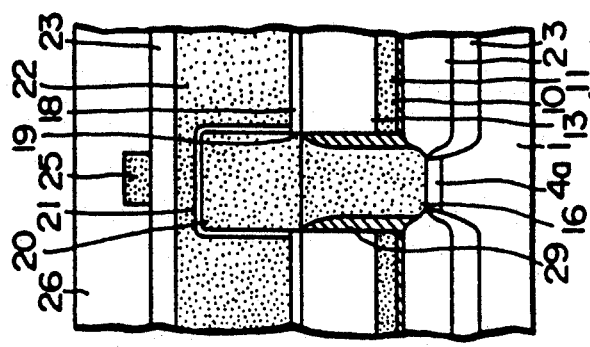
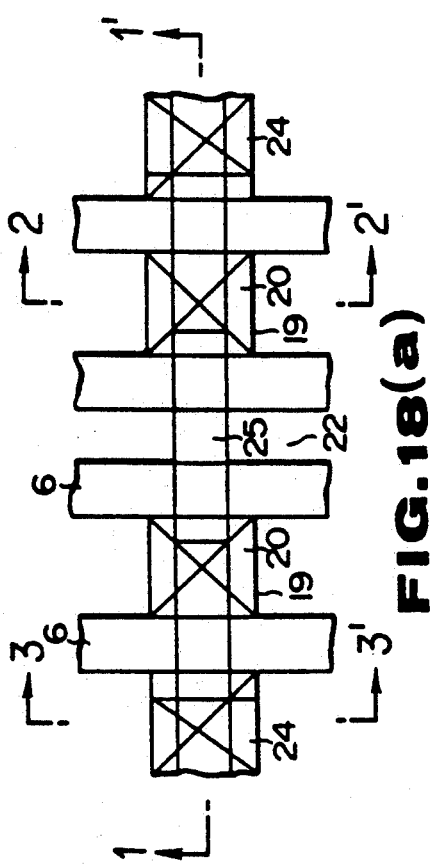
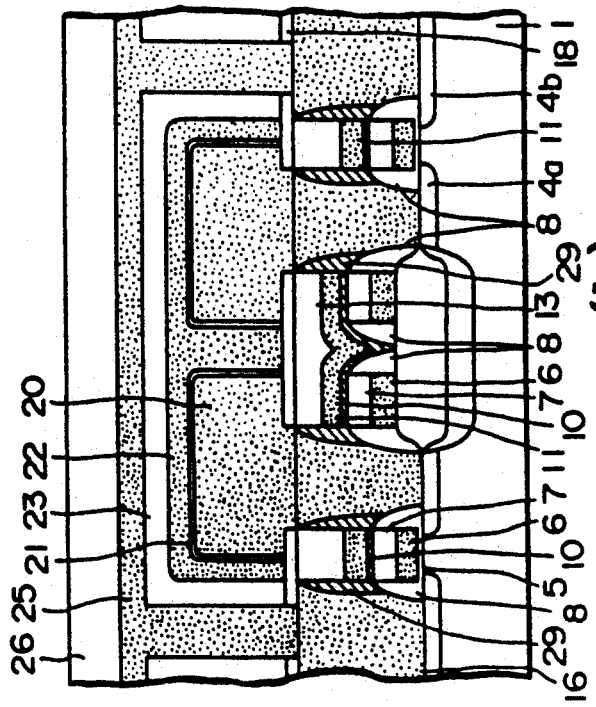

1-1'

2-2'

1-1'

2-2'

1-1'

2-2'

1-1'

2-2'

1-1'

2-2'

1-1'

2-2'

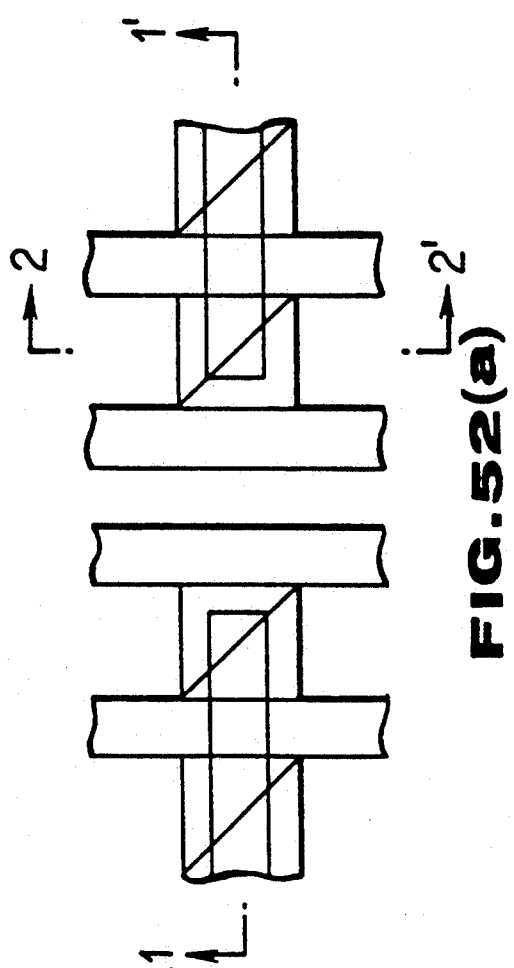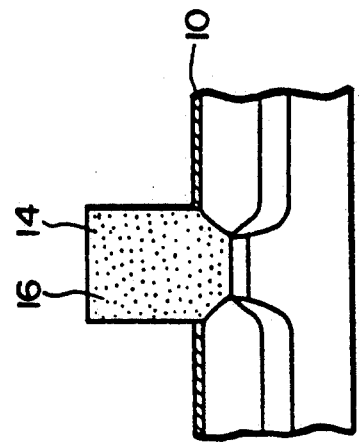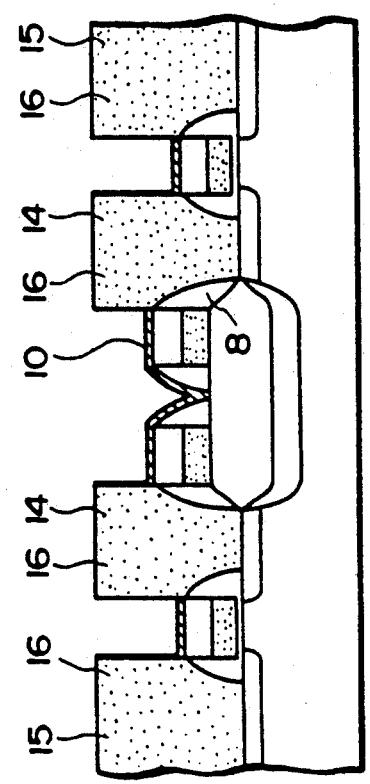
FIG.52(a)
FIG.52(b)
FIG.52(c)

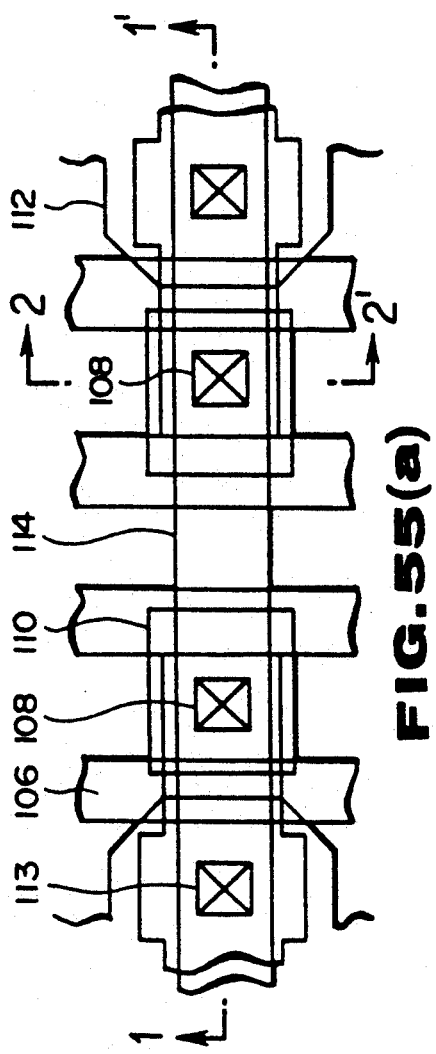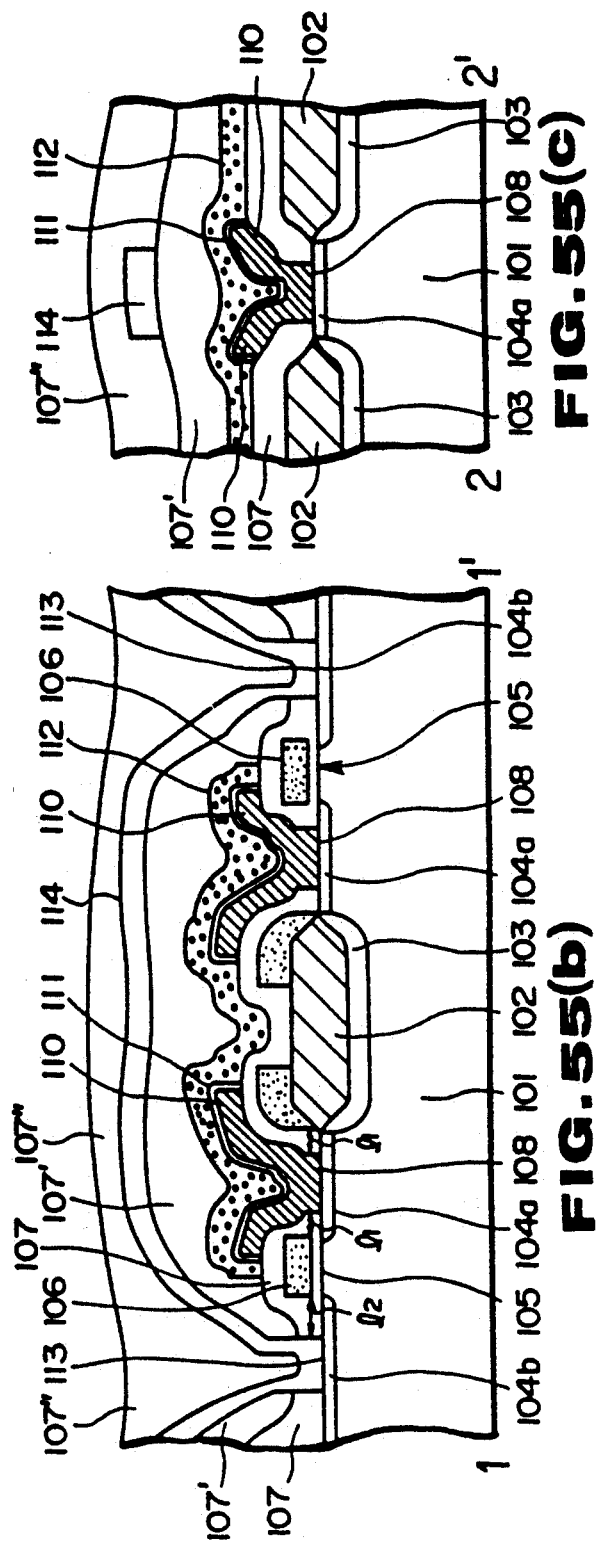

METHOD OF FABRICATING A SEMICONDUCTOR MEMORY DEVICE

This is a division of application Ser. No. 07/578,608, filed Sep. 7, 1990, now U.S. Pat. No. 5,144,579.

BACKGROUND OF THE INVENTION

1. Field of the Invention

The present invention relates to a semiconductor memory device and its fabricating method and more particularly, to a contact forming method in a MOS-FET or a DRAM.

2. Description of the Related Art

Recently, a MOS type DRAM has made remarkable progress in its high integration and large capacity with the advancement of semiconductor techniques, in particular, fine processing techniques.

However, the high memory integration has a problem that the area of a capacitor for storing data (charges) is decreased and this results in erroneous reading operation of the memory contents or in the generation of a soft error caused by the destruction of the memory contents due to α rays or the like.

For the purpose of solving such a problem and realizing the higher integration and increased capacity, there has been suggested a laminated memory cell structure, in which a MOS capacitor is formed on a memory cell region and one electrode of the capacitor is electrically connected to one electrode of a switching transistor formed on a semiconductor substrate to enlarge an area for the MOS capacitor and thereby to substantially increase the electrostatic capacitance of the MOS capacitor.

Such a laminated memory cell is shown in FIGS. 55(a) to 55(c). More in detail, one memory cell region is provided by isolating a p-type silicon substrate 101 with an insulating film 102 for element isolation. In the memory cell region, a gate electrode 106 is formed between adjacent source and drain regions 104a and 104b of an n-type diffusion layer with a gate insulating film 105 disposed between the gate electrode 106 and source and drain regions 104a and 104b, thereby forming a MOS-FET as a switching transistor. Further formed on the MOSFET is a first capacitor electrode 110. The first capacitor electrode 110 is contacted through its storage node contact hole 108 provided in an insulating film 107, with the source region 104a of the MOSFET, and covers the gate electrode 106 of the MOSFET and a gate electrode (word line) of an adjacent MOSFET. A capacitor insulating film 111 and a second capacitor electrode 112 are sequentially laminated on the first capacitor electrode 110 to thereby form a capacitor. The laminated memory cell is fabricated in the following manner.

That is, in the laminated memory cell, source/drain regions 104a and 104b of the n-type diffusion layer are formed in a p-type silicon substrate 101 and each of gate electrodes 106 is formed between the source/drain regions 104a and 104b through a gate insulating film 105, whereby an MOSFET is formed as a switching transistor.

Next, a silicon oxide film as an insulating film 107 is formed all over the substrate 101 and then a storage node contact hole 108 for contact with the drain region 104a is formed to thereby form a pattern of a first capacitor electrode 110 made of a heavily doped polycrystalline silicon layer.

Subsequently, on the first capacitor electrode 110, a capacitor insulating film 111 of silicon oxide or the like and a second polycrystalline silicon layer 112 are sequentially deposited.

After this, the polycrystalline silicon layer 112 is in subjection to an ion implantation of such ions as phosphorus and then subjected to a heat treatment of some 900° C. and 120 minutes to form a heavily-doped polycrystalline silicon layer having a desired conductivity.

And the highly-doped polycrystalline silicon layer is subjected to a patterning process to obtain an MOS capacitor having a capacitor insulating film 111 sandwiched by the second capacitor electrode 112 and the first capacitor electrode 110.

Finally, on the thus formed polycrystalline silicon layer, an inter-layer insulating film 107' is formed, and therein a bit line contact hole 113 is made. Further, a bit line made of molybdenum polycide or the like is formed in the bit line contact hole 113, on which an inter-layer insulating film 107'' is formed to obtain a memory cell comprising a MOSFET and a MOS capacitor.

With such a structure, the storage node electrode can be extended up to a position above the element isolation region and the step difference of the storage electrode can be utilized, whereby the capacitance of the capacitor can be increased several to several ten times than that of a planar structure type.

A DRAM of such a laminated memory cell structure type, however, has the following disadvantage. As the memory integration is advanced, a distance (shown by l 1 in FIG. 55(a)) between the storage node contact hole and gate electrode as well as a distance (shown by l 2 in FIG. 55(b)) between the bit line contact hole and gate electrode must be shortened. This results in that a short-circuiting tends to occur between the storage node and the gate electrode and between the bit line and the gate electrode and thus the reliability is reduced.

Further, as the memory integration is advanced, it becomes more difficult to secure a large capacitance of the capacitor.

Even when the storage node electrode is extended up to a position above the element isolation zone, the area of flat part of the storage node electrode is still very small. When the storage node electrode is made thicker to utilize the side portion, the step difference of the storage electrode is increased, and therefore when the bit line contact hole is made in the upper layer of the capacitor, the over-etching time becomes long because distance from the upper layer and the substrate is long, thus resulting in possible reduction in the reliability.

In addition, as the memory integration is advanced, distance between the conductive layers in the contact hole becomes remarkable small with the result that the conductive layers may be short-circuited through the inter-layer insulating film 107. It will be appreciated that since the inter-layer insulating film is subjected to an etching process during formation of the contact hole, the film is deteriorated, which is a major cause of such short-circuiting.

SUMMARY OF THE INVENTION

In view of the above circumstances, it is an object of the present invention to provide a small and reliable memory cell structure and a method of fabricating the memory cell structure which can secure a sufficient capacitance of its capacitor while the area occupied by the memory cell is reduced and which can prevent any short-circuiting between the storage node and the gate electrode and between the storage node and the bit line.

In accordance with a first aspect of the present invention, at least one of a storage node contact hole and a bit line contact hole includes a first contact hole made in a first inter-layer insulating film formed over a gate electrode and a second contact hole made in a second inter-layer insulating film formed over an electrically conductive material embedded in the first contact hole, the conductive material being exposed through the second contact hole formed by etching part of the second inter-layer insulating film.

In the present invention, it is preferable that the storage node contact hole and the bit line contact holes include a first contact hole made in the same step in the first inter-layer insulating film formed over the gate electrode and a second contact hole made in different steps in the second inter-layer insulating film formed on an electrically conductive layer embedded in the first contact hole up to a level higher than the gate electrode such as to be contacted with the electrically conductive layer.

More preferably, the capacitor is formed higher than the bit line.

It is further preferable that the electrically conductive layer embedded in the storage node contact hole is extended to an element isolation region, and the second contact hole for contact with the electrically conductive layer is made over the element isolation region.

Preferably, the second contact holes constituting the two adjacent MOSFET storage node contact holes connected to the same bit line are positioned as opposed to the bit line.

Preferably, the electrically conductive layer embedded in the bit line contact hole is extended to the element isolation region, and the second contact hole for contact with the electrically conductive layer is made over the element isolation region.

More preferably, the electrically conductive layer is formed as expanded over the gate electrode.

In accordance with a fabricating method of the present invention, a MOSFET is formed within a semiconductor substrate, a first inter-layer insulating film is formed on the gate electrode of the MOSFET, a first contact hole is made to expose part of the surface of the substrate such as to be contacted with at least one of the source and drain regions of the MOSFET, an electrically conductive layer is embedded in the first contact hole such as to reach a position higher than the gate electrode, a second inter-layer insulating film is formed over the electrically conductive layer, part of the second inter-layer insulating film is selectively removed to expose the electrically conductive layer, and these first and second contact holes form one of the storage node contact hole and bit line contact hole.

It is preferable that the first contact hole forming step includes a step of etching the first inter-layer insulating film so that sectional area of the first contact hole is larger at portions higher than the gate electrode.

It is also preferable to etch the first inter-layer insulating film down to a level lower than a top surface of the embedded conductive layer after the conductive layer embedding step and prior to formation of the second inter-layer insulating film and then to form a new inter-layer insulating film thereon.

It is further preferable that the surface of the embedded conductive layer is oxidized to form an insulating layer after the first inter-layer insulating film etching step and prior to formation of the second inter-layer insulating film.

With such an arrangement as mentioned above, at the time of forming the storage node and/or bit line contact holes, it is required to expose not the substrate but the electrically conductive material previously embedded up to a position higher than the gate electrode, whereby the etching time can be shortened.

When the height of the electrically conductive material and the height of the gate electrode are set at suitable values according to the etching rate performed in the inter-layer insulating film, any short-circuiting between the gate electrode and second contact hole can be completely prevented even when the second contact hole is formed as shifted from the conductive material.

Further, since an amount of overetching can be reduced when compared with that in the case of directly making the contact hole to the substrate, such a problem can be avoided that the substrate is etched and thus the cell reliability is reduced.

Furthermore, the conductive material is formed to be expanded at its top part and thus the contact area can be made large. As a result, the contact resistance can be reduced and a memory cell having excellent performances can be realized.

With such a structure, when the conductive material is desirably formed to be expanded at a position higher than the gate electrode and to be overlapped therewith, the conductive material can function as an etching stopper during formation of the second contact hole and thus any short-circuiting between the second contact hole and gate electrode can be completely prevented.

Also polycrystalline silicon may be previously deposited as an etching stopper during formation of the first contact hole and after the formation of the first contact hole, the polycrystalline silicon film is oxidized to form an insulating film. As a result, any short-circuiting between the first contact hole and gate electrode can be completed avoided.

In addition, since etching for exposing the substrate is required only for the insulating film under the polycrystalline silicon film, the damage to the substrate can be minimized.

A capacitor may be formed higher than the bit line. Thus the processing of the storage node electrode can be facilitated and the capacitor area can be made large. Further it becomes unnecessary to subject the plate electrode to a patterning within a cell array, whereby the reliability can be enhanced. Further, when the storage node electrode is made to have a laminated layer structure, the sufficient capacitance of the capacitor can be secured.

When the electrically conductive layer embedded in the storage node contact hole is formed to be expanded to the element isolation region, the planar area of the capacitor can be made large.

Further, when the second contact hole for contact with the electrically conductive layer is made over the element isolation region, the embedded conductive layer plays a role of a leading pad. Since the leading pad of the embedded conductive layer is formed by embedding the conductive layer in the first contact hole previously formed in a self alignment manner to the gate electrode so that the leading pad will be formed in a self alignment manner to the gate electrode, it is unnecessary to provide an alignment allowance, and the pad occupation area can be made smaller than that of the prior art pad formed by patterning the polycrystalline silicon layer or the like. Further, even when the second storage node contact hole or the second bit line contact hole is misaligned with the pad, there is no danger of a short-circuiting to the gate electrode. Therefore, it becomes unnecessary to form a large pad for the alignment allowance. For this reason, it is also possible to form pads at both sides of the gate electrode at the same time. Usually, a pad is formed to be overlapped with the gate electrode, taking a misalignment allowance into consideration. Thus in the case where the gate electrode is subjected to a patterning in minimum processing dimensions, it becomes impossible to pattern the pad at the both sides of the gate electrode. In accordance with the present invention, however, since it is unnecessary to provide such misalignment allowance, pads can be formed at the both sides of the gate electrodes as mentioned above.

Furthermore, with such a structure that the second contact hole is made larger than the electrically conductive material embedded at least in one direction, electrical contact can be obtained even at the side surface of the embedded conductive material, so that the contact area can be made larger than that in the case of obtaining electrical contact only at the upper surface and thus a reduction in the contact resistance can be realized.

When the second contact holes constituting the storage node contact holes of two adjacent MOSFETs are positioned to be opened at a side opposed to the bit line, the storage node electrodes of the MOSFETs can be made large and the capacitance of the capacitors can be increased.

BRIEF DESCRIPTION OF THE DRAWINGS

FIGS. 1(a) to 1(d) show a DRAM of a laminated memory cell structure in accordance with a first embodiment of the present invention;

FIGS. 2(a) to 2(c), 3(a) to 3(c), 4(a) to 4(c), 5(a) to 5(c), 6(a) to 6(c), 7(a) to 7(c), 8(a) to 8(d), and 9(a) to 9(d) show fabricating steps in a method of fabricating the DRAM of the laminated memory cell structure as shown in FIG. 1;

FIGS. 11(a) to 11(d) show a DRAM in accordance with a third embodiment of the present invention;

FIGS. 12(a) to 12(c), 13(a) to 13(c), 14(a) to 14(c), 15(a) to 15(c), 16(a) to 16(c), 17(a) to 17(d) show fabricating steps in a method of fabricating a DRAM of the laminated memory cell structure in accordance with a fourth embodiment of the present invention;

FIGS. 18(a) to 18(d) show a DRAM in accordance with a fifth embodiment of the present invention;

FIGS. 46(a) to 46(c), 47(a) to 47(c), 48(a) to 48(c), 49(a) to 49(c), 50(a) to 50(c), 51(a) to 51(c), 52(a) to 52(c), 53(a) to 53(c) and 54(a) to 54(d) show fabricating steps in a method of fabricating a DRAM of the laminated memory cell structure in accordance with a fourteenth embodiment of the present invention; and FIGS. 55(a) to 55(c) show a prior art·DRAM of the laminated memory cell structure.

DESCRIPTION OF THE PREFERRED EMBODIMENTS

Figure 2C:
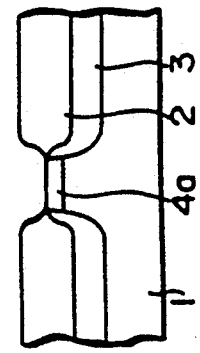

Embodiments of the present invention will be explained in detail by referring to the attached drawings.

FIGS. 1(a) to 1(d) show a plan view of a DRAM of a laminated memory cell structure corresponding to 2 adjacent bits in a bit line direction of the DRAM and cross-sectional views of the DRAM taken along lines 1—1', 2—2', and 3—3' in FIG. 1(a), respectively.

The DRAM is featured in that a gate electrode 6 of a MOSFET is covered on its upper and side walls with insulating films 7 and 8 and a bit line contact hole and a storage node contact hole are contacted with source and drain regions 4a and 4b and also contacted with a polycrystalline silicon layer 16 embedded up to a position higher than the gate electrode 6 in a positional relation very close to the gate electrode. Other parts are substantially the same as those of the prior art DRAM of the laminated memory cell structure.

More in detail, an insulating film 2 for element isolation is formed in a p-type silicon substrate 1 having a resistivity of about 5 $\Omega$·cm. In an active area separated by the insulating film 2, the n-type diffusion layers 4a and 4b as source and drain regions as well as the gate electrode 6 provided between these source and drain regions through a gate insulating film 5 are provided to thereby form a MOSFET. Provided on the MOSFET is an inter-layer insulating film 23 which in turn is opened with a contact hole. The polycrystalline silicon layer 16 as the embedded layer is formed as contacted with the n-type diffusion layers 4a and 4b through the contact hole opened in the inter-layer insulating film 23. Formed as contacted with the polycrystalline silicon layer 16 is a storage node electrode 20 on which a capacitor insulating film 21 and a plate electrode 22 are sequentially provided to thereby form a capacitor. And a bit line 25 is formed through a bit contact hole made in the inter-layer insulating film 23.

In this way, a plurality of such gate electrodes 6 as word lines are arranged consecutively in one direction of the memory array.

Explanation will next be made as to how to fabricate the DRAM by referring to drawings.

FIGS. 2 to 9 are fabricating steps in the method of fabricating the DRAM, in which (a) to (c) in each step show a plan view of the DRAM corresponding to 2 adjacent bits in a bit line direction of the DRAM and cross-sectional views of the DRAM taken along lines 1—1' and 2—2' in each of FIGS. 2 to 9, respectively.

Figure 2A:
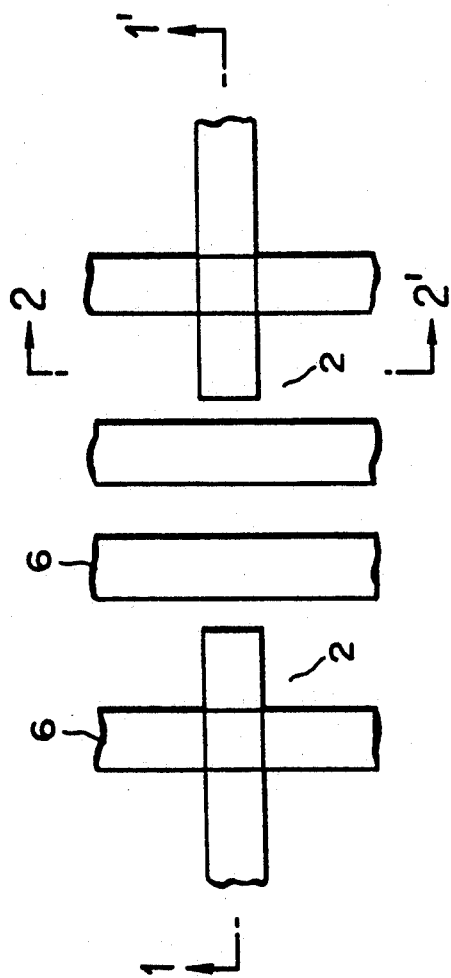
Figure 2B:
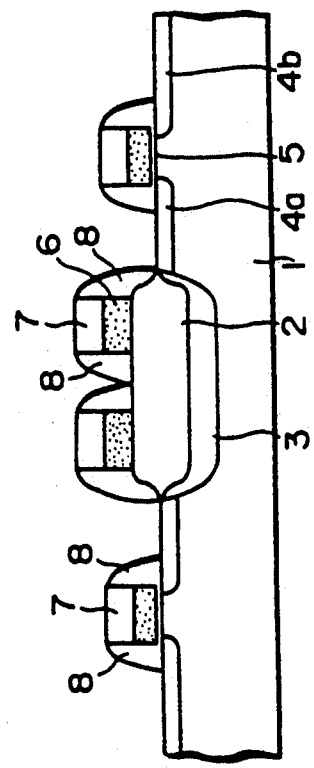

First, as shown in FIGS. 2(a) to 2(c), on a p-type silicon substrate 1 having a resistivity of about 5 Ωcm, an element-isolation insulating film 2 and a p-type diffusion layer 3 for punch-through stop are formed by an ordinary LOCOS method. Then a silicon oxide film of about 10 nm thickness as a gate insulating film 5 is formed by a thermal oxidation method. Further deposited on the entire gate insulating film 5 is a polycrystalline silicon film, a metallic film or a silicide film as the material of a gate electrode 6, on which an insulating film 7 such as a silicon oxide film of about 100-300 nm thickness is deposited by a CVD (chemical vapor deposition) method and then the gate electrode 6 and insulating film 7 formed thereon are simultaneously subjected to a patterning by a photolithographic process and an anisotropic etching process.

Thereafter, As ions are injected into the silicon substrate 1 with use of the gate electrode 6 as a mask to form source and drain regions 4a and 4b of an n-type diffusion layer, whereby a MOSFET as a switching transistor is formed. The depth of the diffusion layer is set to be, for example, about 150 nm. Then an insulating film as a silicon oxide layer of about 100 nm or less is deposited on the entire insulating film 7 by the CVD method and subjected to a reactive ion etching process to have a side wall insulating film 8 left on sides of the gate electrode 6 in a self alignment manner.

Figure 3C:
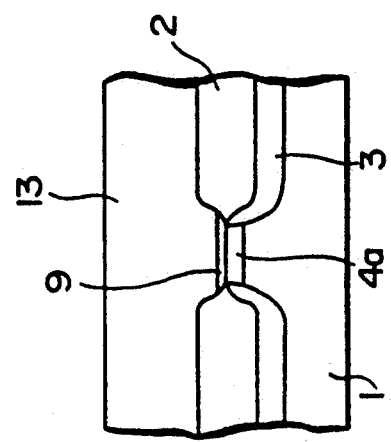
Figure 3A:
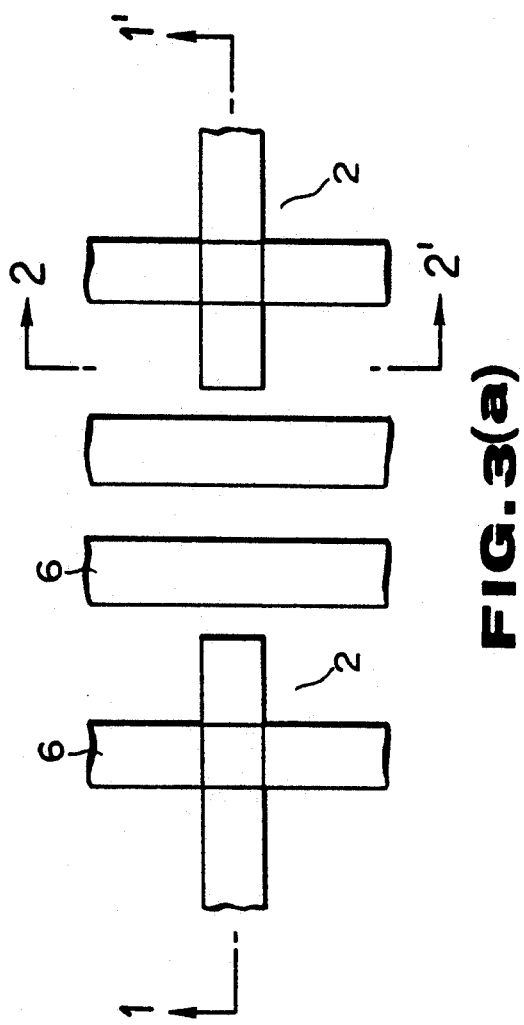
Figure 3B:
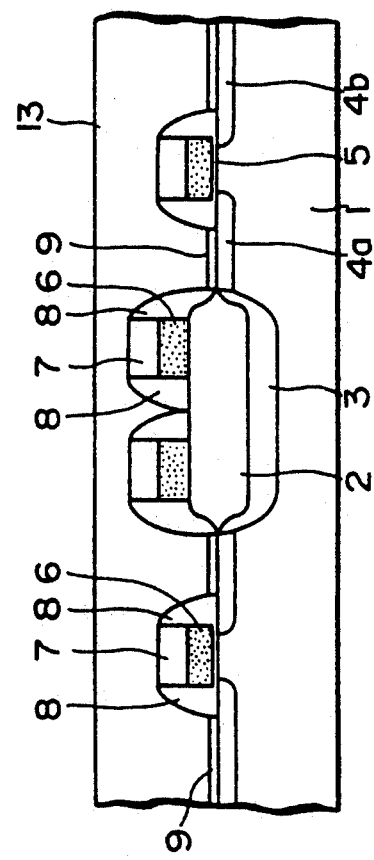

As shown in FIGS. 3(a) to 3(c), subsequently, a silicon oxide film 9 of about 20 nm thickness is formed on the thus obtained substrate by the thermal oxidation method and then a silicon oxide film 13 as an inter-layer insulating film is deposited on the entire substrate by the CVD method.

Figure 4A:
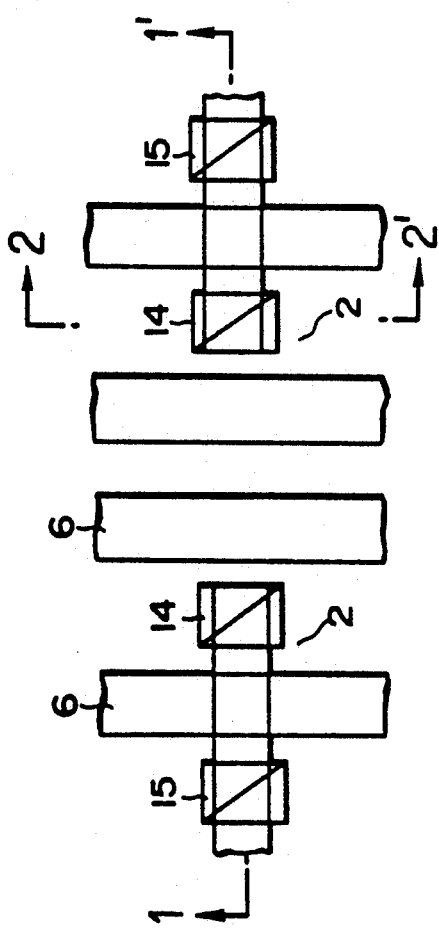
Figure 4C:
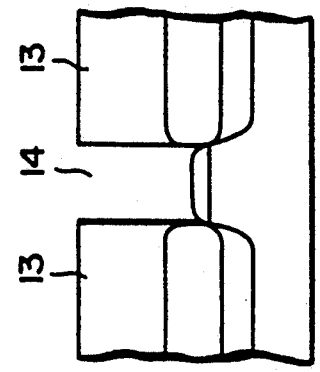
Figure 4B:
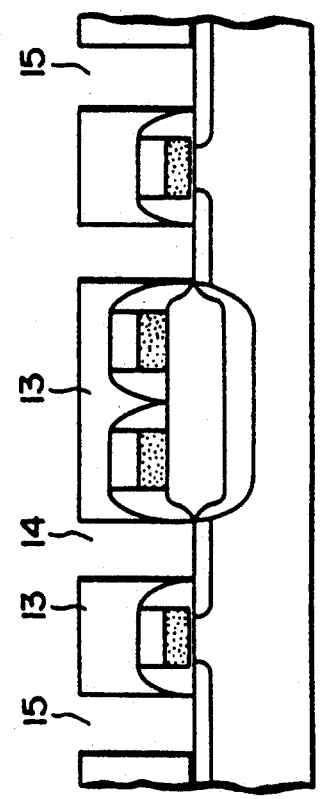
Figure 5C:
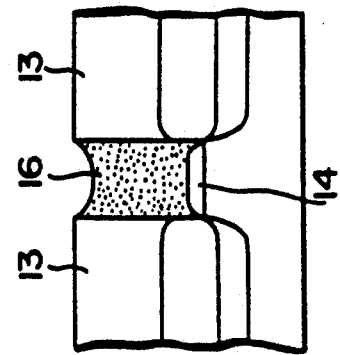
Figure 5A:
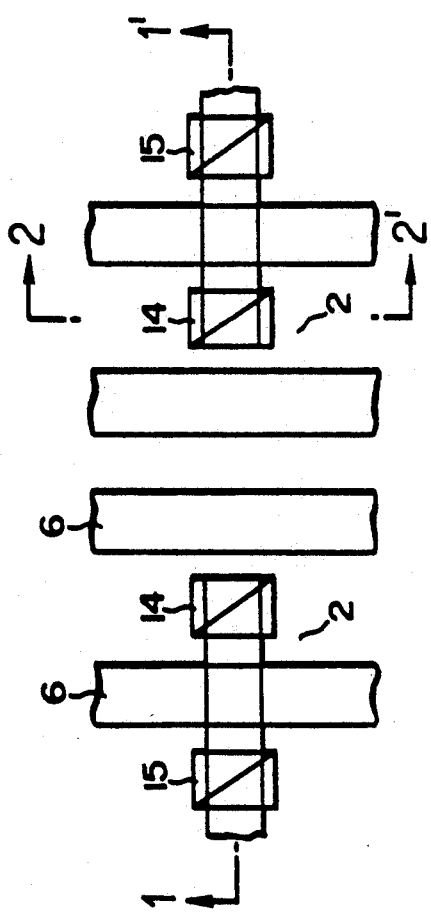
Figure 5B:
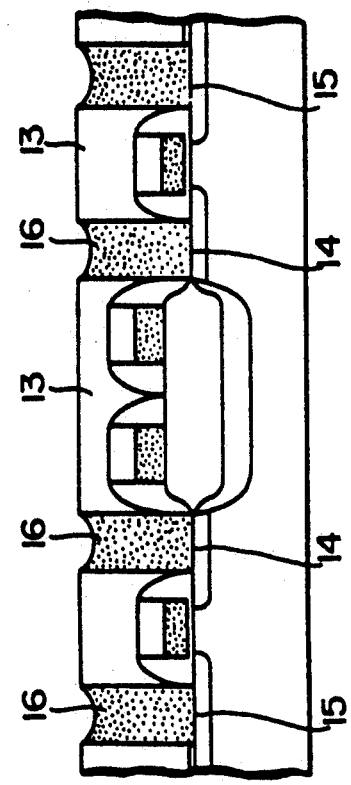

As shown in FIGS. 4(a) to 4(c), the silicon oxide film 13 is then subjected to a patterning by means of the photolithographic process and the reactive ion etching process to thereby form a first storage node contact hole 14 and a first bit line contact hole 15 at the same time. In this case, a resist may also be subjected to a patterning with use of the photolithographic process and then to an isotropic etching process and the anisotropic etching process to thereby form a contact hole having a wider upper size. Further, the resist may be subjected to the patterning with use of the photolithographic process and then to the anisotropic etching process to open the contact hole and further to the isotropic etching process to widen only the upper size of the contact hole and thereby obtain the contact hole having the wider upper size. As shown in FIGS. 5(a) to 5(c), for example, a heavily-doped polycrystalline silicon film 16 is deposited on the entire substrate so that the thickness of the polycrystalline silicon film 16 is ½ or more of shorter one of sides of the contact cavities 14 and 15 (for the purpose of completely embedding the contact cavities), after which the entire substrate is subjected to an etching until the surface of the inter-layer insulating film 13 is exposed, whereby the polycrystalline silicon film 16 is left only in the contact cavities. In this case, the doping of the polycrystalline silicon film may be carried out in such a manner that a thin polycrystalline silicon film of about 500 Å is deposed. As ions as an example are implanted, a polycrystalline silicon film is again deposited so as to have a thickness of ½ or more of the shorter side of a contact cavity. As ions are implanted, a silicon oxide film is deposited by the CVD method, and then subjected to a heat treatment.

Although the polycrystalline silicon film has been embedded all over and then again subjected to the etching in the foregoing steps, the polycrystalline or monocrystalline silicon film may be selectively grown only in the contact cavities as an example.

Figure 6A:
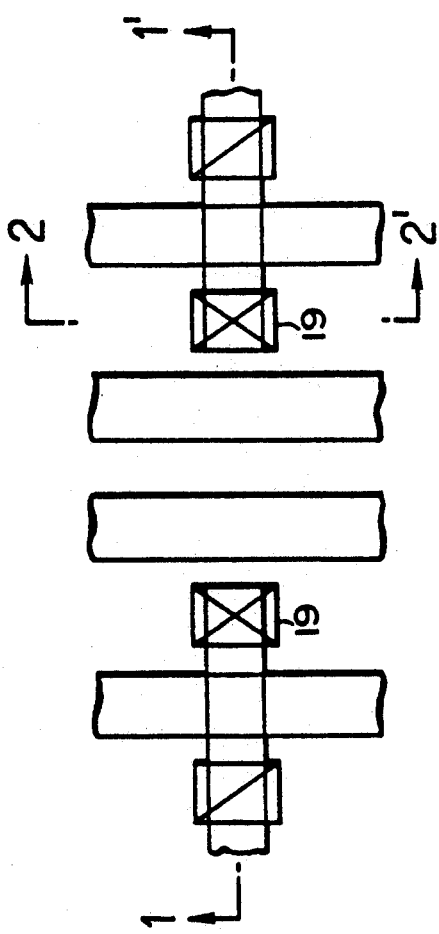
Figure 6C:
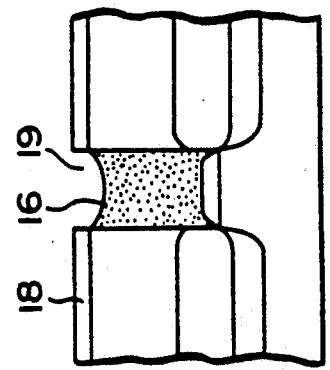
Figure 6B:
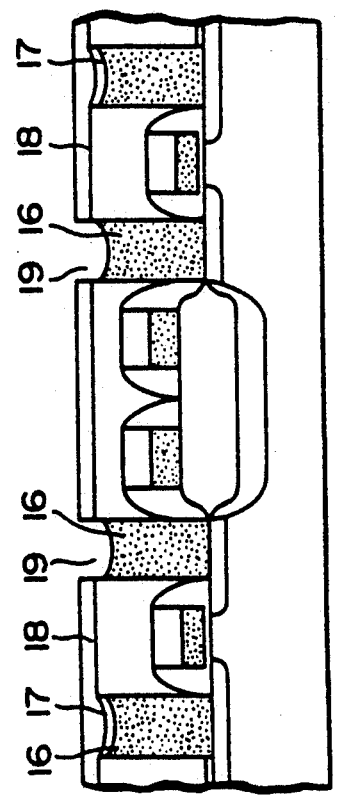
Figure 7A:
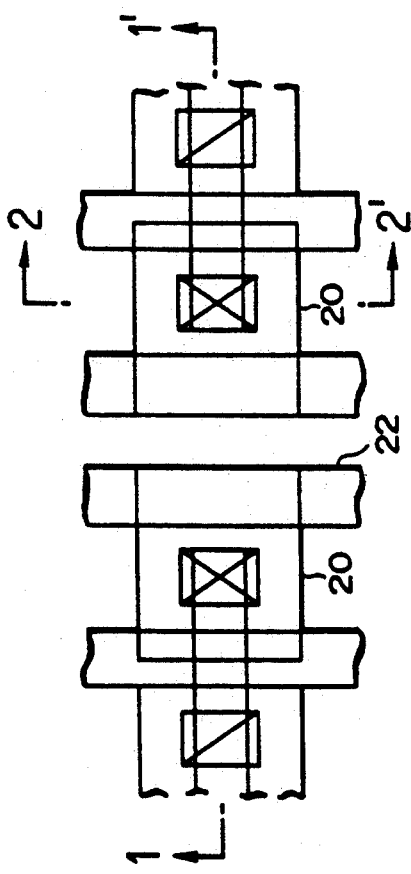
Figure 7C:
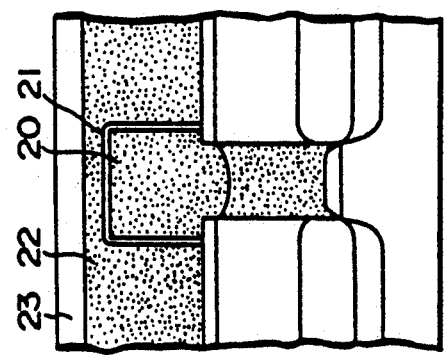
Figure 7B:
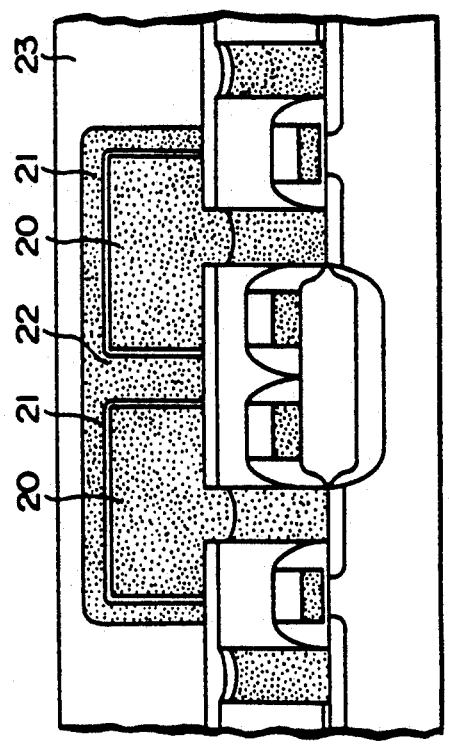
Figure 9A:
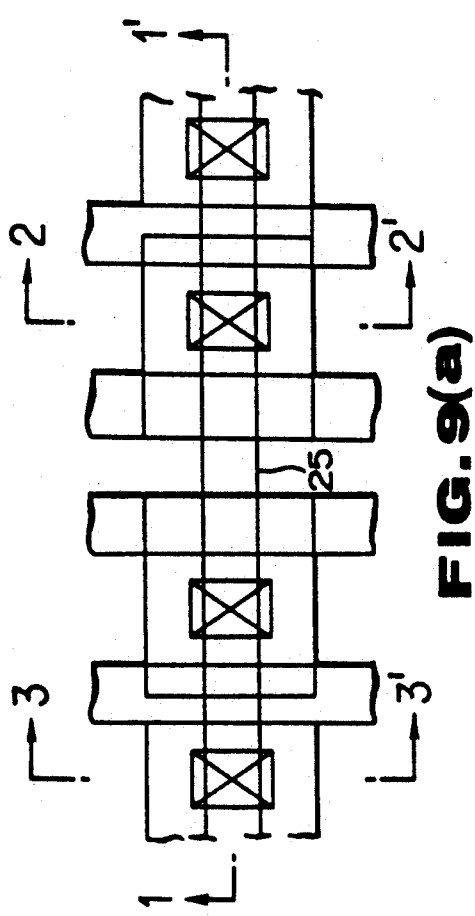
Figure 9D:
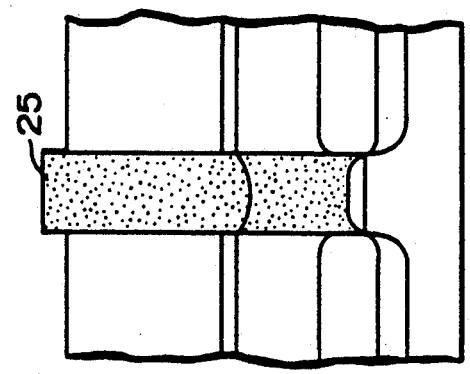
Figure 9C:
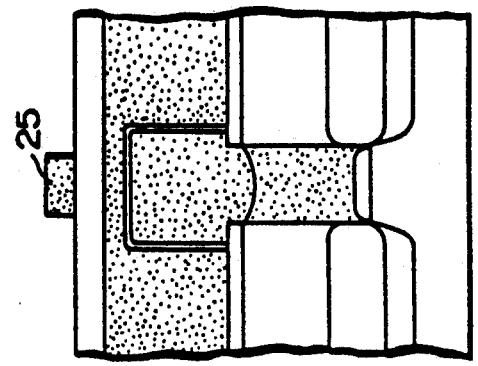
Figure 9B:
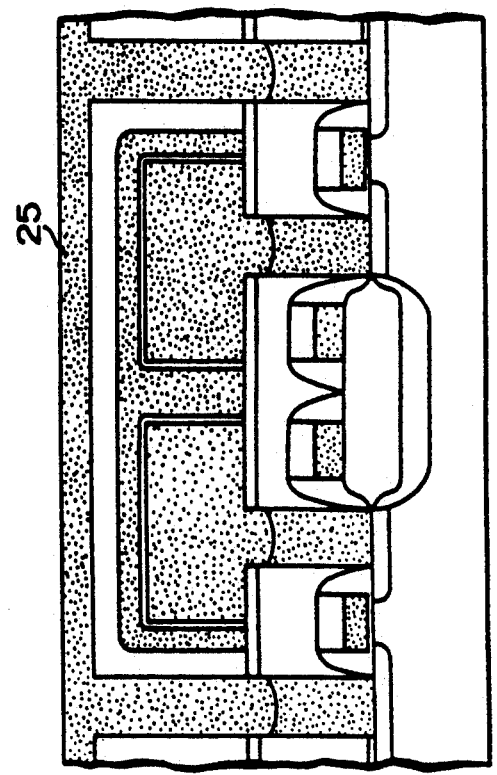
Figure 10D:
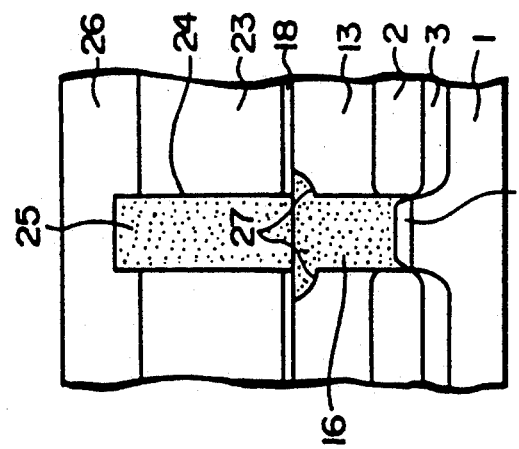
FIGS. 10(a) to 10(d) show a DRAM in accordance with a second embodiment of the present invention.
Figure 10C:
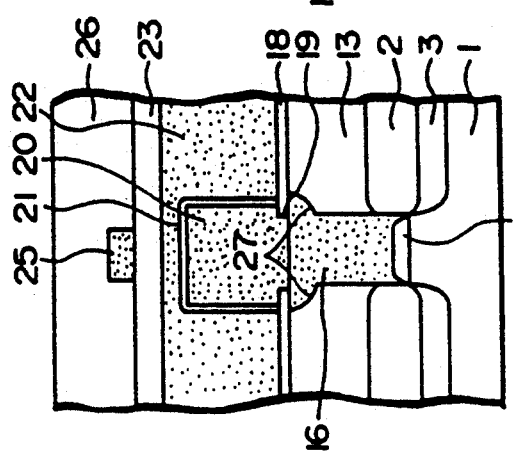
Figure 10A:
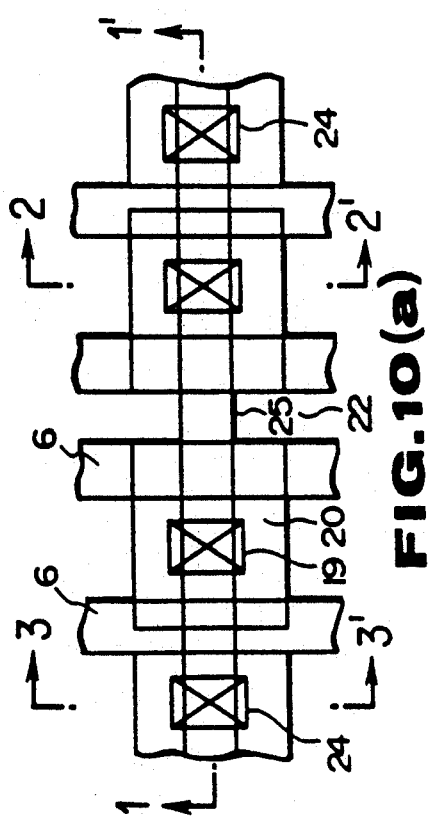
Figure 10B:
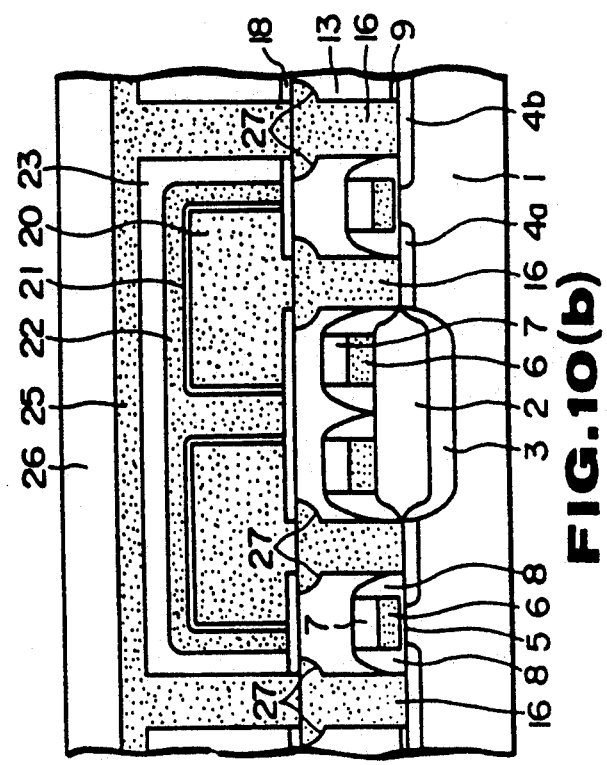

Thereafter, as shown in FIGS. 6(a) to 6(c), a silicon oxide film 17 of about 200 Å thickness is formed on the surface of the substrate, e.g., by the thermal oxidation method, a silicon oxide film 18 of 500 Å thickness is deposited thereon by the CVD method, and then the silicon oxide films 17 and 18 are subjected to the photolithographic method and reactive ion etching so that silicon oxide films 17 and 18 are selectively removed and the polycrystalline silicon film 16 corresponding only to the storage node contact parts is exposed.

After the storage node contact holes have been made in this manner, a polycrystalline silicon film is deposited on the entire surface of the substrate, subjected to a doping and then to the photolithographic method and reactive ion etching for its patterning, whereby a storage node electrode 20 is formed. Then a silicon nitride film of a thickness of 10 nm is deposited on the substrate by the CVD method, subjected to an oxidation in a steam atmosphere at about 800° C. for about 30 minutes to form a silicon oxide film, thereby forming a two-layer capacitor insulating film 21 of the silicon nitride layer and silicon oxide layer. A polycrystalline silicon film is further deposited on the capacitor insulating film 21, subjected to a doping and then to the photolithographic method and reactive ion etching for its patterning to thereby form a plate electrode 22. After this, unnecessary parts of the capacitor insulating film are removed with use of the plate electrode 22 as a mask. On the plate electrode 22, an inter-layer insulating film 23 of a silicon oxide film is deposited and heat-treated to be flatten thereon (refer to FIGS. 7(a) to 7(c)). Next, as shown in FIGS. 8(a) to 8(d), the inter-layer insulating film 23 and silicon oxide films 17 and 18 are selectively removed by the photolithographic method and reactive ion etching so that the parts of the polycrystalline silicon film 16 corresponding only to the bit line contact parts are exposed, thus forming a bit line contact 24.

As shown in FIGS. 9(a) to 9(d), a polycrystalline silicon film is deposited on the entire surface of the substrate and subjected to a doping process and then to the photolithographic method and reactive ion etching for its patterning to thereby form a bit line 25. The bit line has been formed as a single-layer polycrystalline silicon film in the illustrated example, but the bit line may comprise a polycrystalline silicon layer and a silicide layer mutually laminated.

Thereafter, a silicon oxide film 26 is formed as a protective film. At this stage, such a DRAM as shown in FIGS. 1(a) to 1(d) is completed.

According to the present fabricating method, since the storage node contact holes and bit line contact holes are formed as previously contacted with the polycrystalline silicon film embedded up to a position higher than the gate electrode, the etching time necessary for the formation of the contact holes can be shortened.

For this reason, even in the event where it is desired to make such a contact hole having a high aspect ratio as the bit line contact hole in the present embodiment, it can be avoided that the substrate is excessively etched by an overetching and thus a reliable memory cell can be realized.

In addition, since any short-circuiting of the gate electrode due to misalignment in the photolithographic technique can be avoided and an allowance for the misalignment of the pattern can be omitted, the memory cell can be made small in size.

Embodiment 2

Explanation will be made as to the cell structure of a DRAM in accordance with a second embodiment of the present invention which can positively prevent any short-circuiting of the gate electrode due to the contact misalignment.

This DRAM, as shown in FIGS. 10(a) to 10(d), has such a structure that contact area is expanded above the gate electrodes 6. With such a structure, the contact area can be made large and thus the contact resistance can be reduced.

In fabricating such a structure, storage node and bit line contact holes are subjected to a patterning and then to an isotropic etching process with resist remained to thereby remove upper edges 27 of the pattern, and subsequently are subjected to a reactive ion etching process to make contact holes. And the similar steps to in the foregoing first embodiment are applied in such a manner that, for example, polycrystalline or monocrystalline silicon is selectively grown only within the contact holes, a silicon oxide film 18 is deposited thereon, contact holes are made therein, etc.

Embodiment 3

As shown in FIGS. 11(a) to 11(d), storage node and bit line contact holes are made, a polycrystalline or monocrystalline silicon layer polycrystalline silicon layer 28 is selectively grown only within the contact holes so that the thickness of the growth becomes larger than the depth of the contact holes. In both of FIGS. 10 and 11, the upper expanded parts of the contact holes are positioned at a level higher than the gate electrodes and a high margin can be set for misalignment. As a result, it is unnecessary to take an allowance for the pattern and thus a very small memory cell can be realized.

Embodiment 4

In the foregoing embodiments, the storage node and bit line contact holes have been made at the same time by flattening the inter-layer insulating film and subjecting it to the photolithographic and reactive ion etching processes. Explanation will be made by referring to FIGS. 12 to 17 as to a fourth embodiment according to which a smaller memory cell can be realized with use of the above improved steps.

Figure 12A:
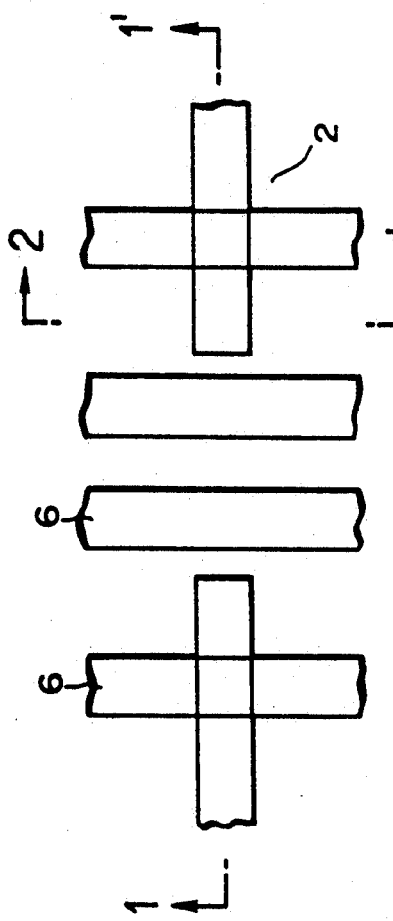
Figure 12C:
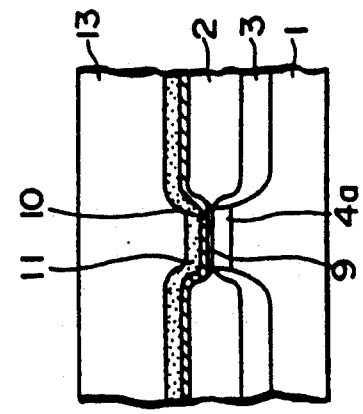
Figure 12B:
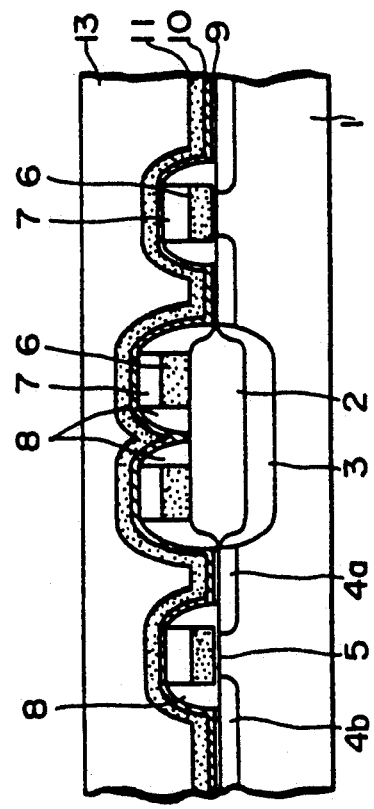

Up to the steps of forming the gate electrodes 6 and leaving the side wall insulating film 8 on the sides of the gate electrodes 6, first, the same steps as in the first embodiment are used. Thereafter, a silicon oxide film 9 of 200 Å thickness, a silicon nitride layer 10 of 20 nm thickness and a polycrystalline silicon film 11 of 50 nm thickness are sequentially deposited by the thermal oxidation method and then an inter-layer insulating film 13 made of phosphorus glass or the like is formed thereon. In this case, the inter-layer insulating film 13 may be flatten by means of a thermal treatment as shown in FIGS. 12(a) to 12(c) or may be as it is without any treatment.

Figure 13A:
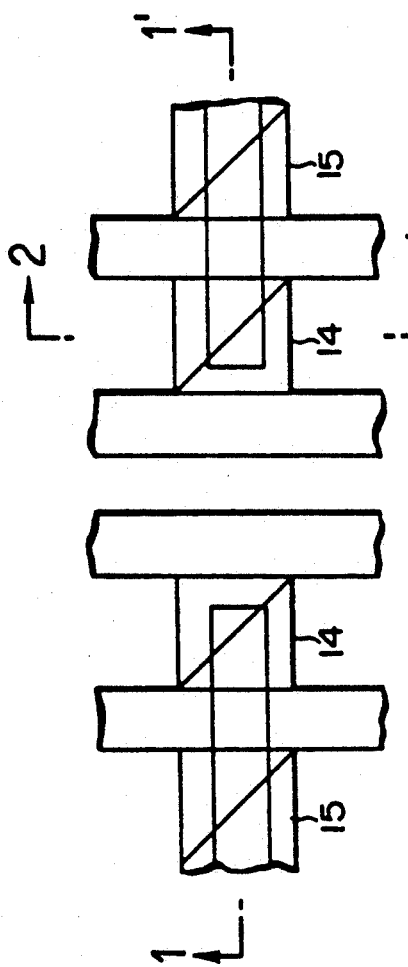
Figure 13B:
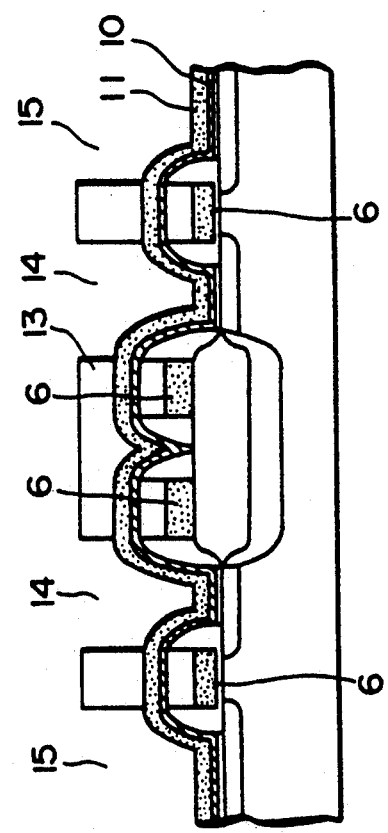
Figure 13C:
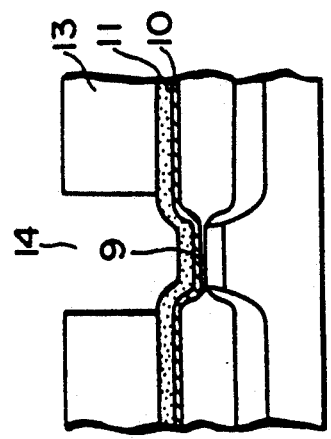

Thereafter, as shown in FIGS. 13(a) to 13(c), the thus obtained substrate is subjected to photolithographic and reactive ion etching processes to obtain a pattern of the inter-layer insulating film 13, and first storage node contact holes 14 and first bit line contact holes 15 are made therein at the same time. In this case, when the etching conditions are selected so that the etching rate of the polycrystalline silicon film 11 is sufficiently smaller than the etching rate of the inter-layer insulating film 13, the polycrystalline silicon film 11 acts as an etching stopper, which results in that, even when a distance between the first storage node contact hole 14 and gate electrode 6 or a distance between the first bit line contact hole 15 and gate electrode 6 is very small, there can be avoided any short-circuiting between the storage node contact hole and gate electrode 6 and between the bit line and gate electrode 6.

Next, as shown in FIGS. 14(a) to 14(c), that areas of the polycrystalline silicon film 11 corresponding to the first storage node contact hole 14 and first bit line contact hole 15 are removed by the isotropic etching or chemical dry etching (CDE) process to expose the underlying silicon nitride layer 10.

Figure 15C:
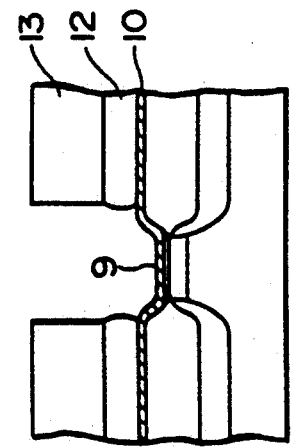
Figure 15A:
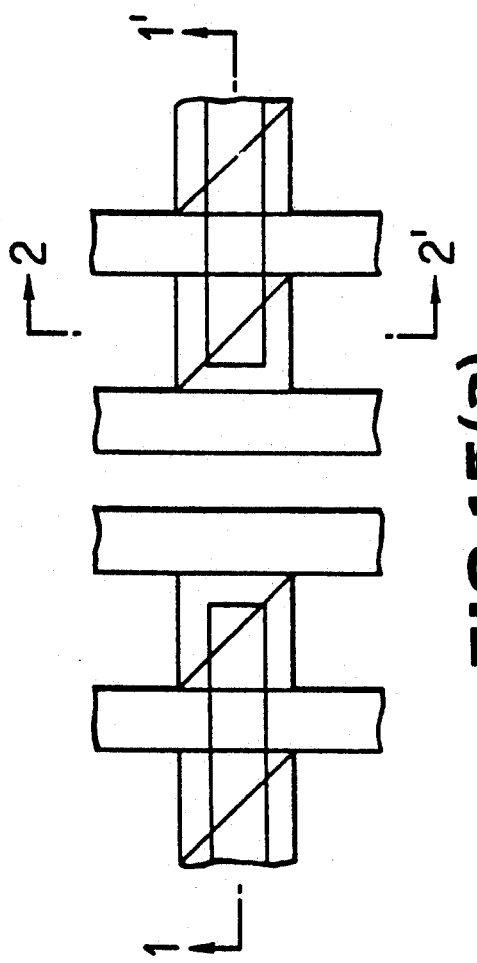
Figure 15B:
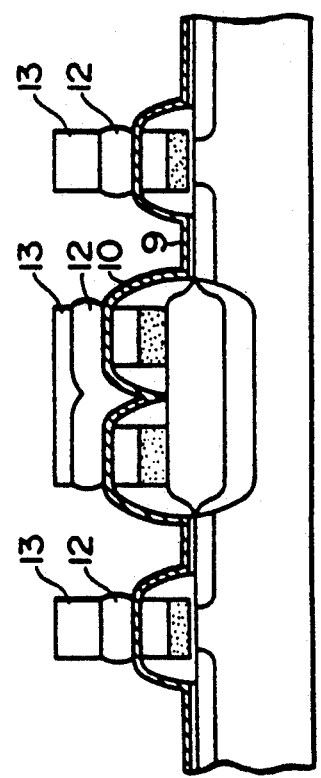

As shown in FIGS. 15(a) to 15(c), the polycrystalline silicon film 11 exposed at least at the side walls of the storage node and bit line contact holes are then oxidized to form a silicon oxide film 12. In this connection, the entire polycrystalline silicon film 11 may be oxidized to form the silicon oxide film 12. In this way, when at least parts of the remaining polycrystalline silicon film exposed at the side walls of the contact holes are oxidized, such a short-circuiting problem between the storage node electrodes through the polycrystalline silicon film 11 or between the storage node electrode and bit line can be prevented.

Figure 16A:
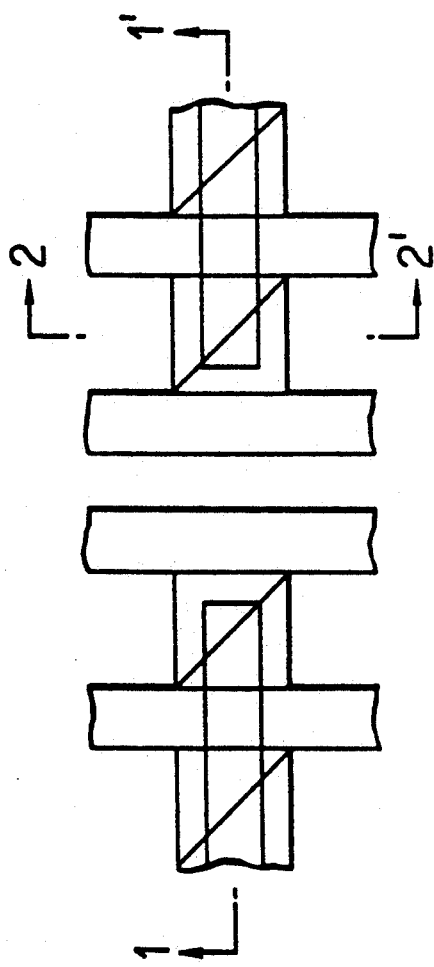
Figure 16C:
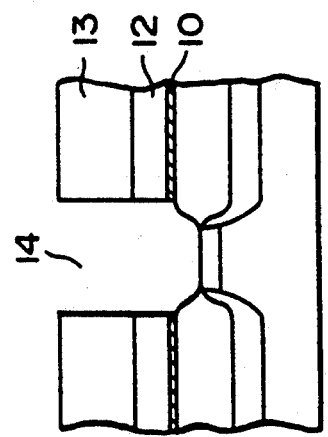
Figure 16B:
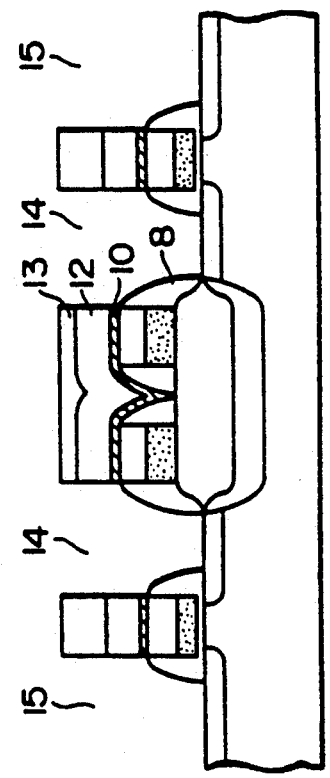

Next, as shown in FIGS. 16(a) to 16(c), that areas of the silicon nitride layer 10 and thin silicon oxide film 9 thereunder corresponding to the first storage node contact holes 14 and first bit line contact holes 15 are removed by the anisotropic etching process to expose the surface of the silicon substrate. At this time, since the side walls and upper parts of the gate electrodes are covered with the thick insulating film, the etching will not reach the gate electrodes.

After the formation of the first storage node contact holes 14 and first bit line contact holes 15 in this way, a polycrystalline silicon film is deposited with use of the same steps as the above and then subjected again to the etching to be embedded in the contact holes or a monocrystalline or polycrystalline silicon film is selectively grown.

The subsequent steps exactly the same as in the foregoing first embodiment are then carried out and such a memory cell as shown in FIGS. 17(a) to FIG. 17(c) is completed.

According to the present fabricating method, since the polycrystalline silicon film acting as an etching stopper is formed at the time of forming the first storage node contact holes and first bit line contact holes, any need for providing an allowance to take misalignment to the gate electrode into consideration can be eliminated and the memory cell can be made small and improved in reliability.

In particular, like the present embodiment, when the storage node contact holes and bit line contact holes are previously embedded or selectively grown therein with the silicon up to a level higher than the gate electrodes, a margin for misalignment can be set high. More in detail, in the case where a contact hole having a high aspect ratio such as the bit line contact hole in the present memory cell is made so as to reach the surface of the substrate through one etching process, this requires a very long etching time and thus there is a possibility that the polycrystalline silicon layer cannot act sufficiently as the etching stopper. In the case where the polycrystalline silicon film is made thick so as to sufficiently act as the etching stopper even when the etching time is very long, on the other hand, the silicon film cannot be oxidized sufficiently in the subsequent oxidation step, which may lead to the cause of a short-circuiting.

Therefore, by forming the insulating film around the gate electrodes, by etching the inter-layer insulating film with use of the polycrystalline silicon film as the stopper layer to once form shallow contact holes and then by oxidizing it, there can be realized a reliable memory cell which can avoid the possibility of a short-circuiting.

In addition, since the contact holes are previously embedded up to a level higher than the gate electrodes, even when a misalignment takes place during the second formation of the contact holes, a short-circuiting of the gate electrodes can be eliminated. For this reason, the need for taking the misalignment into consideration can be eliminated and thus the sufficient contact area can be correspondingly secured and the memory cell can be desirably made small and improved in reliability.

Embodiment 5

In the foregoing embodiment 4, at the time of the simultaneous formation of the storage node and bit line contact holes, the remaining polycrystalline silicon film has been oxidized to prevent the occurrence of any short-circuiting between the contact holes. However, the following steps can be instead carried out as in the present embodiment 5. That is, as shown in FIGS. 18(a) to 18(c), that areas of the polycrystalline film corresponding to the contact parts are removed by a CDE process, a silicon nitride film is deposited on the entire surface thereof, subjected to a reactive ion etching process to expose the surface of the substrate, and at the same time to leave a silicon nitride film 29.

In this connection, prior to the deposition of the silicon nitride film, the polycrystalline silicon film may be oxidized if necessary.

According to the present fabricating method, even when the polycrystalline silicon film cannot be sufficiently oxidized, any short-circuiting can be avoided. Further, since the oxidation step of oxidizing the polycrystalline silicon film can be omitted, the depth of a junction in the transistor can be made large in the thermal oxidation step and thus such a problem in the transistor can be solved that the transistor is weak in short channel effect, whereby the cell size can be made further small.

In addition, even in the case where the interlayer insulating film is made of phosphorus glass, there can be avoided such a problem that phosphorus is diffused down to the silicon substrate through the polycrystalline silicon film embedded in the contact holes, undesirably resulting in that the performance of the transistor is deteriorated or the withstanding voltage for isolation between the contact holes is reduced.

Embodiment 6

Although the formation of the bit lines has been carried out after the formation of the capacitor in the foregoing embodiments, the capacitor may be formed after the formation of the bit lines. In the latter case, since the capacitor is formed on the bit lines, i.e., since the bit lines are covered as shielded with the plate electrode, even when it is desired to make the cell size small, any erroneous operation caused by the interference between the adjacent bit lines can be prevented from taking place.

The present embodiment 6 will be explained in connection with a DRAM wherein a capacitor is formed on bit lines.

Figure 19A:
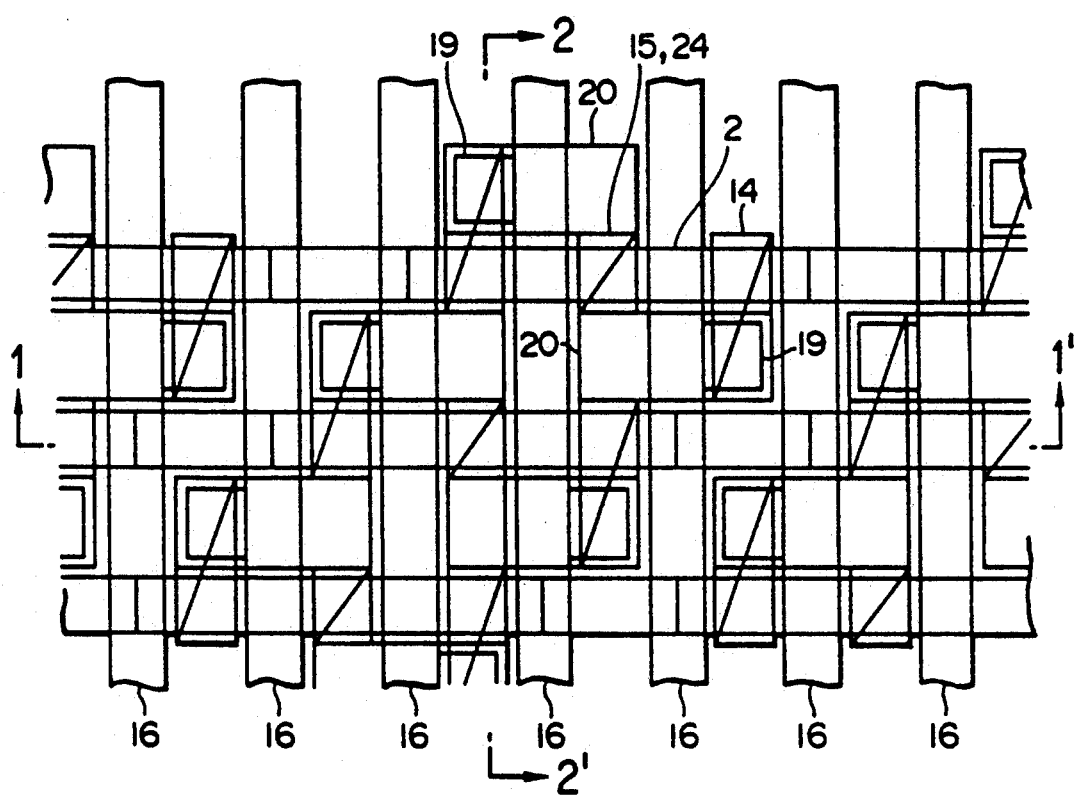
FIGS. 19(a) to 19(c) show a DRAM in accordance with a sixth embodiment of the present invention.
Figure 19B:
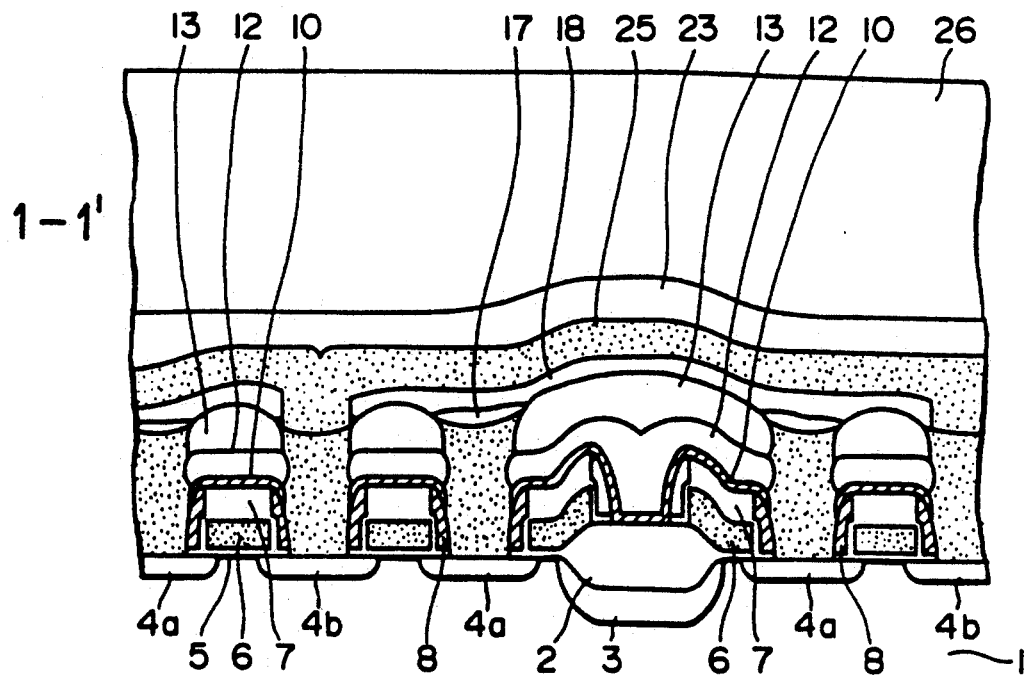
Figure 19C:
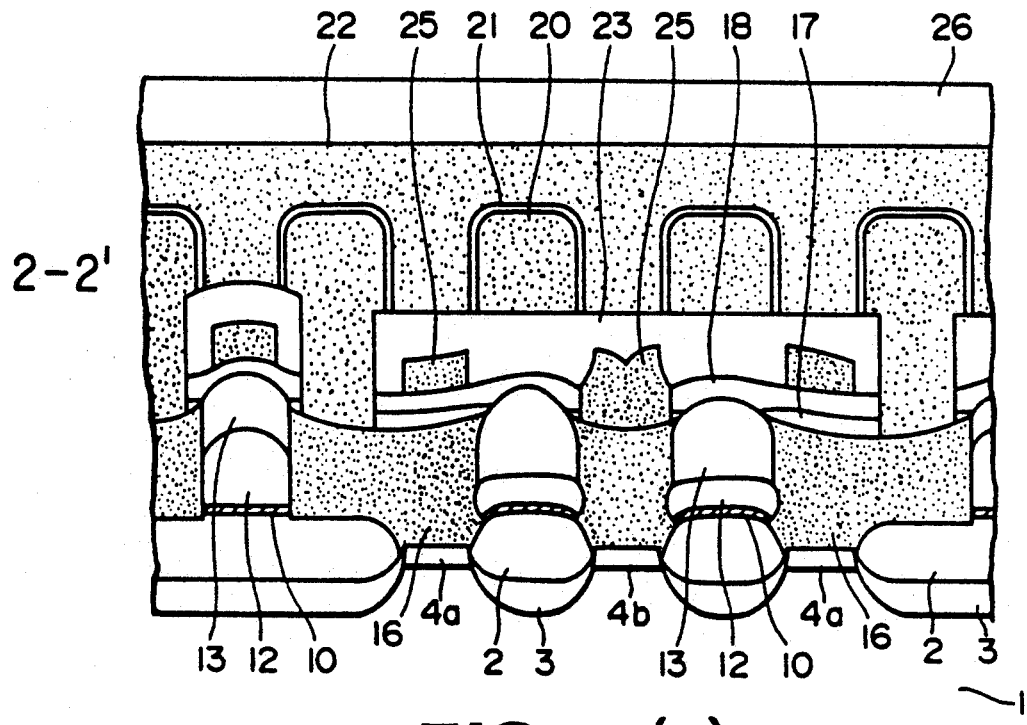

FIG. 19(a) shows a plan view of a DRAM of the laminated memory cell structure in accordance with an embodiment of the present invention, corresponding to 2 adjacent bits in the bit line direction of the DRAM, while FIGS. 19(b) and 19(c) show cross-sectional views thereof taken along lines 1—1' and 2—2' in FIG. 19(a), respectively.

The present DRAM is different from the embodiment 1 mainly in that a capacitor is provided in the layers above bit lines 25, a polycrystalline silicon layer 16 as a layer to be embedded in storage node contact holes is formed as extruded upwardly from the element-isolation region, and a storage node electrode 20 is formed as contacted above the element-isolation region. And as in the embodiment 1, gate electrodes 6 are covered at their upper and side walls with insulating films 7 and 8, bit line contact holes and storage node contact holes are embedded therein with the polycrystalline silicon layer 16 up to a position higher than the gate electrodes in a relation contacted with the polycrystalline silicon layer 16 and are also positioned very close to the gate electrodes. Other parts are substantially the same as those in the prior art DRAM of the laminated memory cell structure. That is, an insulating film 2 for element isolation is formed in a p-type silicon substrate 1 having a resistivity of about 5 Ω·cm. In an active area separated by the insulating film 2, the n-type diffusion layers 4a and 4b as source and drain regions as well as the gate electrode 6 provided between these source and drain regions through a gate insulating film 5 are provided to thereby form a MOSFET. Provided on the MOSFET is an inter-layer insulating film 23 which in turn is opened with a contact hole. The polycrystalline silicon layer 16 as the embedded layer is formed as contacted with the n-type diffusion layers 4a and 4b through the contact hole made in the inter-layer insulating film 23. Formed as contacted with the polycrystalline silicon layer 16 is a bit line 25. And a storage node electrode 20 is formed through the storage node contact hole made in the inter-layer insulating film 23, on which a capacitor insulating film 21 and a plate electrode 22 are sequentially provided to thereby form a capacitor.

And a plurality of such gate electrodes 6 as word lines are arranged consecutively in one direction of the memory array.

Explanation will next be made as to how to fabricate the DRAM by referring to drawings.

FIGS. 20 to 30 are fabricating steps in the method of fabricating the DRAM, in which (a) and (b) in each drawing show cross-sectional views of the DRAM corresponding to 2 adjacent bits in a bit line direction of the DRAM taken along lines 1—1' and 2—2' in FIG. 19(a), respectively.

Figure 20A:
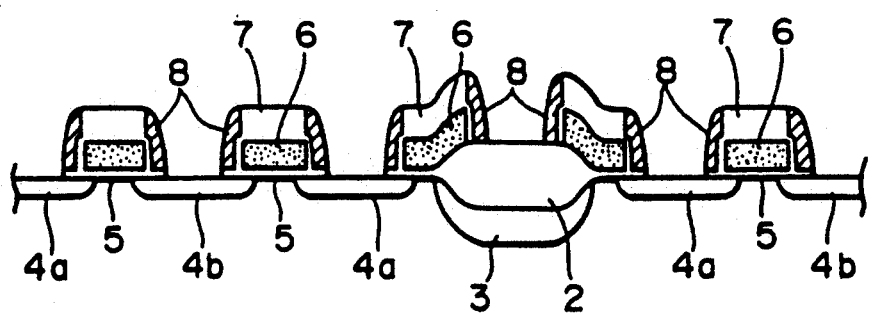
FIGS. 20(a), 20(b), 21(a), 21(b), 22(a), 22(b), 23(a), 23(b), 24(a), 24(b), 25(a), 25(b), 26(a), 26(b), 27(a), 27(b), 28(a), 28(b), 29(a), 29(b), 30(a) and 30(b) show fabricating steps in a method of fabricating the DRAM of the laminated memory cell structure of the sixth embodiment.
Figure 20B:
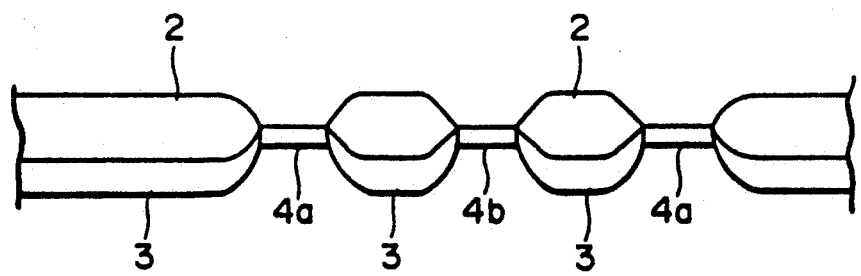

First, as shown in FIGS. 20(a) and 20(b), on a p-type silicon substrate 1 having a resistivity of about 5 Ωcm, an element isolation insulating film 2 and a p-type diffusion layer 3 for punch-through stop are formed by an ordinary LOCOS method. Then a silicon oxide film of about 10 nm thickness as a gate insulating film 5 is formed by a thermal oxidation method. Further deposited on the entire gate insulating film 5 is a polycrystalline silicon film, a polycrystalline silicon film, a metallic film or a silicide film as the material of a gate electrode 6, on which an insulating film 7 such as a silicon oxide film of about 100-300 nm thickness is deposited by the CVD method and then the gate electrode 6 and insulating film 7 formed thereon are simultaneously subjected to a patterning by a photolithographic process and an anisotropic etching process.

After the patterned substrate is subjected to a post-oxidation process, e.g., at 850° C. As ions are injected into the silicon substrate 1 with use of the gate electrode 6 as a mask to form source and drain regions 4a and 4b of an n-type diffusion layer, whereby a MOSFET as a switching transistor is formed. The depth of the diffusion layer is set to be, for example, about 150 nm. Then an insulating film as a silicon nitride layer of about 100 nm or less is deposited on the entire insulating film 7 by the CVD method and subjected to a reactive ion etching process to have a side wall insulating film 8 left on sides of the gate electrode 6 in a self alignment manner.

Figure 21A:
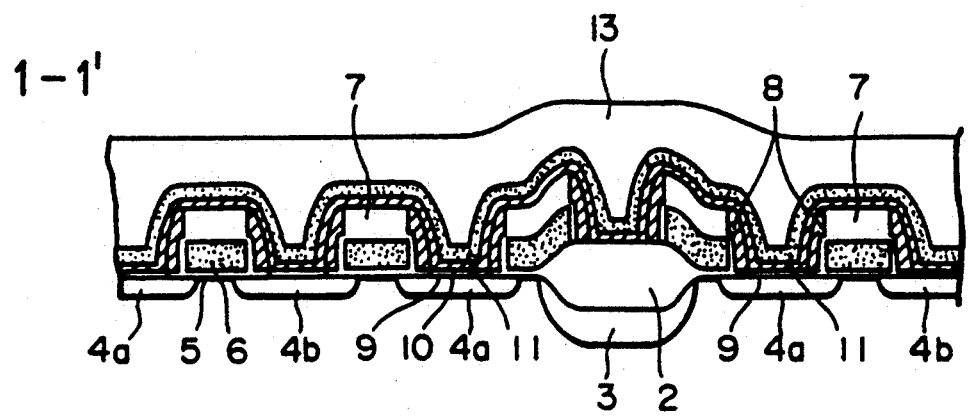
Figure 21B:
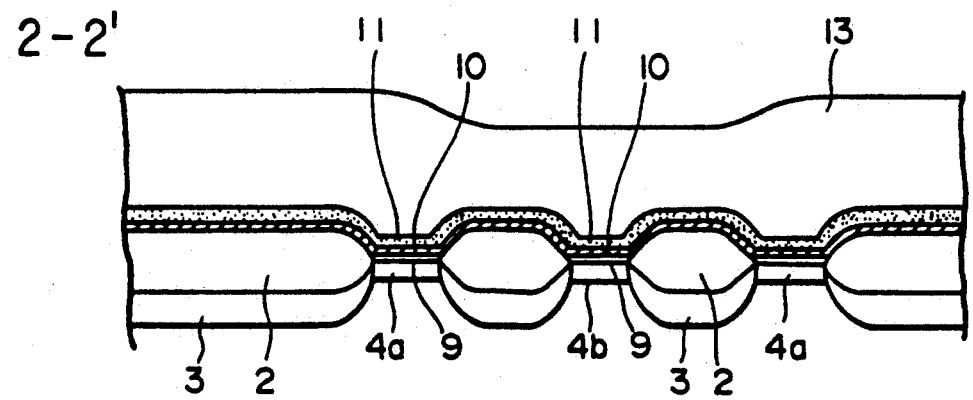

As shown in FIGS. 21(a) and 21(b), subsequently, a silicon oxide film 9 of about 200 Å thickness, a silicon nitride film 10 of 20 nm thickness and a polycrystalline silicon film 11 of 50 nm thickness are formed on the thus obtained substrate by the thermal oxidation method and then a silicon oxide film 13 made of phosphorus glass is formed. At this time, the inter-layer insulating film 13 may be flattened by means of a heat treatment or may be as it is without any treatment.

Figure 22A:
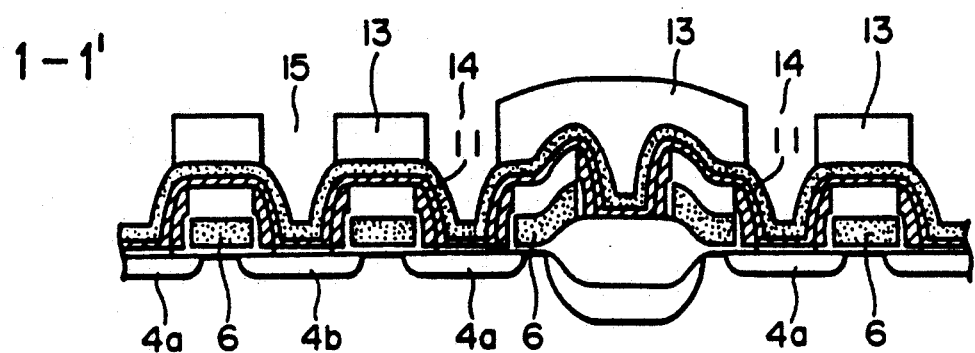
Figure 22B:
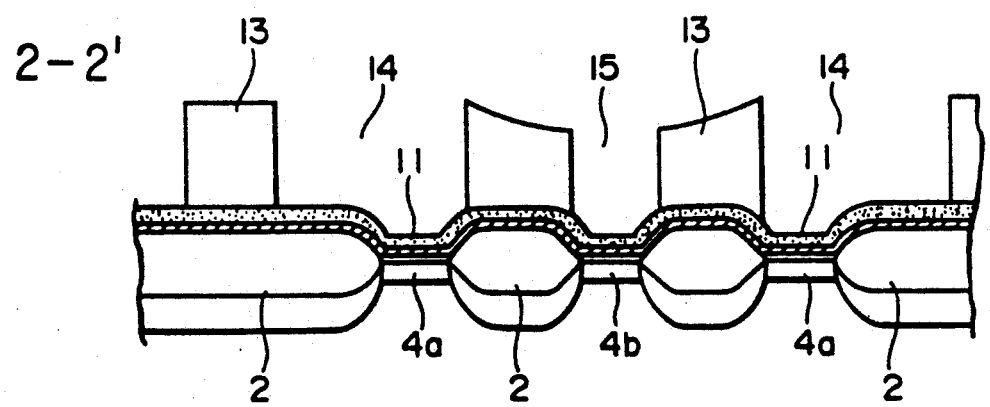

As shown in FIGS. 22(a) and 22(b), the silicon oxide film 13 is then subjected to a patterning by means of the photolithographic process and the reactive ion etching process to thereby form a first storage node contact hole 14 and a first bit line contact hole 15 at the same time. At this time, the first storage node contact hole 14 is made up to a position above the element-isolation region as shown in FIG. 22(b). Also the etching conditions are set so that the etching rate of the polycrystalline silicon film 11 is sufficiently smaller than the etching rate of the inter-layer insulating film 13, so that the polycrystalline silicon film 11 acts as an etching stopper. Thus, even in the case where a distance between the storage node contact hole 14 and gate electrode 6 or a distance between the bit line contact hole 15 and gate electrode 6 is very small, a possibility of a short-circuiting between the storage node electrode and gate electrode 6 or between the bit line and gate electrode 6 can be eliminated.

Figure 23A:
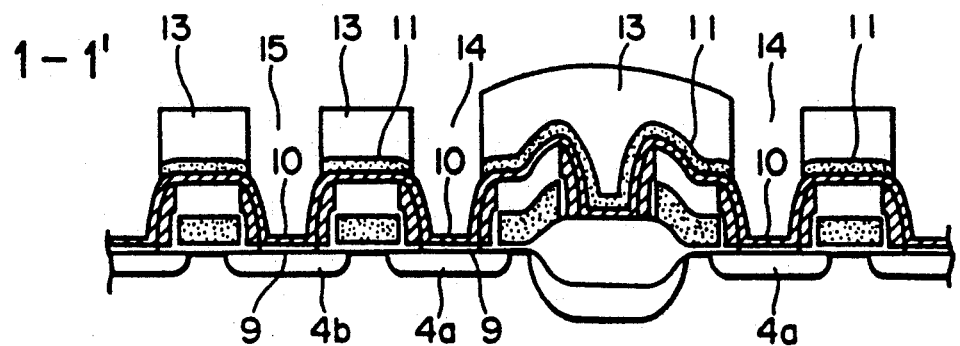
Figure 23B:
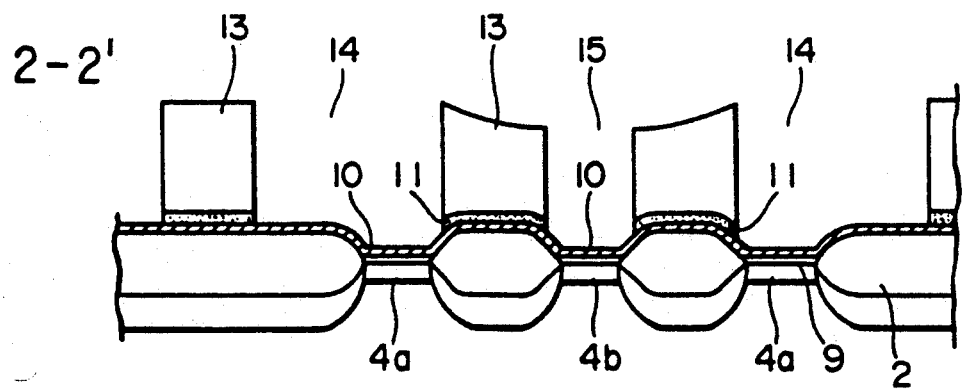

Next, as shown in FIGS. 23(a) and 23(b), that areas of the polycrystalline silicon film 11 corresponding to the first storage node contact hole 14 and first bit line contact hole 15 are removed by the isotropic etching or chemical dry etching (CDE) process to expose the underlying silicon nitride layer 10.

Figure 24A:
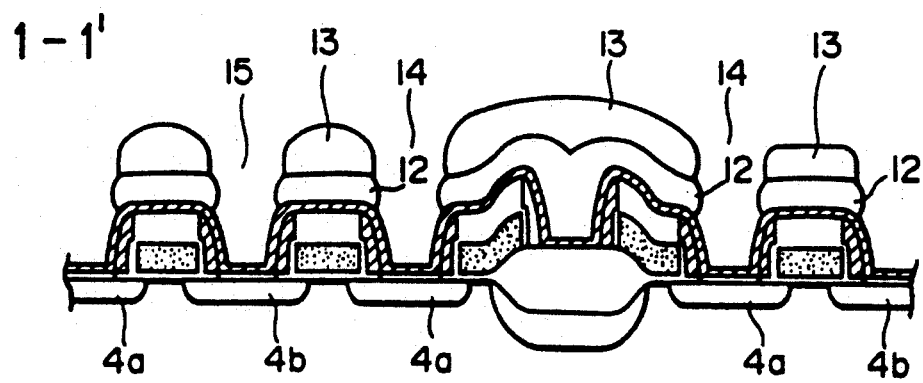
Figure 24B:
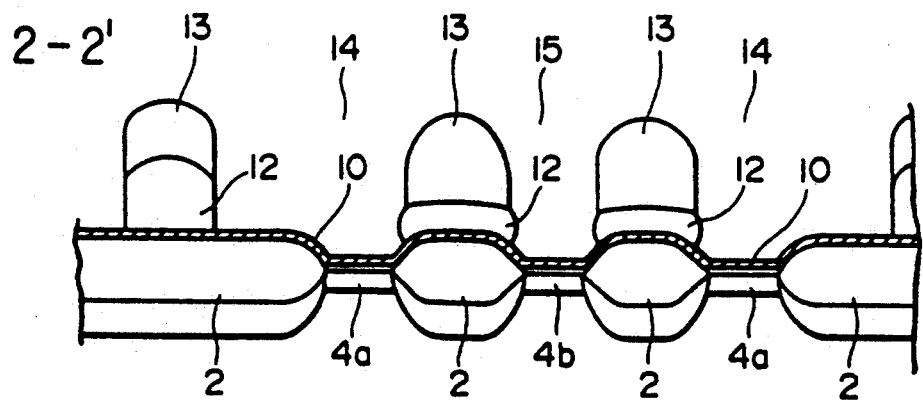

As shown in FIGS. 24(a) and 24(b), the polycrystalline silicon film 11 exposed at least at the side walls of the storage node and bit line contact holes are then oxidized to form a silicon oxide film 12. In this connection, the entire polycrystalline silicon film 11 has been oxidized to form the silicon oxide film 12, but only that areas of the polycrystalline silicon film exposed at the side walls of the storage node and bit line contact holes may be oxidized to form the silicon oxide film 12. In this way, when at least parts of the remaining polycrystalline silicon film exposed at the side walls of the contact holes are oxidized, such a short-circuiting problem between the storage node electrodes through the polycrystalline silicon film 11 or between the storage node electrode and bit line can be prevented. Further, in this case, when the inter-layer insulating film 13 is made of phosphorus glass or the like, the flattening of the inter-layer insulating film can be carried out at the same time.

Figure 25A:
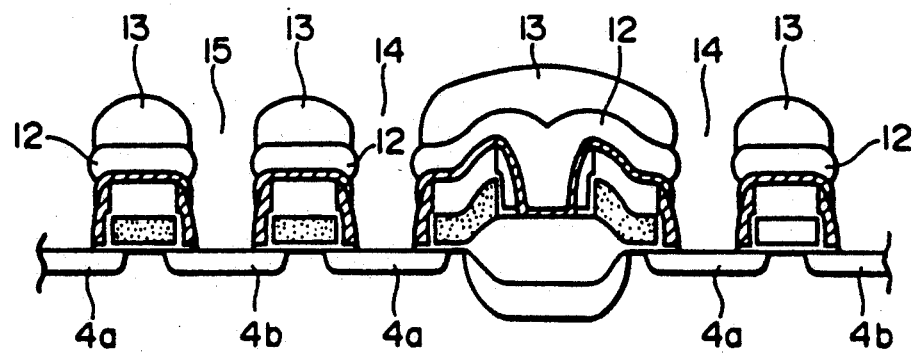
Figure 25B:
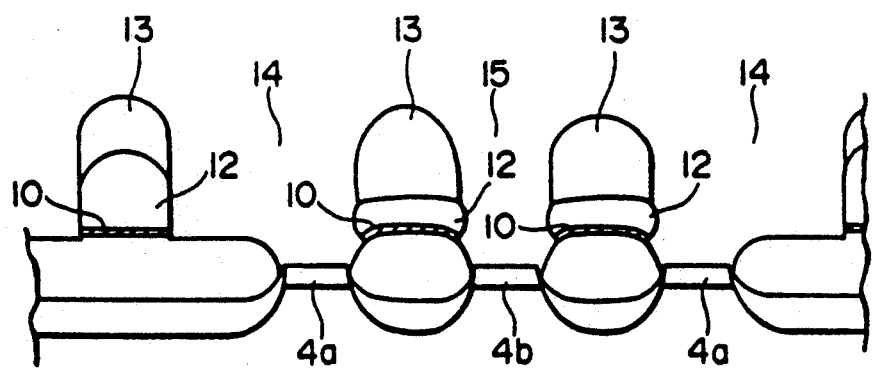

Next, as shown in FIGS. 25(a) and 25(b), that areas of the silicon nitride layer 10 and thin silicon oxide film 9 thereunder corresponding to the first storage node contact holes 14 and first bit line contact holes 15 are removed by the anisotropic etching process to expose the surface of the silicon substrate. At this time, since the side walls and upper parts of the gate electrodes are covered with the thick insulating film, the etching will not reach the gate electrodes.

Figure 26A:
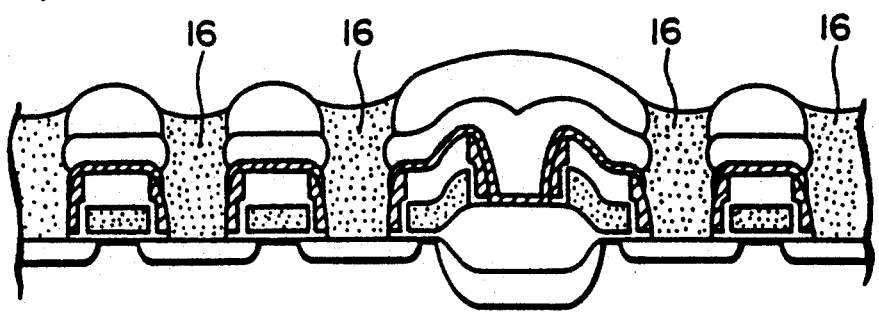
Figure 26B:
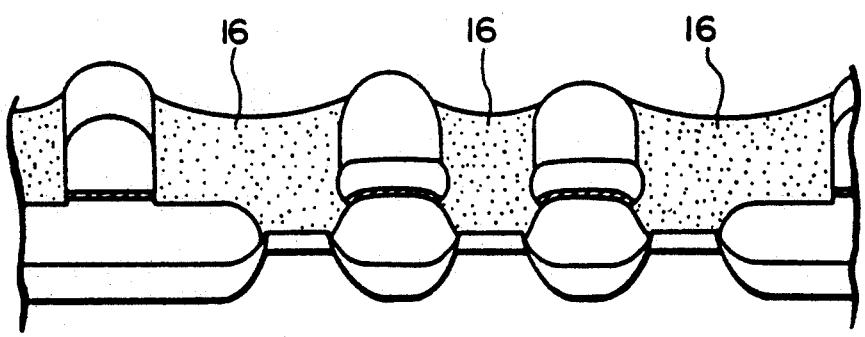

As shown in FIGS. 26(a) and 26(b), for example, a heavily-doped polycrystalline silicon film 16 is deposited on the entire substrate so that the thickness of the polycrystalline silicon film 16 is ½ or more of shorter one of sides of the contact cavities 14 and 15 (for the purpose of completely embedding the contact cavities), after which the entire substrate is subjected to an etching until the surface of the inter-layer insulating film 13 is exposed, whereby the polycrystalline silicon film 16 is left only in the contact cavities. In this case, the doping of the polycrystalline silicon film may be carried out in such a manner that a thin polycrystalline silicon film of about 500 Å is deposed. As ions as an example are implanted, a polycrystalline silicon film is again deposited so as to have a thickness of ½ or more of the shorter side of a contact cavity. As ions are implanted, a silicon oxide film is deposited by the CVD method, and then subjected to a heat treatment.

Although the polycrystalline silicon film has been embedded all over and then again subjected to the etching in the foregoing steps, the polycrystalline or monocrystalline silicon film may be selectively grown only in the contact cavities as an example.

Figure 27A:
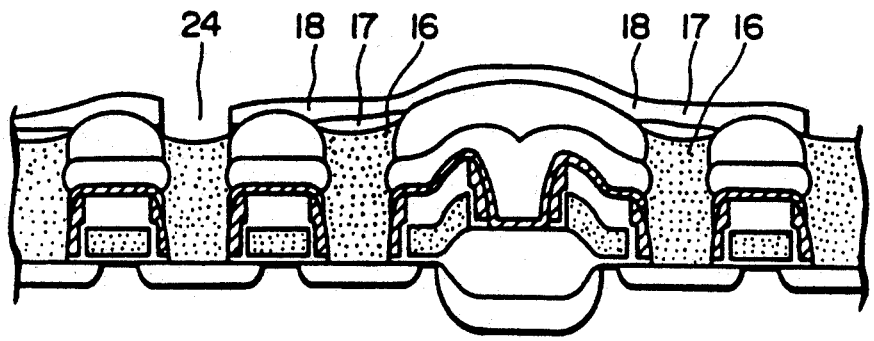
Figure 27B:
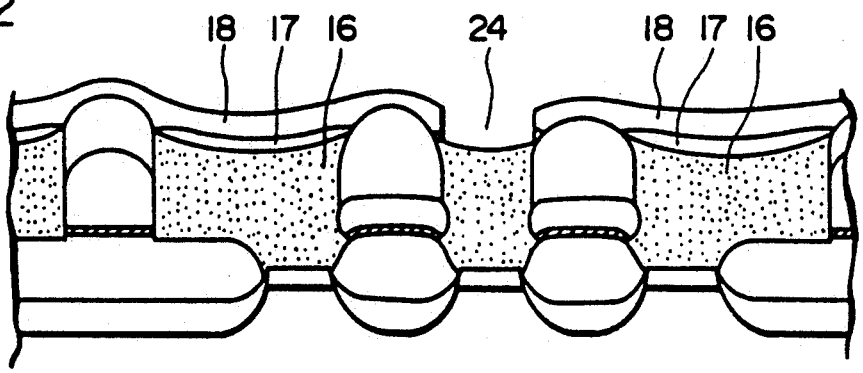

Thereafter, as shown in FIGS. 27(a) and 27(b), a silicon oxide film 17 of about 200 Å thickness is formed on the surface of the substrate, e.g., by the thermal oxidation method, a silicon oxide film 18 of 500 Å thickness is deposited thereon by the CVD method, and then the silicon oxide films 17 and 18 are subjected to the photolithographic method and reactive ion etching so that silicon oxide films 17 and 18 are selectively removed and the second bit line contact holes 24 are formed.

Figure 28A:
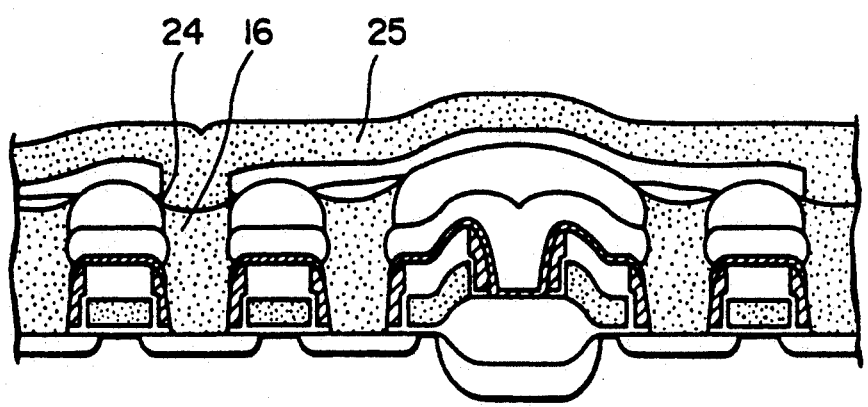
Figure 28B:
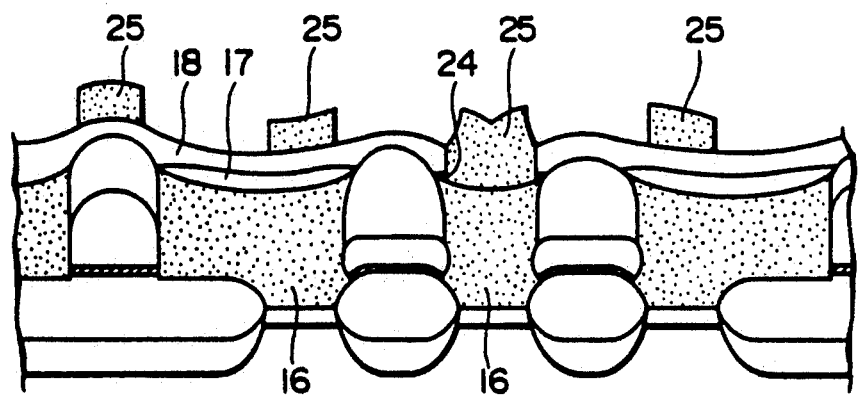

As shown in FIGS. 28(a) and 28(b), a polycrystalline silicon film is deposited on the entire surface of the substrate and subjected to a doping process and then to the photolithographic method and reactive ion etching for its patterning to thereby form a bit line 25. The bit line 25 has been formed as a single-layer polycrystalline silicon film in the illustrated example, but the bit line may have two-layer structure comprising a polycrystalline silicon layer and a silicide layer mutually laminated.

Figure 29A:
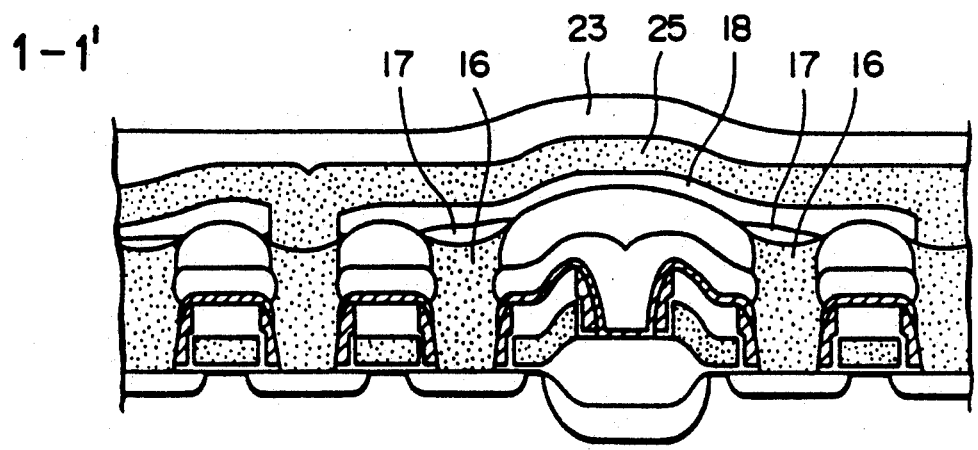
Figure 29B:
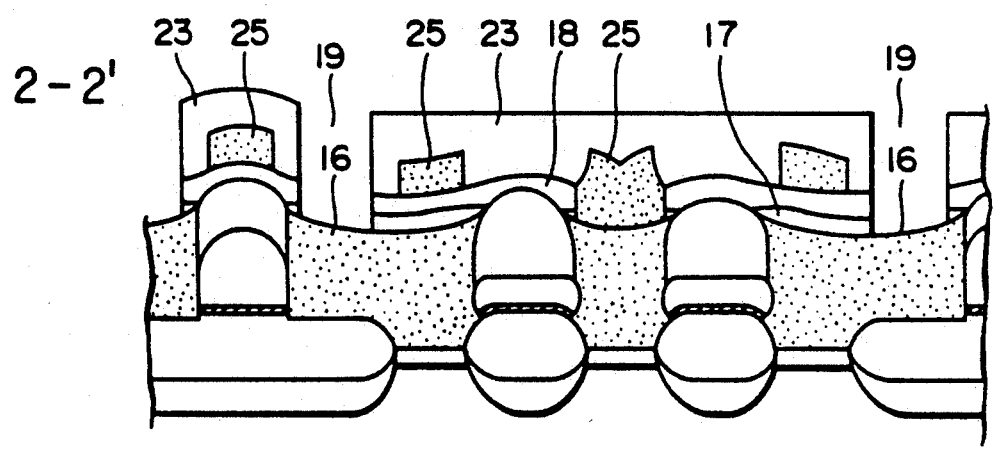
Figure 30A:
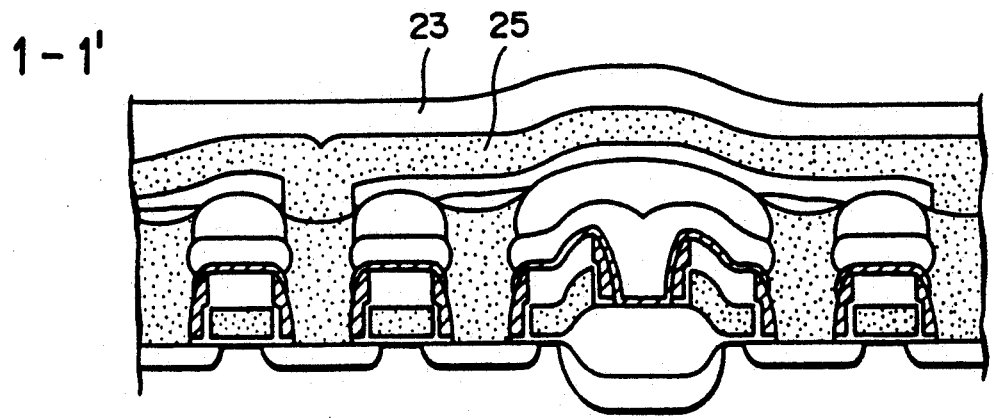
Figure 30B:
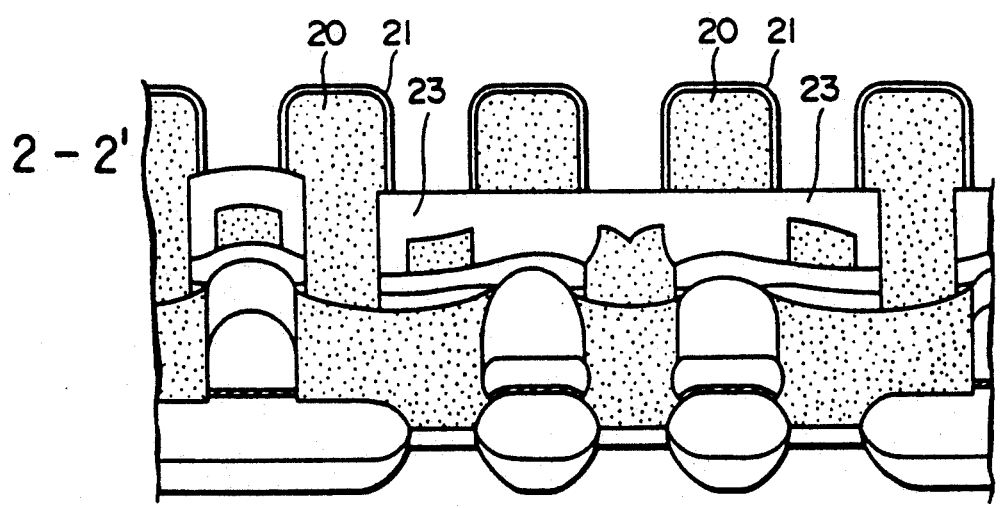

Then, as shown in FIGS. 29(a) and 29(b), an inter-layer insulating film 23 of a silicon oxide film is deposited and subjected to a flattening process on its surface by a heat treatment. Next, the inter-layer insulating film 23 is subjected to the photolithographic process and reactive ion etching process to expose only that surface areas of the polycrystalline silicon film 16 corresponding to the storage node contact holes, the silicon oxide films 17 and 18 are selectively removed to form second storage node contact holes 19. At this stage, since the embedded layer 16 is formed as expanded to the element isolation region 2, the storage node contact holes can be formed above the element isolation region 2.

After the storage node contact holes have been made in this manner, a polycrystalline silicon film is deposited on the entire surface of the substrate, subjected to a doping and then to the photolithographic method and reactive ion etching for its patterning, whereby a storage node electrode 20 is formed. Then a silicon nitride film of a thickness of 10 nm is deposited on the substrate by the CVD method, subjected to an oxidation in a stream atmosphere at about 900° C. for about 30 minutes to form a silicon oxide film, thereby forming a two-layer capacitor insulating film 21 of the silicon nitride layer and silicon oxide layer (refer to FIGS. 30(a) and 30(b)).

A polycrystalline silicon film is further deposited on the capacitor insulating film 21, and subjected to a doping to thereby form a plate electrode 22. On the plate electrode 22, an inter-layer insulating film 26 of a silicon oxide film is deposited and heat-treated to be flatten thereon, whereby such a memory cell as shown in FIGS. 19(a) to 19(c) is completed.

With such a structure as mentioned above, since the capacitor is formed in the layers above the bit lines, it becomes easy to process the storage node electrode, the area of the capacitor can be made large, it is unnecessary to subject the plate electrodes to a patterning within the cell array, whereby the reliability can be enhanced.

Further, when the storage node electrode is constructed to have a plurality of laminated layers, the capacitance of the capacitor can be further increased.

Since the conductive layer embedded in the storage node contact holes is expanded to the element isolation region, the area of the planar part of the capacitor can be made large.

Furthermore, when the second contact hole for contact with the conductive layer is made in the element isolation region, there can be realized a DRAM which has a capacitor of a large capacitive value while not increasing the element occupation area. That is, since the embedded conductive layer playing a role in a leading pad is formed by embedding the conductive layer in the first contact holes previously formed in a self alignment manner with the gate electrode, the gate electrode can be formed in a self alignment manner, it can become unnecessary to take an alignment allowance, and the pad occupation area can be made small when compared with that of the prior art pad which has been formed by subjecting a polycrystalline silicon layer or the like to a patterning. Thus even when a misalignment takes place between the pad and the second storage node contact hole or second bit line contact hole, there is no danger that the pad is short-circuited to the gate electrode and thus it becomes unnecessary to form a large pad to provide an allowance.

Embodiment 7

The polycrystalline silicon film has been used as the etching stopper of the inter-layer insulating film at the time of making the first contact holes 14 and 15 and after the formation of the contact holes, the polycrystalline silicon film has been oxidized in the foregoing embodiment 6. However, in the case where the element area is sufficiently large, the first contact hole may be made without using the above special method.

The present embodiment 7 is directed to an exemplary simplified step of forming the first contact hole without using the etching stopper.

Figure 31A:
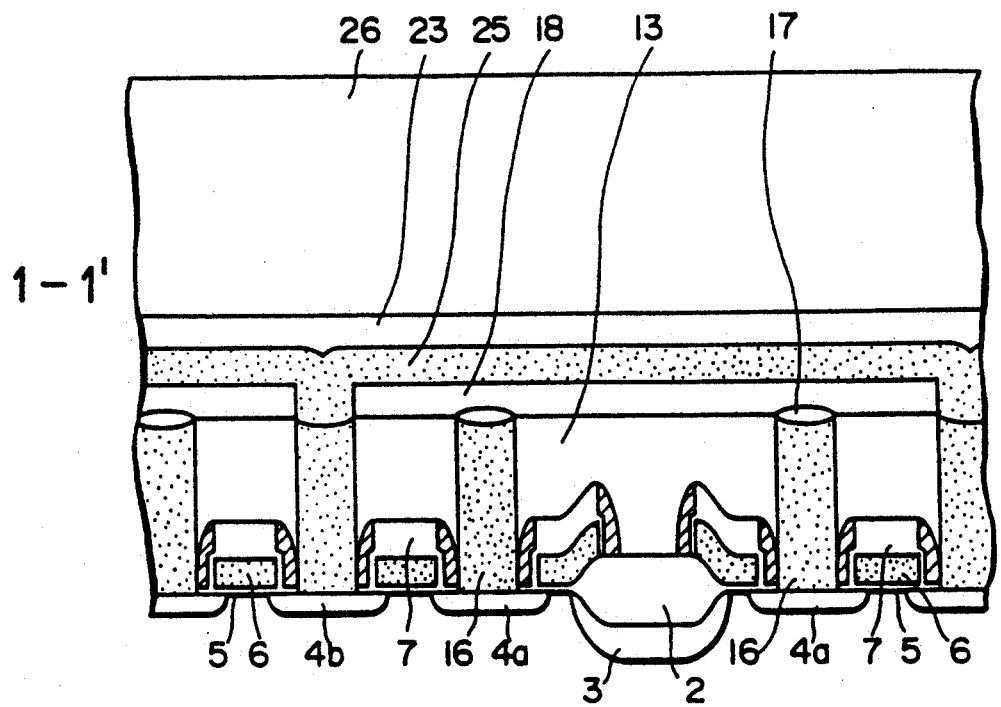
FIGS. 31(a) and 31(b) show a DRAM in accordance with a seventh embodiment of the present invention.
Figure 31B:
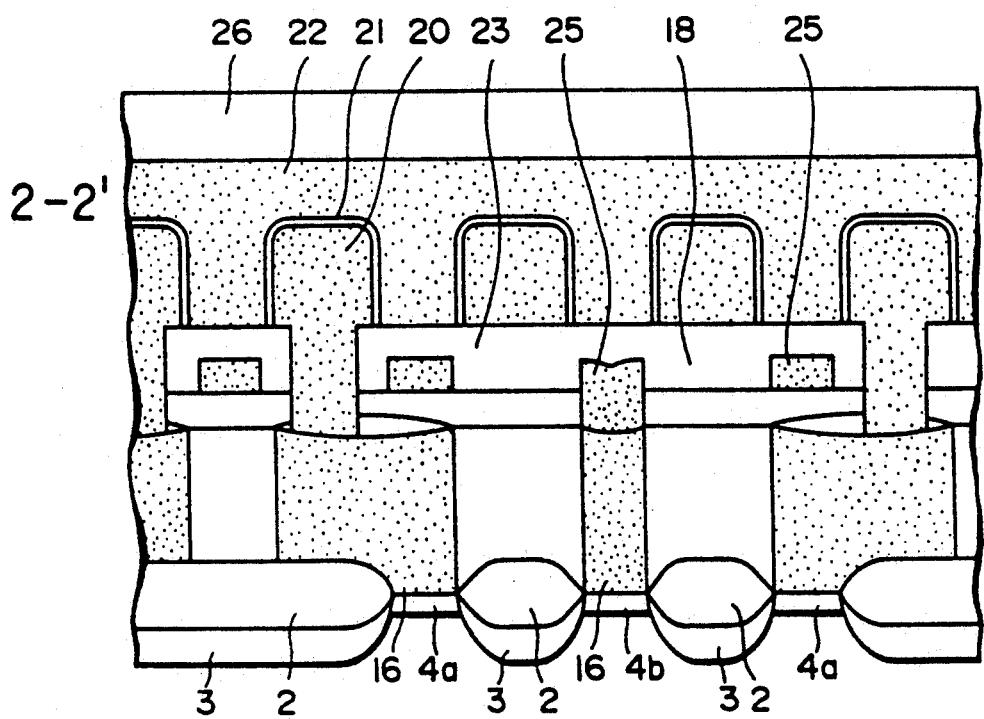

FIGS. 31(a) and 31(b) show cross-sectional views of a DRAM of the laminated memory cell structure in accordance with a seventh embodiment of the present invention, corresponding to 2 adjacent bits in the bit line direction of the DRAM and taken along lines 1—1' and 2—2' (in FIG. 19(a)), respectively.

The structure of the DRAM is substantially the same as that of the DRAM of the embodiment shown in FIG. 19.

Explanation will next be made as to how to fabricate the DRAM by referring to the associated drawings.

FIGS. 32 to 38 show steps of fabricating the DRAM, in which (a) and (b) in each drawing show cross-sectional views of the DRAM corresponding to 2 adjacent bits in a bit line direction of the DRAM taken along lines 1—1' and 2—2' in FIG. 19(a), respectively.

Figure 32A:
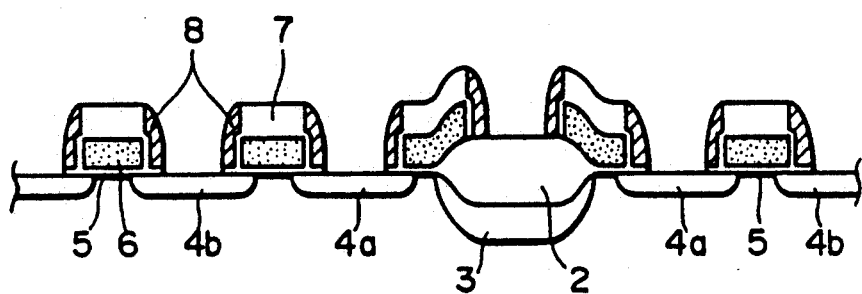
FIGS. 32(a), 32(b), 33(a), 33(b), 34(a), 34(b), 35, 36, 37(a), 37(b), 38(a) and 38(b) show fabricating steps in a method of fabricating the DRAM of the seventh embodiment.
Figure 32B:
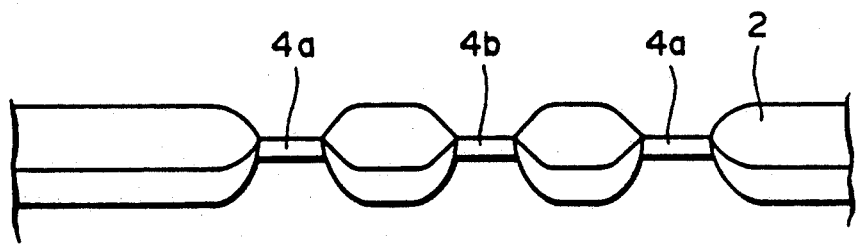

First, as in the foregoing embodiment 6, as shown in FIGS. 32(a) and 32(b), on a p-type silicon substrate 1 having a resistivity of about 5 Ωcm, an element-isolation insulating film 2 and a p-type diffusion layer 3 for punch-through stop are formed and then a gate insulating film 5, a gate electrode, and source and drain regions 4a and 4b of n-type diffusion layer are formed thereon to form a MOSFET as a switching transistor. Further, a side wall insulating film 8 is left at the side surface of the gate electrode 6.

Figure 33A:
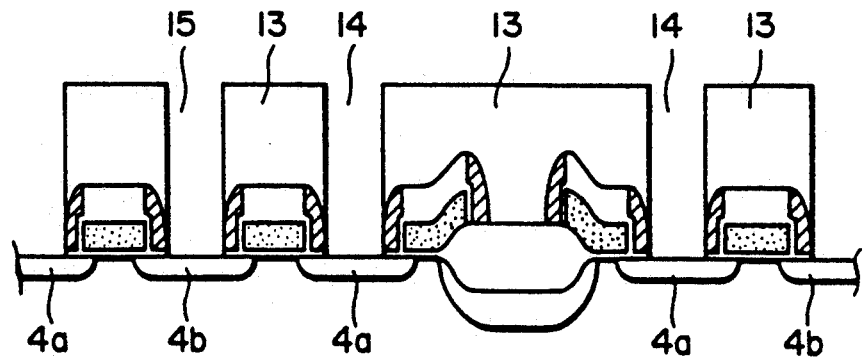
Figure 33B:
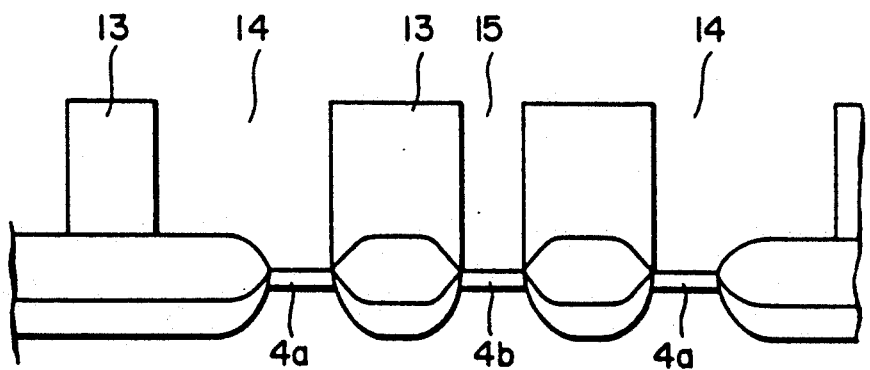

Thereafter, as shown in FIGS. 33(a) and 33(b), an inter-layer insulating film 13 made of phosphorus glass or the like is deposited. In this case, the inter-layer insulating film 13 may be flattened by means of the thermal treatment or be as it is without providing any treatment thereto. Then the inter-layer insulating film 13 is subjected to a patterning by a photolithographic process and a reactive ion etching process to form first storage node contact holes 14 and first bit line contact holes 15 at the same time. In this case, the first storage node contact hole 14 is made as extended up to a level higher than the element isolation region 2 as shown in FIG. 33(b). In the present embodiment, no stopper layer is provided though the stopper layer of polycrystalline silicon has been provided in the foregoing embodiment 6. For this reason, it is necessary to set the etching time for the formation of the first contact holes at a proper value to prevent overetching of the insulating film of the element isolation region.

Figure 34A:
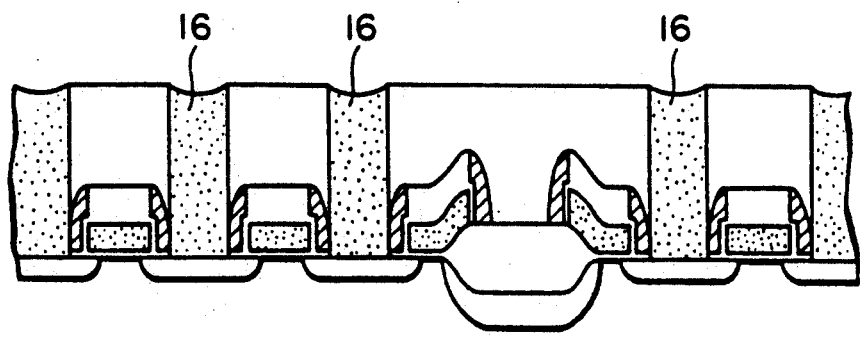
Figure 34B:
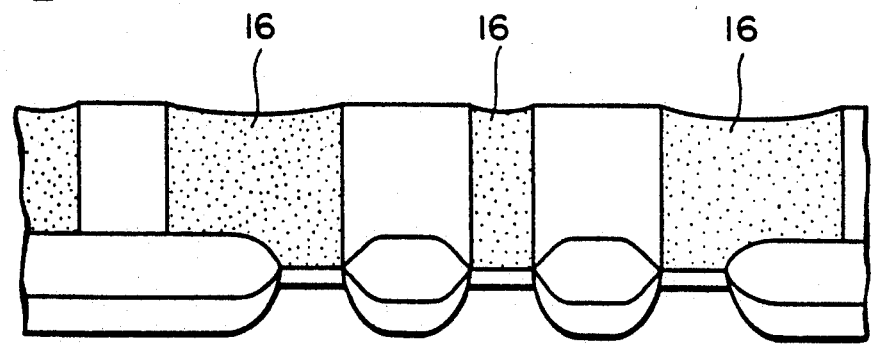

Then, like the embodiment 6, as shown in FIGS. 34(a) and 34(b), for example, a heavily-doped polycrystalline silicon film 16 is deposited on the entire substrate so that the thickness of the polycrystalline silicon film 16 is ½ or more of shorter one of sides of the contact cavities 14 and 15 (for the purpose of completely embedding the contact cavities), after which the entire substrate is subjected to an etching until the surface of the inter-layer insulating film 13 is exposed, whereby the polycrystalline silicon film 16 is left only in the contact cavities. Even in this case, the doping of the polycrystalline silicon film may be carried out in such a manner that a thin polycrystalline silicon film of about 500 Å is deposed. As ions as an example are implanted, a polycrystalline silicon film is again deposited so as to have a thickness of ½ or more of the shorter side of a contact cavity. As ions are implanted, a silicon oxide film is deposited by the CVD method, and then subjected to a heat treatment.

Although the polycrystalline silicon film has been embedded all over and then again subjected to the etching in the foregoing steps, the polycrystalline or monocrystalline silicon film may be selectively grown only in the contact cavities as an example.

Figure 35:
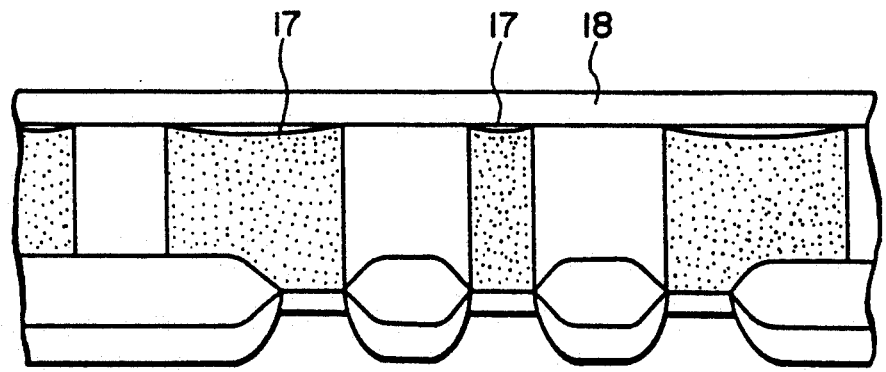

Thereafter, as shown in FIG. 35, a silicon oxide film 17 of about 200 Å thickness is formed on the surface of the substrate, e.g., by the thermal oxidation method, a silicon oxide film 18 of 500 A thickness is deposited thereon by the CVD method, and then the silicon oxide films 17 and 18 are subjected to the photolithographic method and reactive ion etching so that silicon oxide films 17 and 18 are selectively removed and the second bit line contact holes 24 are formed.

Figure 36:
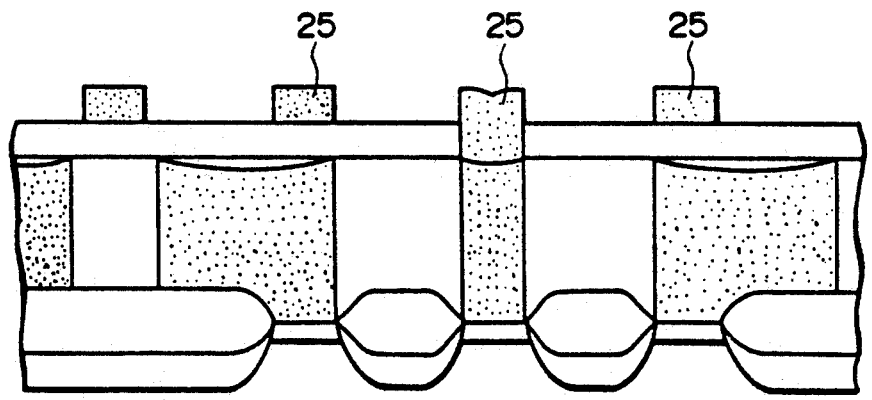

As shown in FIG. 36, a polycrystalline silicon film is deposited on the entire surface of the substrate and subjected to a doping process and then to the photolithographic method and reactive ion etching for its patterning to thereby form a bit line 25.

Figure 37A:
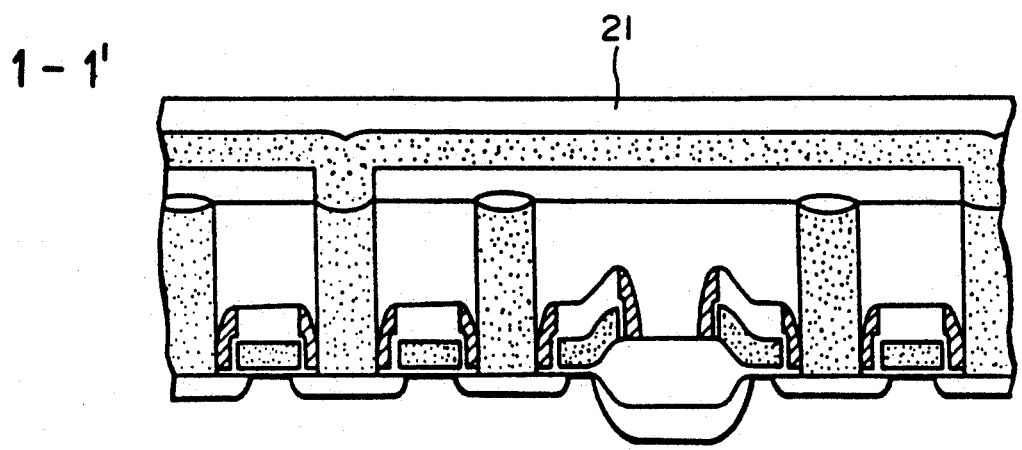
Figure 37B:
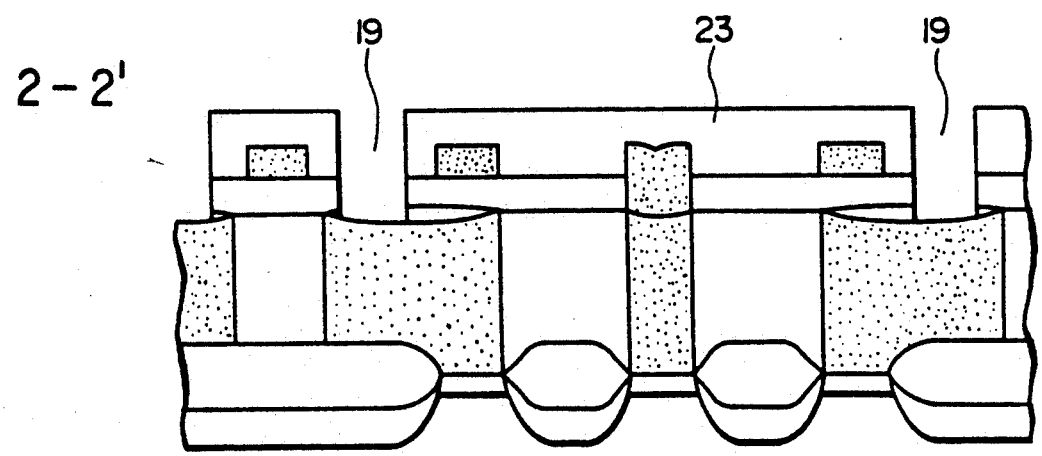

Then, as shown in FIGS. 37(a) and 37(b), an inter-layer insulating film 23 of a silicon oxide film is deposited and subjected to a flattening process on its surface by a heat treatment. Next, the inter-layer insulating film 23 is subjected to the photolithographic process and reactive ion etching process to expose only that surface areas of the polycrystalline silicon film 16 corresponding to the storage node contact holes, the silicon oxide films 17 and 18 are selectively removed to form second storage node contact holes 19. At this stage, since the embedded layer 16 is formed as expanded to the element isolation region 2, the storage node contact holes can be formed above the element isolation region 2.

Figure 38A:
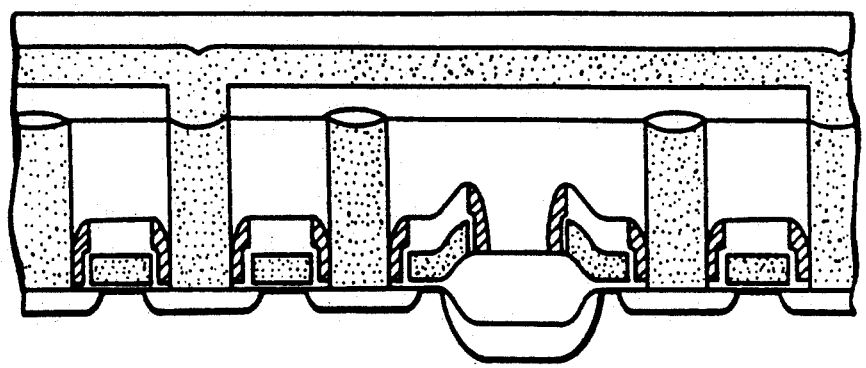
Figure 38B:
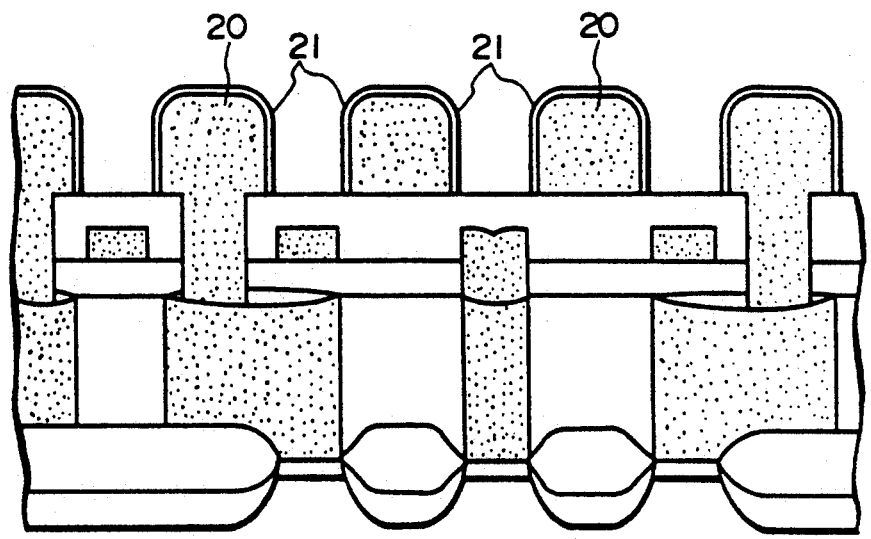

After the storage node contact holes have been made in this manner, as shown in FIGS. 38(a) and 38(b). a polycrystalline silicon film is deposited on the entire surface of the substrate, subjected to a doping and then to the photolithographic method and reactive ion etching for its patterning, whereby a storage node electrode 20 is formed. Then a silicon nitride film of a thickness of 10 nm is deposited on the substrate by the CVD method, subjected to an oxidation in a steam atmosphere at about 900° C. for about 30 minutes to form a silicon oxide film, thereby forming a two-layer capacitor insulating film 21 of the silicon nitride layer and silicon oxide layer.

A polycrystalline silicon film is further deposited on the capacitor insulating film 21, and subjected to a doping to thereby form a plate electrode 22. On the plate electrode 22, an inter-layer insulating film 26 of a silicon oxide film is deposited and heat-treated to be flatten thereon, whereby such a memory cell as shown in FIGS. 31(a) and 31(b) is completed.

According to this fabricating method, since the first contact holes are made without using the etching stopper, the steps of the method can be simplified.

Embodiment 8

Figure 39A:
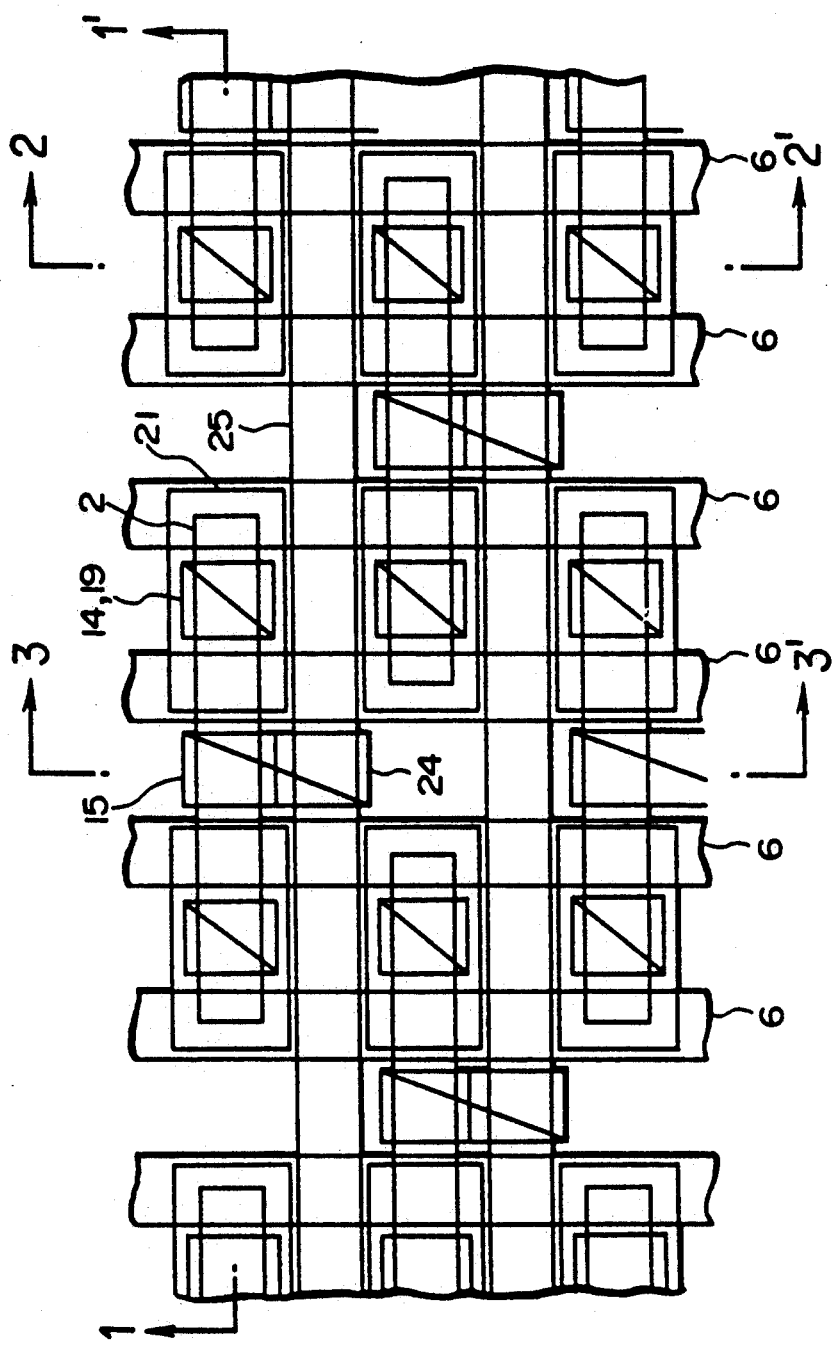
FIGS. 39(a) to 39(d) show a DRAM of the laminated memory cell structure in accordance with an eighth embodiment of the present invention.
Figure 39B:
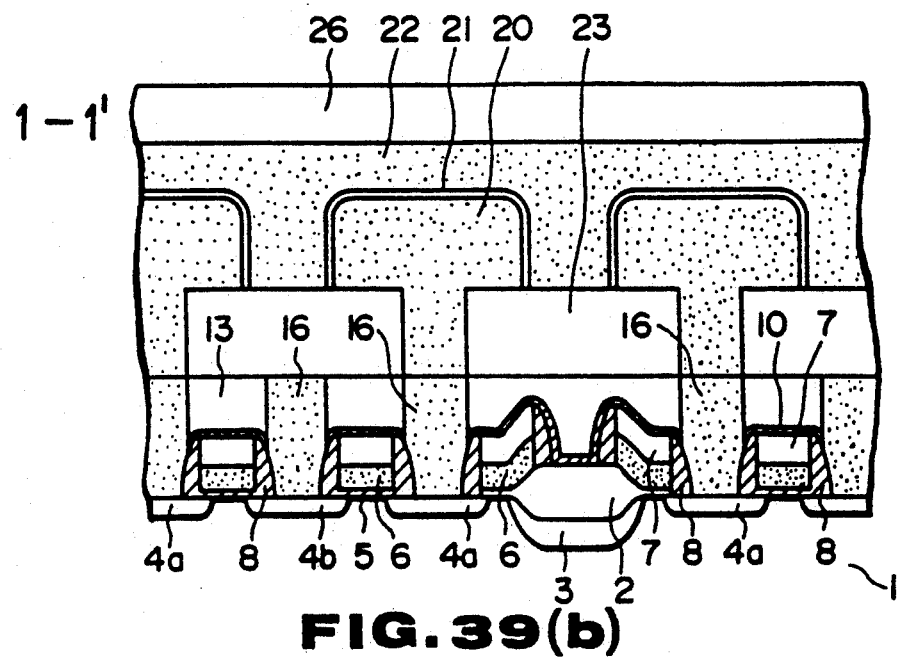
Figure 39C:
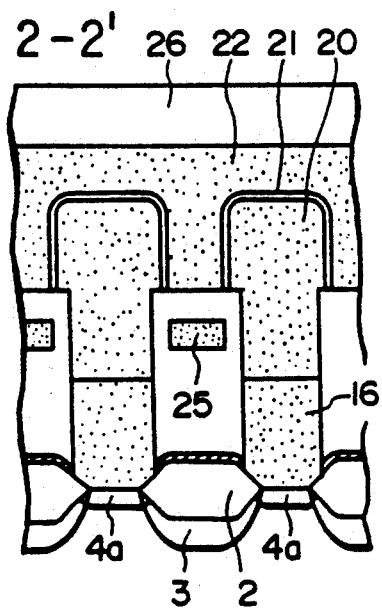
Figure 39D:
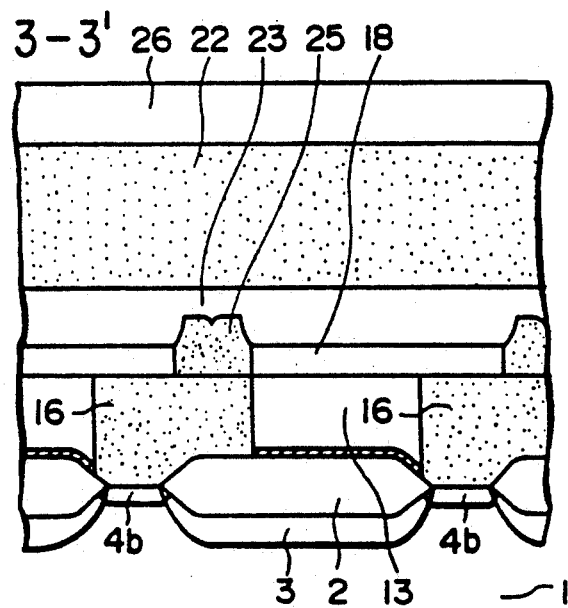

Though the embedded layer 16 of the storage node contact hole part has been formed as extruded upwardly from the element isolation region 2 in the foregoing embodiment 6, the embedded layer of the bit line contact hole part in place of the storage node contact hole may be formed as extruded upwardly from the element isolation region 2 and bit lines may be wired as shifted by every half pitch from the element region as shown in FIGS. 39(a) to 39(d) (FIGS. 39(b) to 38(d) being cross-sectional views taken along lines 1—1, 2—2 and 3—3 in FIG. 39(a)).

Even in this example, it is possible to make the element small.

Embodiment 9

Figure 40A:
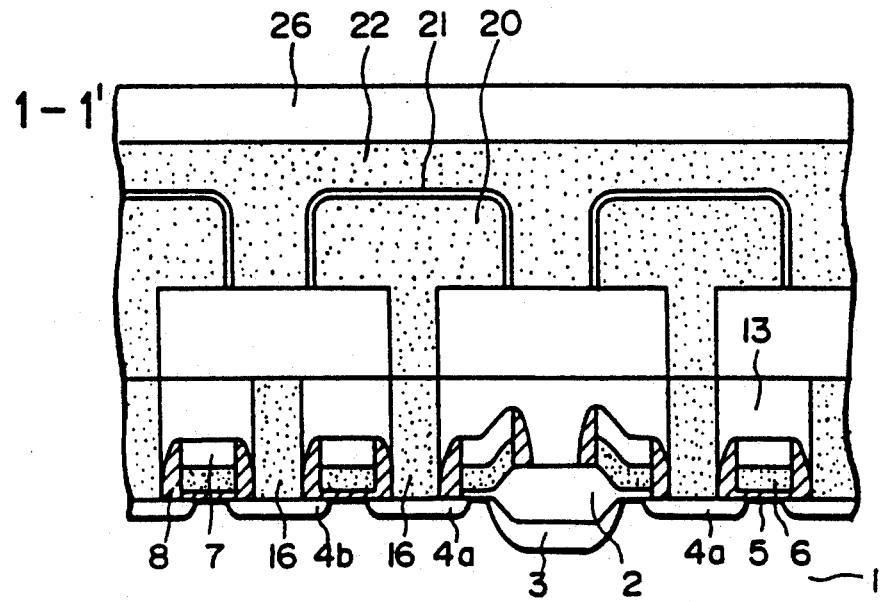
FIGS. 40(a) to 40(c) show a DRAM of the laminated memory cell structure in accordance with a ninth embodiment of the present invention.
Figure 40B:
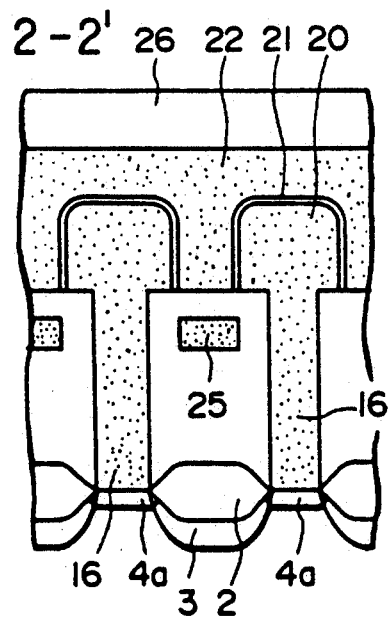
Figure 40C:
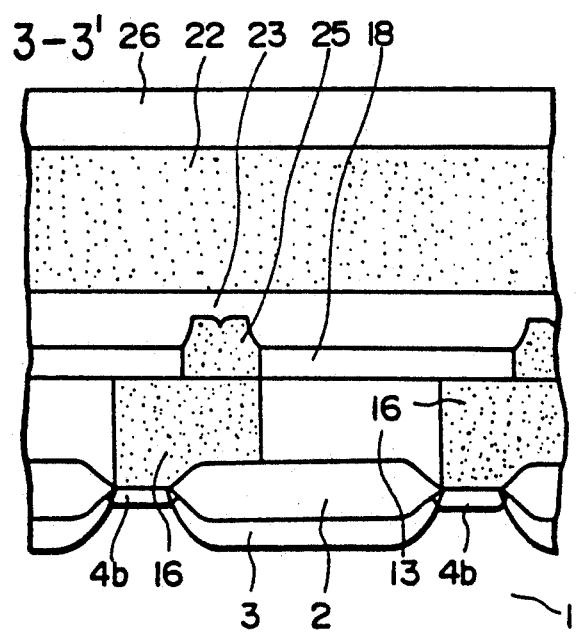

In the structure of the foregoing embodiment 8, the first contact holes may be formed without using the etching stopper. This example is shown in FIGS. 40(a) to 40(c) as an embodiment 9. The structure of the present embodiment is different from that of the embodiment 9 only in that the silicon nitride film 10 covering the periphery of the side wall insulating film 8 is not provided in its completed final memory cell.

Embodiment 10

Figure 41A:
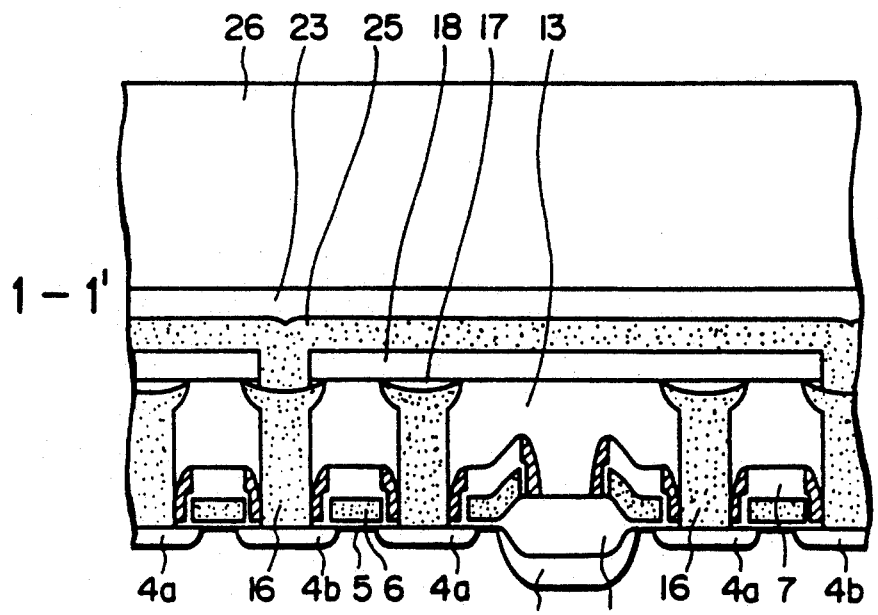
FIGS. 41(a) and 41(b) show a DRAM of the laminated memory cell structure in accordance with a tenth embodiment of the present invention.
Figure 41B:
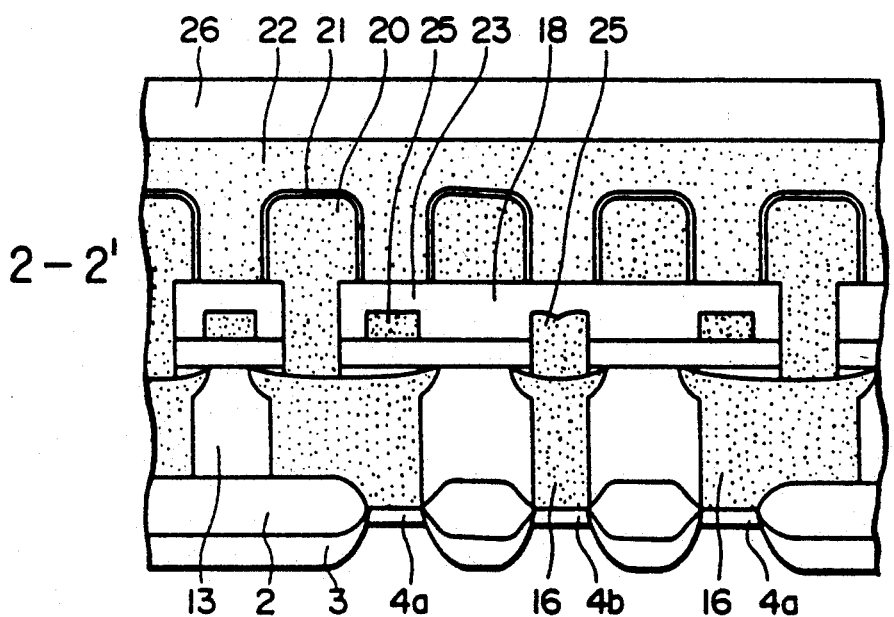

In the structure of the foregoing embodiment 9, as shown in FIGS. 41(a) and 41(b), a resist pattern having the same shape as that of the first storage node and bit line contact holes 14 and 15 may be formed, be first subjected to an isotropic etching process to remove the upper edge of the pattern, subjected to an anisotropic etching process to make the contact holes therein having its expanded upper edge, and then the polycrystalline silicon film 16 may be embedded in the first contact holes 14 and 15.

As a result, since the first storage node and bit line contact holes are made as extended up to a position higher than the gate electrode, there is no possibility that, when there occurs a misalignment between the second storage node and bit line contact holes, this causes the contact part to be short-circuited to the gate electrode. In addition, the contact area can be made large and thus the contact resistance can be reduced.

Embodiment 11

In the structure of the foregoing embodiment 11, the upper edges of the contact holes have been expanded to obtain the expanded upper edge of the polycrystalline silicon film 16 embedded in the first contact holes 14 and 15, this can be also realized by forming the first contact holes 14 and 15 having a vertically-extended rectangular cross section as in the prior art, and by growing the polycrystalline silicon film or monocrystalline silicon film in the contact holes up to a thickness larger than the depth of the contact hole.

Figure 42A:
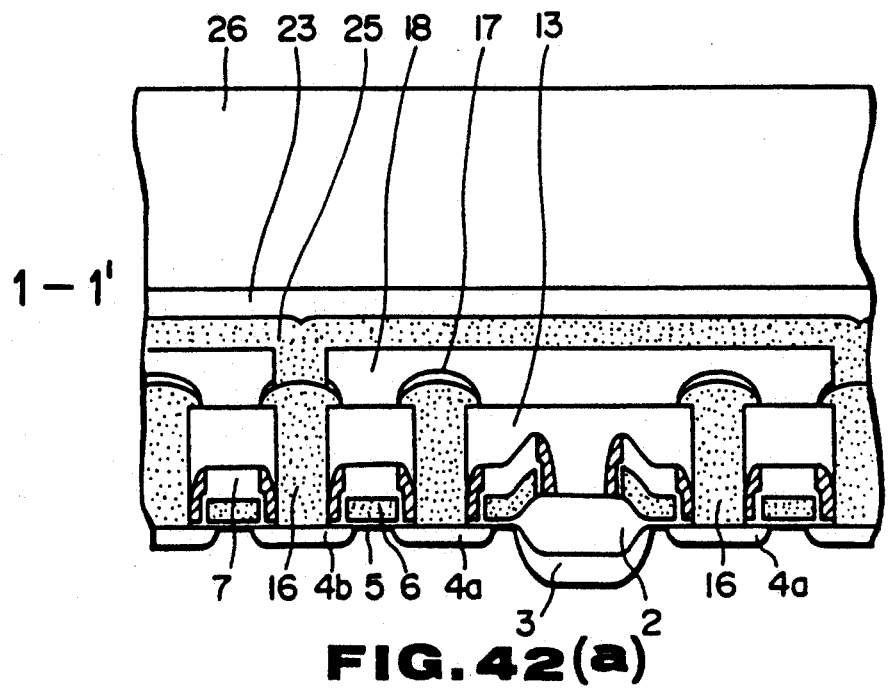
FIGS. 42(a) and 42(b) show a DRAM of the laminated memory cell structure in accordance with an eleventh embodiment of the present invention.
Figure 42B:
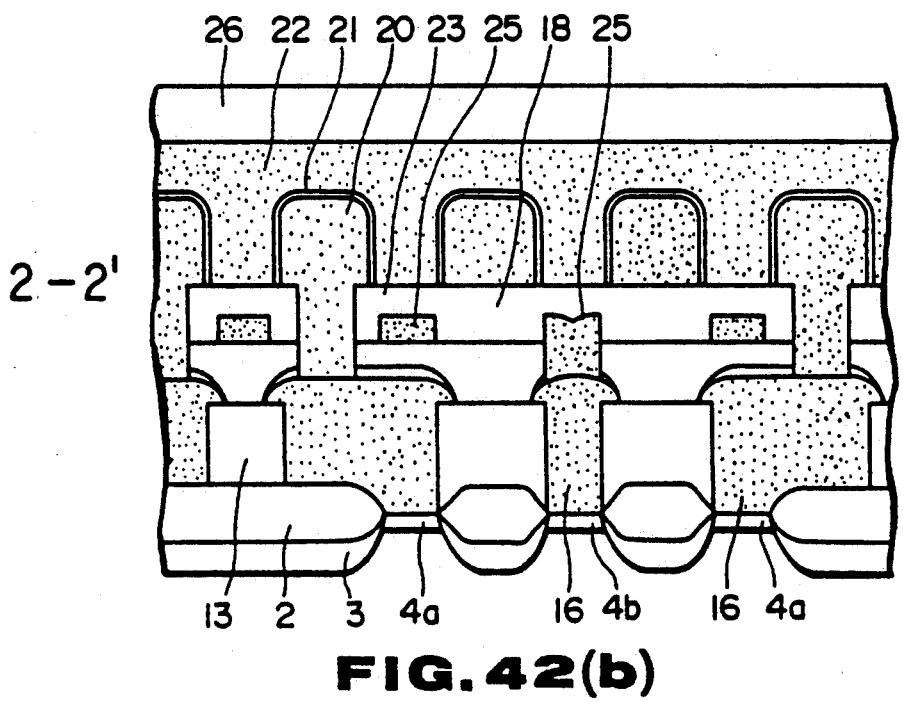

The latter case wherein the polycrystalline silicon film 16 is grown by a selective CVD method and the thickness of the film 16 is made larger than the depth of the contact hole in this way is shown in FIGS. 42(a) and 42(b).

Even in the present embodiment, like the embodiment 10, it is easy to make the second storage node contact holes and second bit line contact holes.

Embodiment 12

Figure 43A:
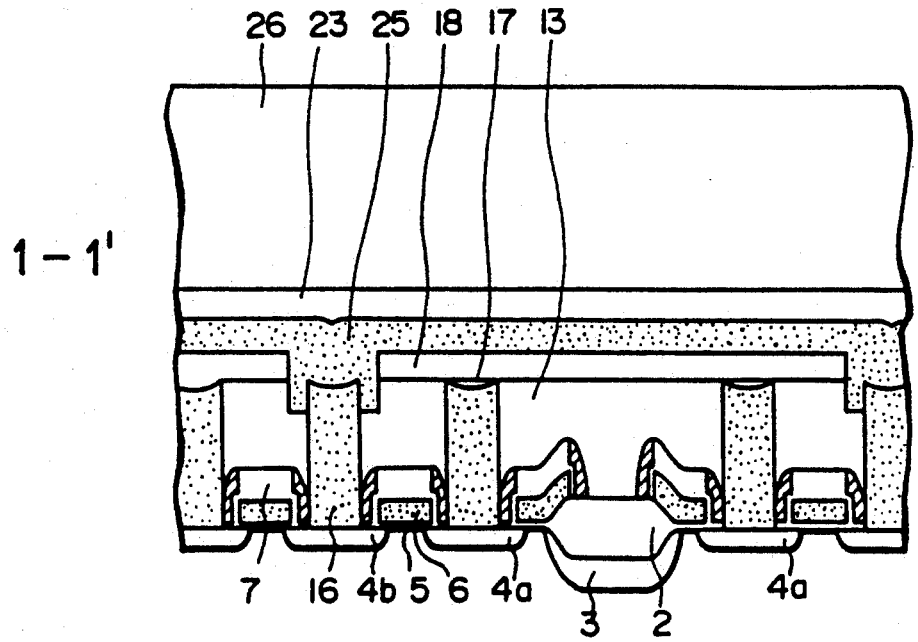
FIGS. 43(a) and 43(b) show a DRAM of the laminated memory cell structure in accordance with a twelfth embodiment of the present invention.
Figure 43B:
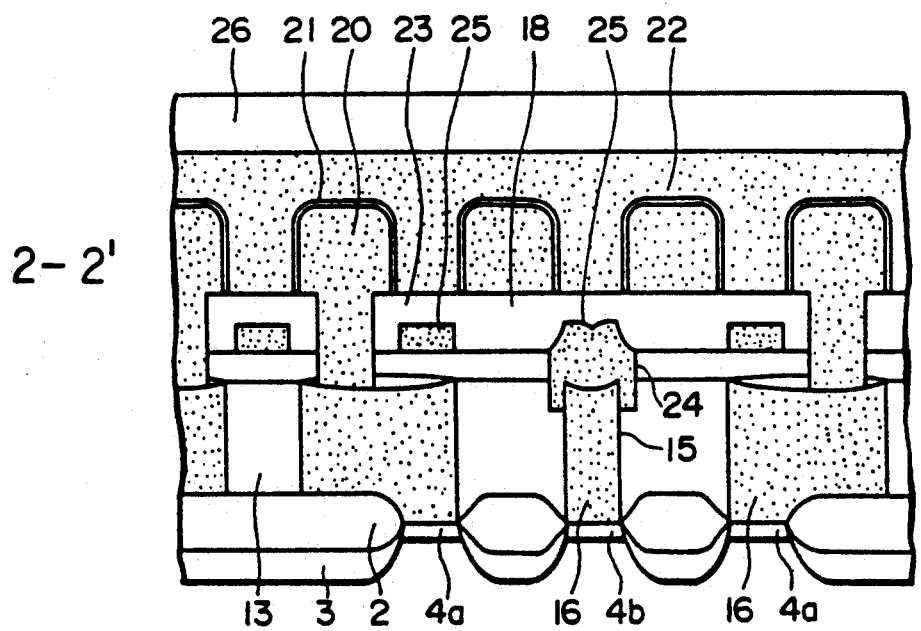
Figure 44A:
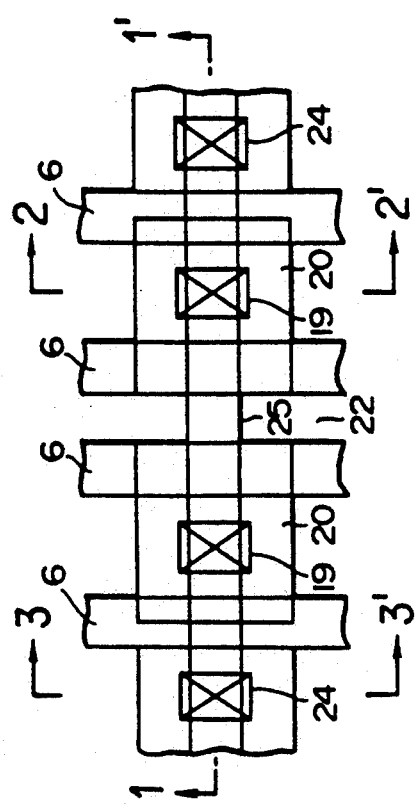
FIGS. 44(a) to 44(d) show a DRAM of the laminated memory cell structure in accordance with a thirteenth embodiment of the present invention.
Figure 44B:
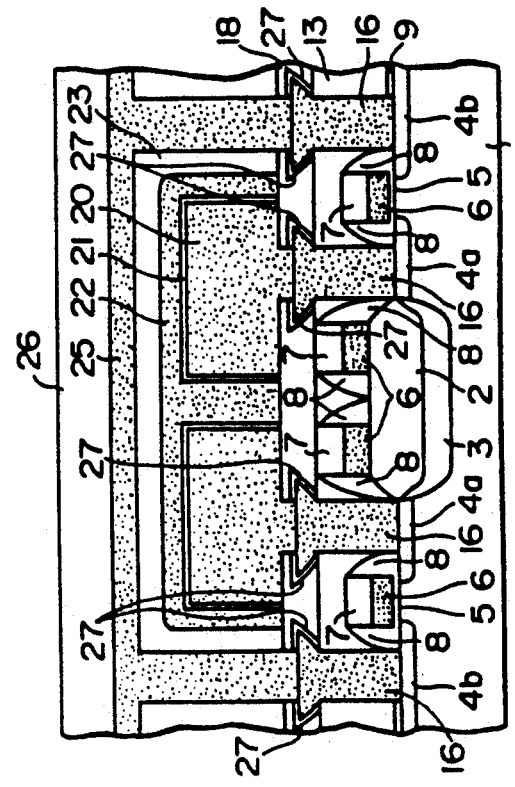
Figure 44C:
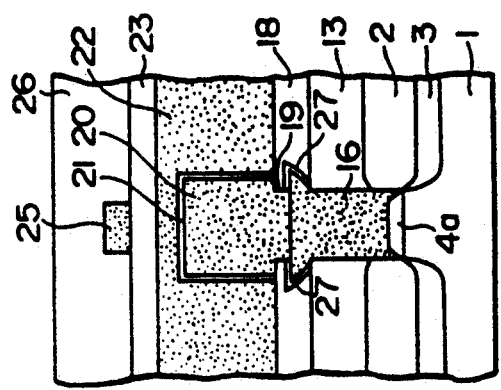
Figure 44D:
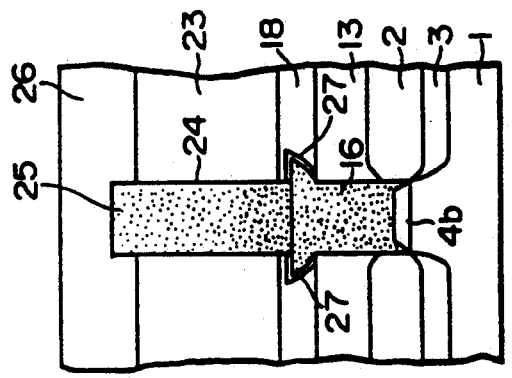

As shown in FIGS. 43(a) and 43(b), the second bit line contact hole 24 may be made larger in size than the first bit line contact hole 15 and the bit line 25 may be contacted even with the side of the polycrystalline silicon film 16 embedded in the first bit line contact hole 15 to thereby make the contact area large and realize the reduction of the contact resistance.

In the present embodiment, the polycrystalline silicon film 16 is embedded in the first bit line contact holes up to a level much higher than the gate electrode, so that, even when overetching occurs at the time of making the second bit line contact holes 24, the occurrence of short-circuiting to the gate electrode can be avoided and thus the reliable memory cell can be realized.

Embodiment 13

A thirteenth embodiment of the present invention will be explained as to a fabricating method of making first storage node and bit line contact holes, embedding the polycrystalline silicon film 16 in the contact holes, subjecting to an etching process to remove the surface of the first inter-layer insulating film 13 damaged through the previous etching and so on and again forming a new insulating film to thereby prevent any short-circuiting between the polycrystalline silicon films 16 and enhance the voltage withstand ability as shown in FIGS. 44(a) to 44(d).

Figure 45C:
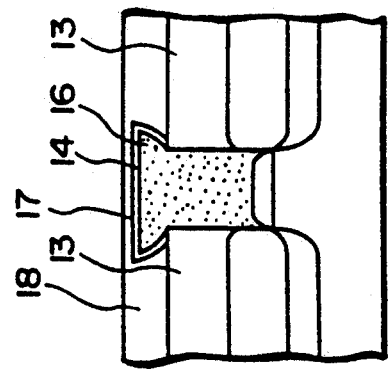
FIGS. 45(a) to 45(c) show diagrams for explaining fabricating steps for the DRAM of the thirteenth embodiment.
Figure 45A:
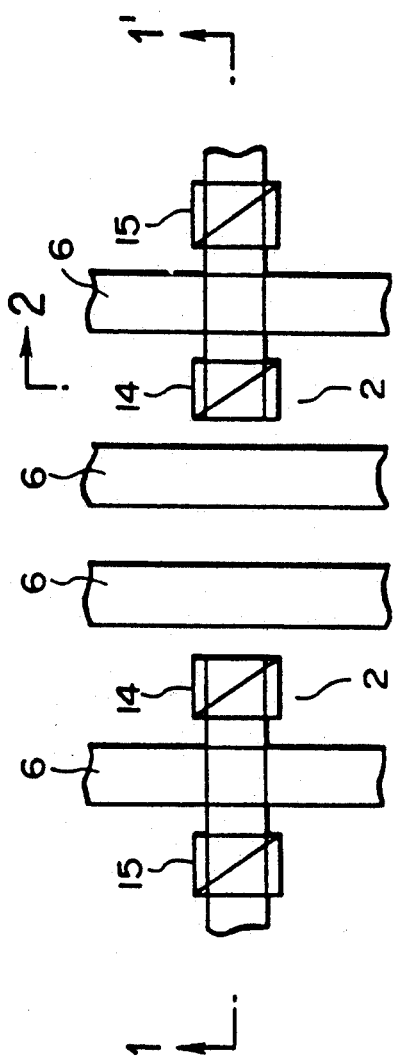
Figure 45B:
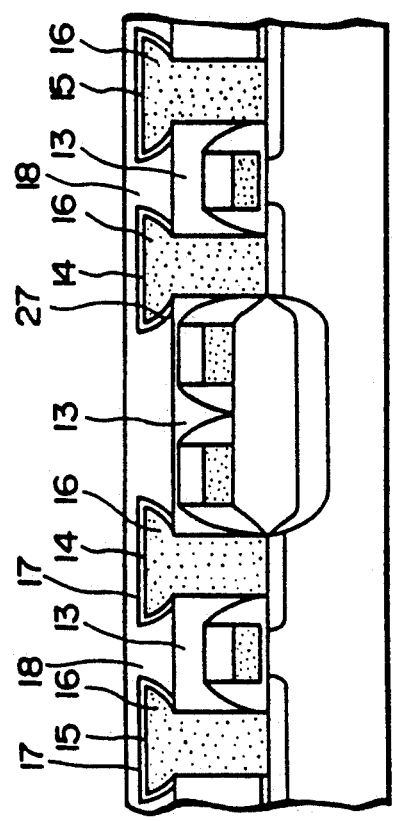

In exactly the same manner as in the embodiment 1, the inter-layer insulating film 13 is subjected to a patterning to form the first storage node contact holes 14 and the first bit line contact holes 15 at the same time. In this case, the patterning is carried out with use of resist and a photolithographic process and further an isotropic etching process and then an anisotropic etching process is carried out to thereby form contact holes having wider upper edges. And the polycrystalline silicon film 16 heavily doped with phosphorus is embedded in the first contacts 14 and 15, the surface of the inter-layer insulating film 13 is etched with use of an ammonium fluoride (NH4F) aqueous solution to expose the expanded part of the polycrystalline silicon film 16, subjected to a thermal oxidation to form silicon oxide film 17 even on the side wall of the expanded part of the polycrystalline silicon film 16, and then a silicon oxide film 18 of 500 Å thickness is deposited thereon (refer to FIGS. 45(a) to 45(c)).

The subsequent steps are exactly the same as in the embodiment 1. According to the present fabricating method, the damaged surface of the inter-layer insulating film 13 is once removed and then the film 13 is covered with the new silicon oxide film 18, and the silicon oxide film 17 is formed even on the side wall of the expanded part of the polycrystalline silicon film 16. As a result, the voltage withstand ability of the memory cell can be further enhanced.

Embodiment 14

The inter-layer insulating film has been flattened and the bit line contact holes at the same time and then subjected to the photolithographic process and reactive ion etching process to make the storage node and bit line contact holes in the foregoing embodiments, but such a fabricating method as shown in FIGS. 46 to 53 may be carried out as a fourteenth embodiment to realize a smaller memory cell.

Figure 46C:
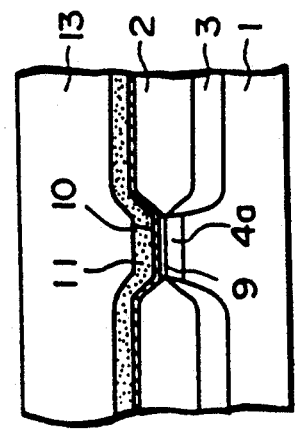
Figure 46A:
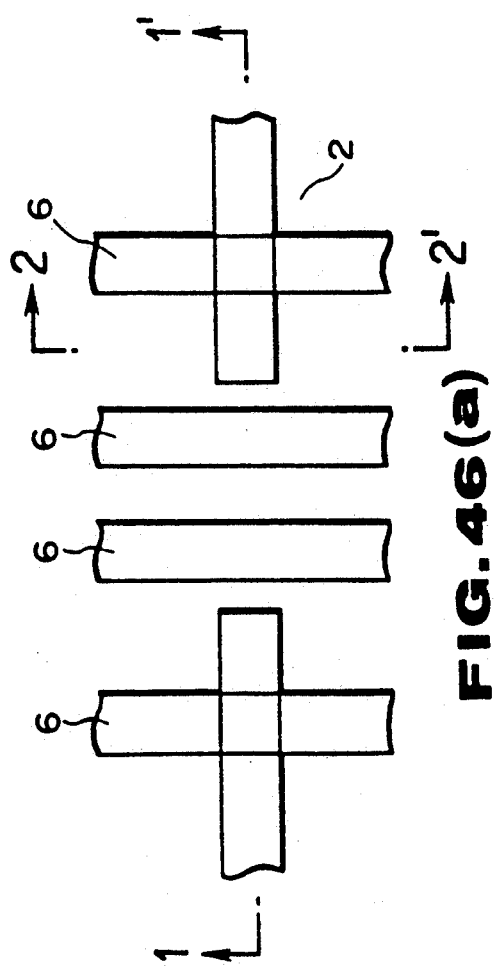
Figure 46B:
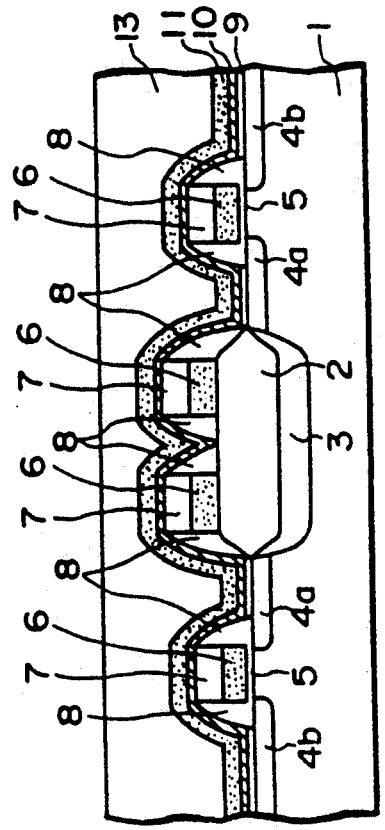

First, steps up to steps of forming the gate electrode 6 and leaving the side wall insulating film 8 on the side of the gate electrode 6 in a self alignment manner are carried out in the same manner as in the foregoing first embodiment. Thereafter, a silicon nitride film 9 of 200 Å thickness, a silicon nitride film 10 of 20 nm thickness and a polycrystalline silicon film 11 of 50 nm thickness are sequentially deposited by a thermal oxidation method. Further an inter-layer insulating film 13 made of phosphorus glass or the like is formed thereon. In this case, the inter-layer insulating film 13 may be flattened by a thermal treatment or be as it is without any treatment as shown in FIGS. 46(a) to 46(c).

Figure 47A:
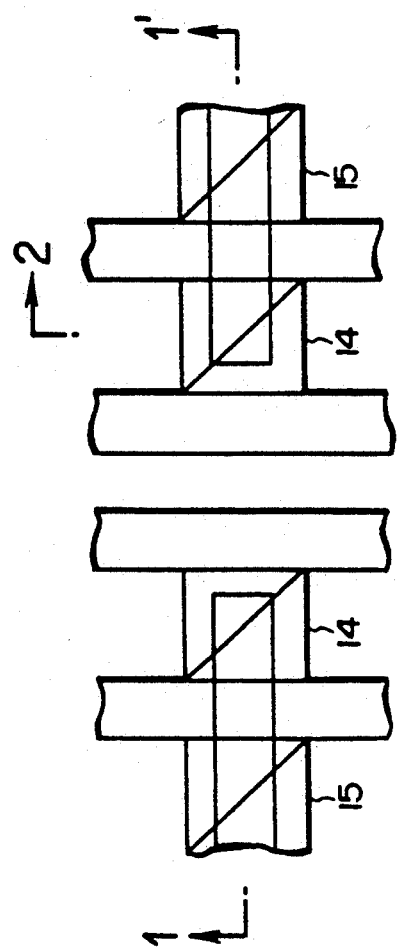
Figure 47C:
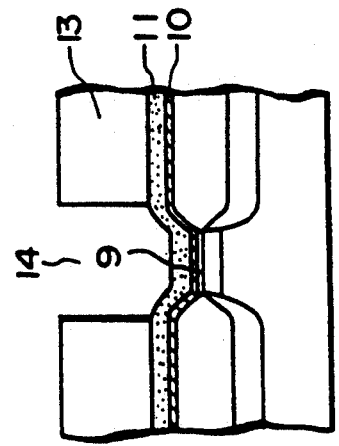
Figure 47B:
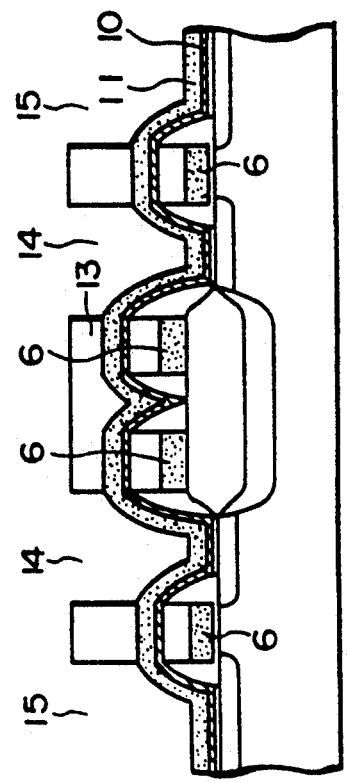

Next, as shown in FIGS. 47(a) to 47(c), the inter-layer insulating film 13 is subjected to a photolithographic process and a reactive ion etching process to form a pattern of the film 13 and also to form first storage node contact holes 14 and first bit line contact holes 15 at the same time. In this case, when the etching conditions are selected so that the etching rate of the polycrystalline silicon film 11 is much smaller than that of the inter-layer insulating film 13, the polycrystalline silicon film 11 can act as an etching stopper. Therefore, even when a distance between the storage node contact hole 14 and gate electrode 6 or between the bit line contact hole 15 and gate electrode 6 is very small, there is no possibility that short-circuiting occurs between the storage node electrode and gate electrode 6 or between the bit line and gate electrode 6.

Figure 48A:
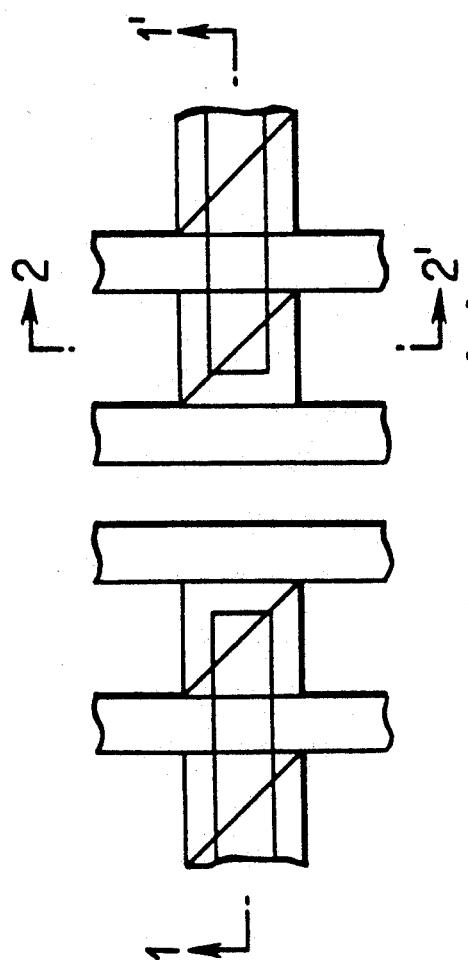
Figure 48C:
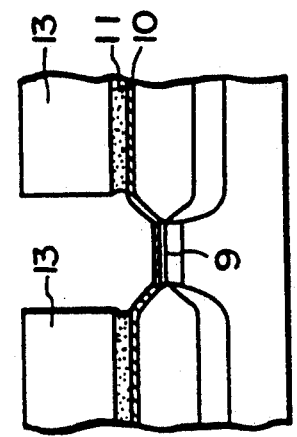
Figure 48B:
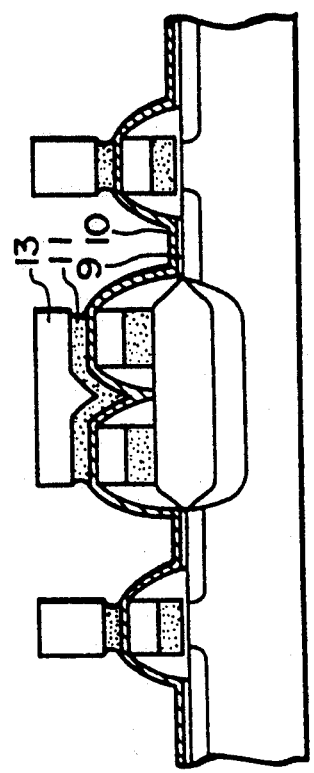

Thereafter, as shown in FIGS. 48(a) to 48(c), that areas of the polycrystalline silicon film 11 corresponding to the first storage node contact holes 14 and first bit line contact holes 15 are removed by means of an isotropic dry etching process or chemical dry etching (CDE) process to expose the underlying silicon nitride film 10.

Figure 49A:
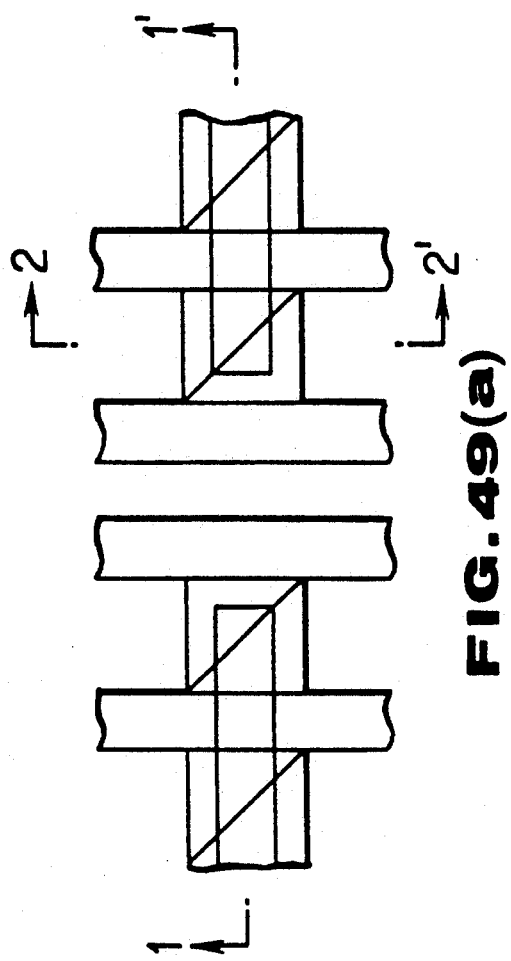
Figure 49C:
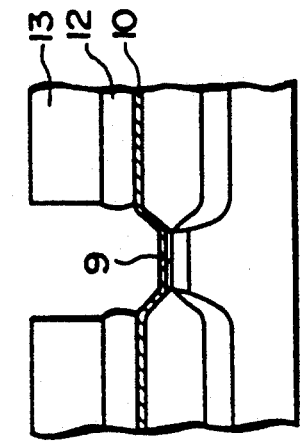
Figure 49B:
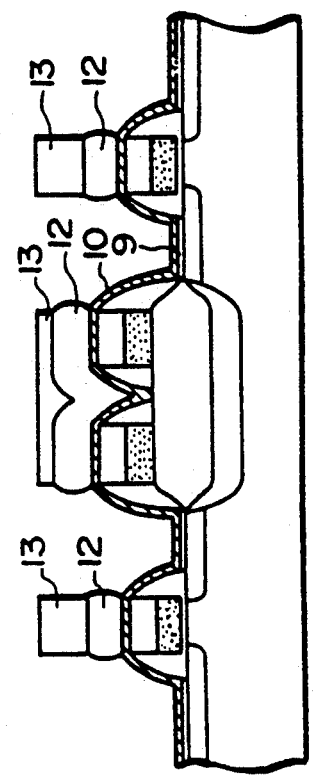

Then, as shown in FIGS. 49(a) to 49(c), that areas of the polycrystalline silicon film 11 exposed at least to the side walls of the storage node and bit line contact holes are oxidized to form a silicon oxide film 12. In this case, the entire polycrystalline silicon film 11 may be formed as the silicon oxide film 12. In this way, since that areas of the remaining polycrystalline silicon film exposed at least to the side walls of the contact holes are oxidized, such a problem as a short-circuiting between the storage node electrodes or between the storage node electrode and bit line through the polycrystalline silicon film 11 can be avoided.

Figure 50A:
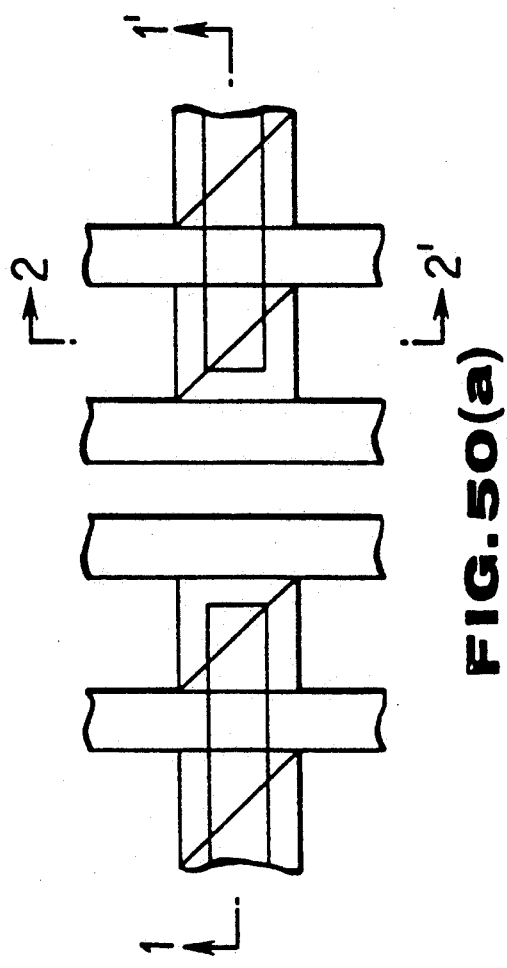
Figure 50B:
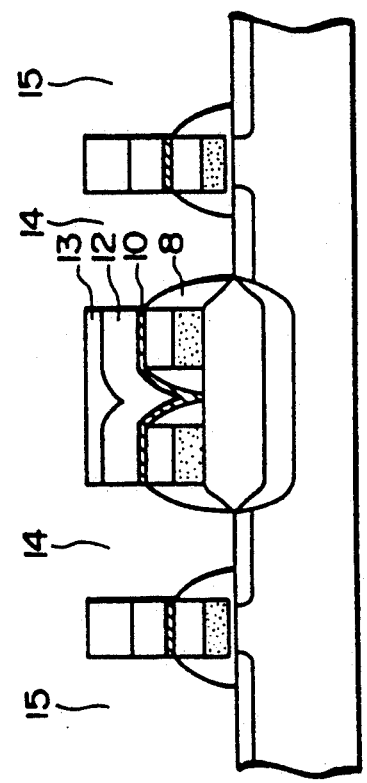
Figure 50C:
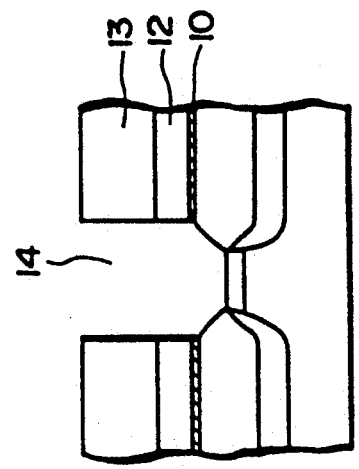

After this, as shown in FIGS. 50(a) to 50(c), that areas of the silicon nitride film 10 and the thin silicon oxide film 9 thereunder corresponding to the storage node and bit line contact hole parts 14 and 15 are removed through an anisotropic etching process to expose the surface of the silicon substrate. At this time, since the upper and side walls of the gate electrode are covered with the thick insulating film, the etching will not reach the gate electrode.

Figure 51A:
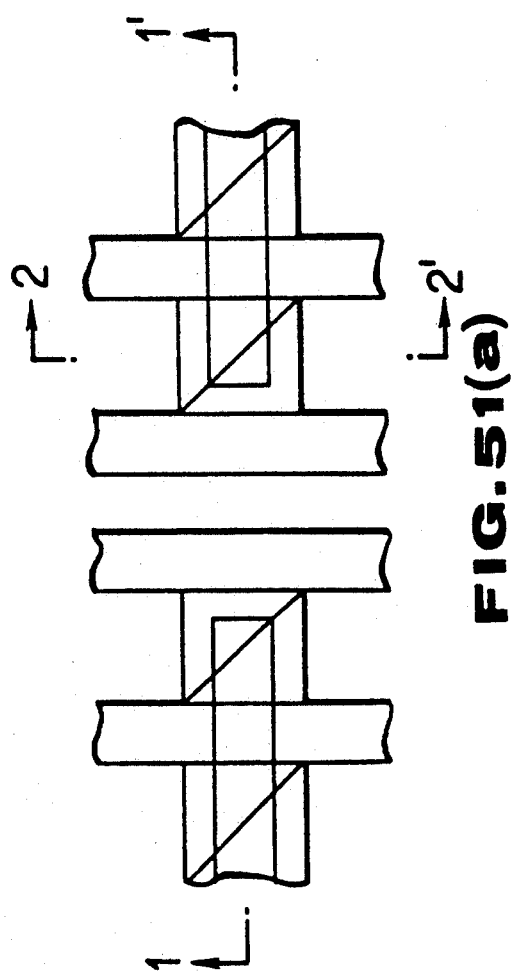
Figure 51C:
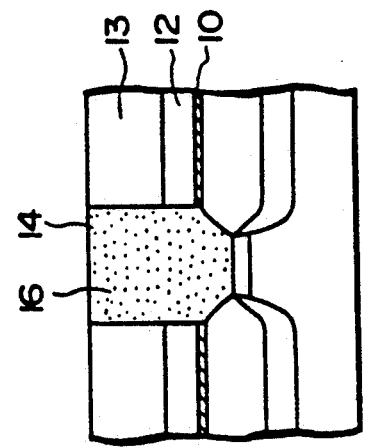
Figure 51B:
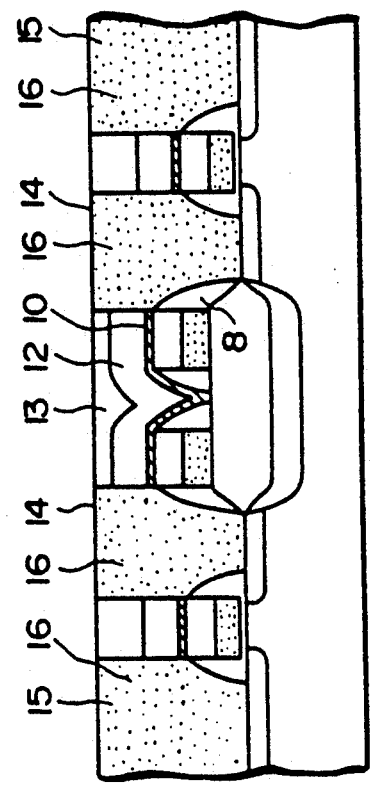

After the thus formation of the storage node contact holes 14 and bit line contact holes 15, as shown in FIGS. 51(a) to 51(c), a polycrystalline silicon film is deposited and the embedded in the contact hole parts by the etching-back or a monocrystalline or polycrystalline silicon film is selectively grown, in the same manner as already mentioned above.

Then, as shown in FIGS. 52(a) to 52(c), the inter-layer insulating film 13 and silicon oxide film 12 are etched and removed with use of the ammonium fluoride (NH4F) aqueous solution. At this time, since the silicon nitride film 10 acts as an etching stopper, the etching time can be set to be rather long. Alternatively, the etching time may be set to be rather short in such an extent that can remove only a part of the silicon oxide film. Because the silicon oxide film 12 is in particular a thermally oxidized film, the film is good in quality and thus may be made to remain.

Figure 53A:
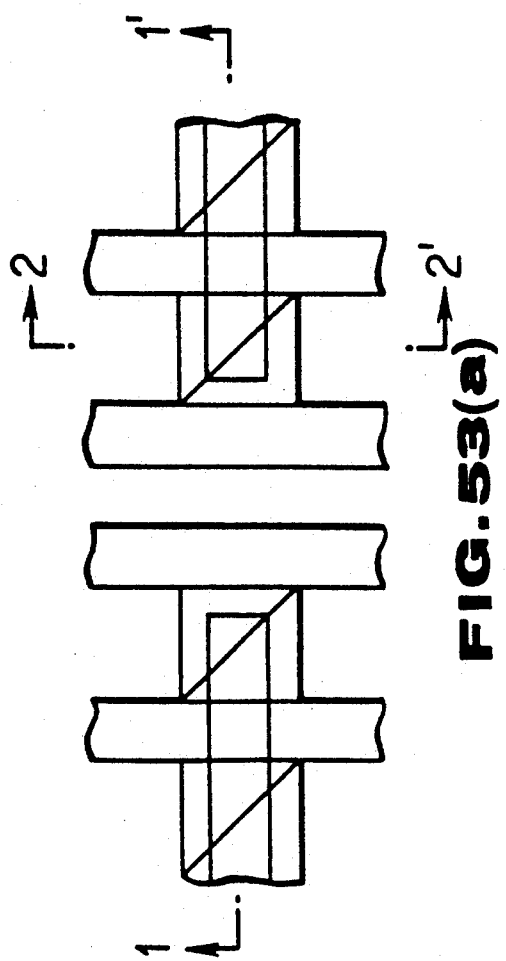
Figure 53C:
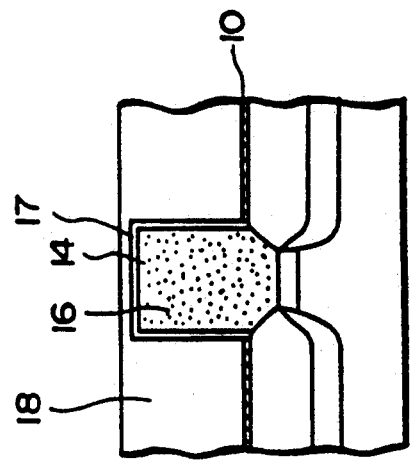
Figure 53B:
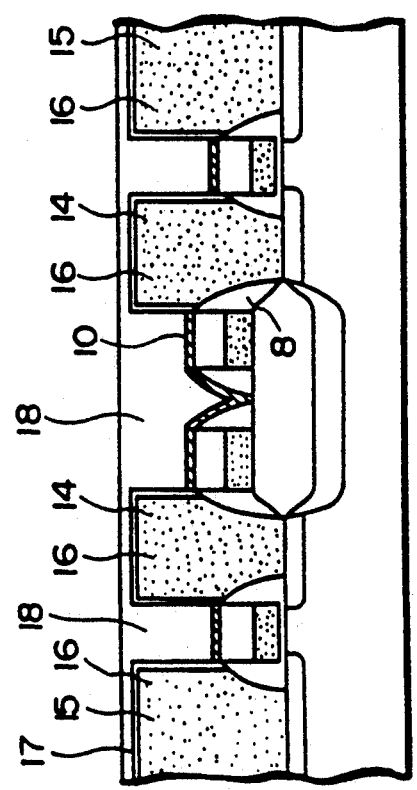

Further, as shown in FIGS. 53(a) to 53(c), a thermal oxidation process is applied if necessary to form a silicon oxide film 17 even on the upper and side walls of the polycrystalline silicon film 16, and then a silicon oxide film 18 of 500 Å thickness is deposited thereon by the CVD method.

Figure 54A:
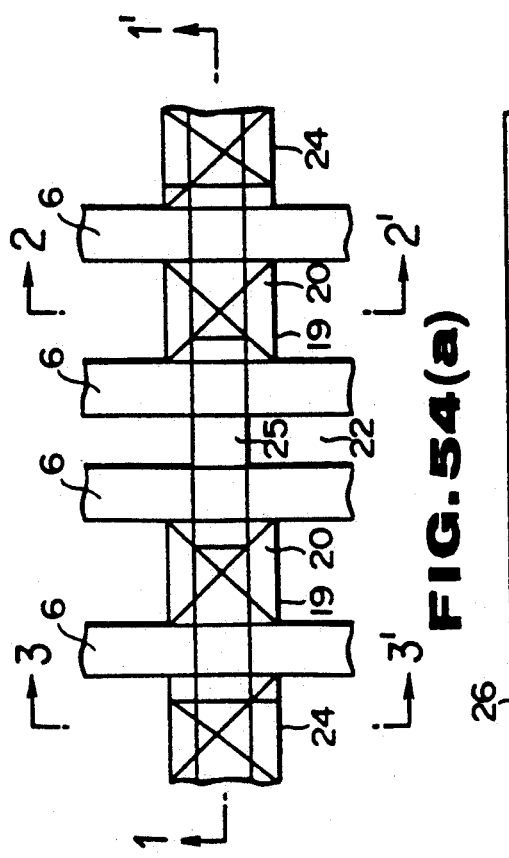
Figure 54B:
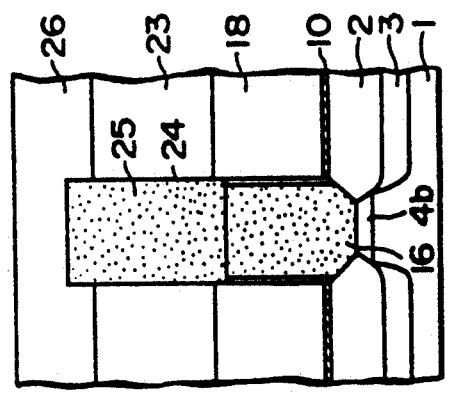
Figure 54C:
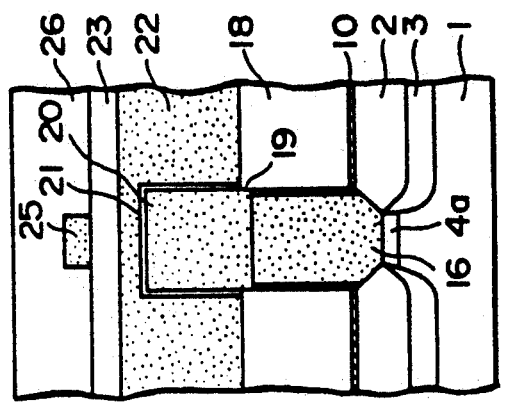
Figure 54D:
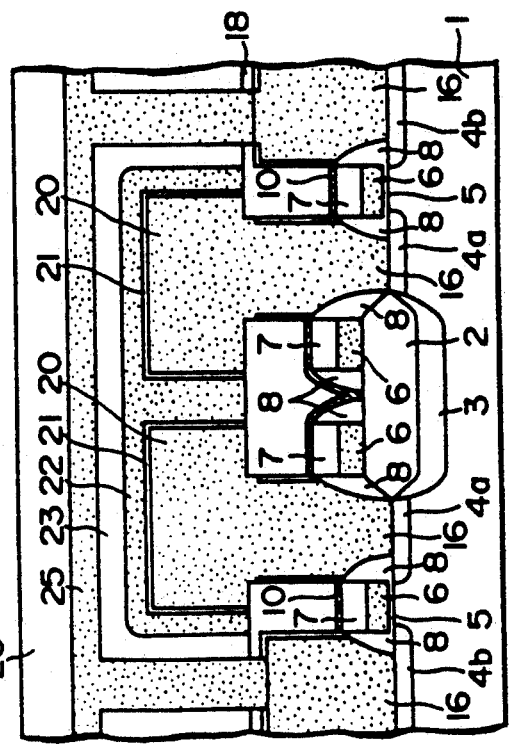

Thereafter, processing is carried out in exactly the same manner as in the embodiment 1 to complete such a memory cell as shown in FIGS. 54(a) to 54(c).

According to the present fabricating method, the polycrystalline silicon acting as the etching stopper is already formed at the time of making the first storage node and bit line contact holes, which results in that it is unnecessary to provide an allowance taking a misalignment with the gate electrode into consideration and thus the memory cell can be made small in size and improved in reliability.

According to the present method, further, the damaged surface of the inter-layer insulating film 13 is once removed and then covered with the new silicon oxide film 18, and the silicon oxide film 17 is formed even on the side wall of the expanded part of the polycrystalline silicon film 16. As a result, even when a distance between the embedded layers is further decreased, the suitable voltage withstand ability can be maintained.

In addition, though explanation has been made in connection with the DRAM having the laminated memory cell structure in the foregoing embodiments, the present fabricating method is not limited to the particular DRAM but may be effectively employed even in fabricating another device including a step of forming contact holes having a high aspect ratio.

What is claimed is:

1. A method of fabricating a semiconductor memory device comprising the steps of:
    forming a MOSFET having a gate electrode, source and drain regions of a second electrical conductivity type impurity material formed in a surface of a semiconductor substrate of a first electrical conductivity type material;
    forming a first inter-layer insulating film over said gate electrode;
    forming a first contact hole such as to expose a surface of said substrate and to be contacted with at least one of the source and drain regions of said MOSFET;
    forming a second contact hole such as to expose a surface of said substrate and to be contacted with another of the source and drain regions of said MOSFET;
    embedding a first electrically conductive layer in said first contact hole up to a position higher than the gate electrode;
    embedding a second electrically conductive layer in said second contact hole up to a position higher than the gate electrode;
    forming a second inter-layer insulating film over said first and second electrically conductive layers;
    forming a third contact hole as a storage node contact hole by selectively removing part of said second inter-layer insulating film to expose the first electrically conductive layer;
    forming a storage node electrode connected to one of the source and drain regions of the MOSFET through said storage node contact hole;
    forming a capacitor insulating film over said storage node electrode;
    forming a plate electrode over said capacitor insulating film;
    forming a third inter-layer insulating film over said plate electrode;
    forming a fourth contact hole as a bit line contact hole by selectively removing part of said second and third inter-layer insulating films to expose the second electrically conductive layer; and
    forming a bit line connected to another of the source and drain regions of said MOSFET through said bit line contact hole.

2. A method of fabricating a semiconductor memory device as set forth in claim 1, wherein said first contact forming step includes a step of etching said first inter-layer insulating film so that a sectional area of said first contact hole is larger at portions higher than said gate electrode.

3. A method of fabricating a semiconductor memory device as set forth in claim 1 or 2, further comprising a step of etching said first inter-layer insulating film down to a level lower than a top surface of the first embedded electrically conductive layer after the second electrically conductive layer embedding step and prior to the formation of said second inter-layer insulating film.

4. A method of fabricating a semiconductor memory device comprising the steps of:
    forming a MOSFET having a gate electrode, source and drain regions of a second electrical conductivity type impurity material formed on a surface of a semiconductor substrate of a first electrical conductivity type material;
    forming a first inter-layer insulating film over said gate electrode;
    forming a first contact hole such as to expose a surface of said substrate and to be contacted with at least one of the source and drain regions of said MOSFET;
    forming a second contact hole such as to expose a surface of said substrate and to be contacted with another of the source and drain regions of said MOSFET;
    embedding a first electrically conductive layer in said first contact hole up to a position higher than the gate electrode;
    embedding a second electrically conductive layer in said first contact hole up to a position higher than the gate electrode;
    forming a second inter-layer insulating film over said first and second electrically conductive layers;
    forming a third contact hole as a bit line contact hole by selectively removing part of said second inter-layer insulating film to expose the first electrically conductive layer;
    forming a bit line connected to one of the source and drain regions of the MOSFET through said bit line contact hole;
    forming a third inter-layer insulating film over said bit line;
    forming a fourth contact hole as a storage node contact hole by selectively removing part of said second and third inter-layer insulating films to expose the second electrically conductive layer;
    forming a storage node electrode connected to another of the source and drain regions of said MOSFET through said storage node contact hole;
    forming a capacitor insulating film over said storage node electrode; and
    forming a plate electrode over said capacitor insulating film.

5. A method of fabricating a semiconductor memory device as set forth in claim 4, wherein said first contact forming step includes a step of etching said first inter-layer insulating film so that a sectional area of said first contact hole is larger at portions higher than said gate electrode.

6. A method of fabricating a semiconductor memory device as set forth in claim 4 or 5, further comprising a step of etching said first inter-layer insulating film down to a level lower than a top surface of the first embedded electrically conductive layer after the second electrically conductive layer embedding step and prior to the formation of said second inter-layer insulating film.

7. A method of fabricating a semiconductor memory device as set forth in claim 6, further comprising a thermal oxidization step of oxidizing a surface of the first embedded electrically conductive layer after said first inter-layer insulating film etching step and prior to the formation of said second inter-layer insulating film.

8. A method of fabricating a semiconductor memory device as set forth in claim 4, wherein said first electrically conductive layer embedding step includes a step of forming said first electrically conductive layer thicker than a depth of said first contact hole.

9. A method of fabricating a semiconductor memory device as set forth in claim 1 or 2, further comprising a step of etching said first inter-layer insulating film down to a level lower than a top surface of the second embedded electrically conductive layer after the second electrically conductive layer embedding step and prior to the formation of said second inter-layer insulating film.

10. A method of fabricating a semiconductor memory device as set forth in claim 4 or 5, further comprising a step of etching said first inter-layer insulating film down to a level lower than a top surface of the second embedded electrically conductive layer after the second electrically conductive layer embedding step and prior to the formation of said second inter-layer insulating film.

11. A method of fabricating a semiconductor memory device as set forth in claim 4, further comprising a thermal oxidization step of oxidizing a surface of the first embedded electrically conductive layer after said first inter-layer insulating film etching step and prior to the formation of said second inter-layer insulating film.

12. A method of fabricating a semiconductor memory device as set forth in claim 4, wherein said second electrically conductive layer embedding step includes a step of forming said second electrically conductive layer thicker than a depth of said second contact hole.

* * * * *

UNITED STATES PATENT AND TRADEMARK OFFICE
CERTIFICATE OF CORRECTION

PATENT NO.   : 5,248,628
DATED        : September 28, 1993
INVENTOR(S)  : Okabe et al.

It is certified that error appears in the above-identified patent and that said Letters Patent is hereby corrected as shown below:

Column 22,
Line 41, change "first" to -- second --.

Signed and Sealed this

Twenty-second Day of June, 2004

JON W. DUDAS
*Acting Director of the United States Patent and Trademark Office*